United States Patent [19]
Ranson et al.

[11] Patent Number: 5,887,003
[45] Date of Patent: Mar. 23, 1999

[54] APPARATUS AND METHOD FOR COMPARING A GROUP OF BINARY FIELDS WITH AN EXPECTED PATTERN TO GENERATE MATCH RESULTS

[75] Inventors: Gregory L. Ranson; Russell C. Brockmann; Douglas B. Hunt, all of Fort Collins, Colo.

[73] Assignee: Hewlett-Packard Company, Palo Alto, Calif.

[21] Appl. No.: 709,798

[22] Filed: Sep. 10, 1996

[51] Int. Cl.[6] .................................................. G06F 11/00
[52] U.S. Cl. ......................................... 371/25.1; 364/579
[58] Field of Search ................................. 371/25.1, 22.5, 371/22.6, 22.35, 24, 26, 27.1; 395/183.06, 435, 427; 364/746.2, 769, 728.05, 718, 579, 200.1

[56] References Cited

U.S. PATENT DOCUMENTS

| | | | |
|---|---|---|---|
| 3,947,823 | 3/1976 | Padegs et al. | 340/172.5 |
| 4,303,990 | 12/1981 | Seipp | 364/900 |
| 4,425,643 | 1/1984 | Chapman et al. | 371/20 |
| 4,431,928 | 2/1984 | Skokan | 307/465 |
| 4,433,413 | 2/1984 | Fasang | 371/25 |
| 4,446,514 | 5/1984 | Brown et al. | 364/200 |
| 4,491,907 | 1/1985 | Koeppen et al. | 364/200 |
| 4,500,993 | 2/1985 | Jacobson | 371/16 |
| 4,598,385 | 7/1986 | Kessels et al. | 364/900 |
| 4,622,669 | 11/1986 | Pri-Tal | 371/25 |
| 4,674,089 | 6/1987 | Poret et al. | 371/25 |
| 4,841,232 | 6/1989 | Graham et al. | 324/73 R |
| 4,868,822 | 9/1989 | Scott et al. | 371/16 |
| 4,873,666 | 10/1989 | Lefebvre et al. | 365/189.07 |
| 4,879,646 | 11/1989 | Iwasaki et al. | 364/200 |
| 4,910,417 | 3/1990 | El Gamal et al. | 307/465 |
| 4,912,630 | 3/1990 | Cochcroft | 364/200 |
| 4,924,468 | 5/1990 | Horak et al. | 371/22.1 |
| 4,933,897 | 6/1990 | Shankar et al. | 364/900 |
| 4,935,719 | 6/1990 | McClure | 340/146.2 |
| 4,993,027 | 2/1991 | McGraw et al. | 371/16.2 |
| 5,059,942 | 10/1991 | Burrows | 340/146.2 |
| 5,136,590 | 8/1992 | Polstra et al. | 371/16.2 |
| 5,157,673 | 10/1992 | Feldbrugge | 371/68.1 |
| 5,157,781 | 10/1992 | Hardwod et al. | 395/57.5 |
| 5,173,619 | 12/1992 | Gaudenzi et al. | 307/272.2 |
| 5,202,976 | 4/1993 | Hansen et al. | 395/500 |

(List continued on next page.)

OTHER PUBLICATIONS

Montessoro et al. "General and Efficient Multiple List Traversal for Concurrent Fault Simulation", 1991 IEEE, pp. 43–48.

Marchioro et al. "Simulation of a Macro–pipelined Multi-–CPU Event Processor for Use in Fastbus", 1989 IEEE, pp. 1597–1601.

*Primary Examiner*—Robert W. Beausoliel, Jr.
*Assistant Examiner*—Nadeem Iqbal
*Attorney, Agent, or Firm*—Jeffery B. Fromm; Guy J. Kelley; Augustus W. Winfield

[57] ABSTRACT

Method for efficiently and flexibly comparing a group of multi-bit binary fields with a multi-bit expected pattern to generate a set of final match results, one final match result for each binary field in the group. Sets of of bit-wise comparator results are generated, one set for each binary field, by comparing each binary field with the expected pattern. Then, sets of bit-wise mask results are generated for each binary field by bit-wise masking each set of bit-wise comparator results with a mask pattern. Then, a set of preliminary match results is generated. Each preliminary match result is equal to the logical AND of all bits making up the bit-wise mask result set for the corresponding binary field. Then, a set of secondary match results is generated by negating all of the preliminary match results if a negate indicator is asserted. Finally, a set of final match results is generated, one final match result for each binary field, by individually gating all of the secondary match results with a separate enable indicator for each binary field. The invention includes an M×N comparator matrix for accomplishing the just-described method. The invention also includes circuitry for comparing N binary fields with an expected pattern to generate N comparison results.

8 Claims, 35 Drawing Sheets

U.S. PATENT DOCUMENTS

| | | | |
|---|---|---|---|
| 5,206,948 | 4/1993 | DeAngelis et al. | 395/575 |
| 5,210,862 | 5/1993 | DeAngelis et al. | 395/575 |
| 5,226,149 | 7/1993 | Yoshida et al. | 395/575 |
| 5,226,153 | 7/1993 | DeAngelis et al. | 395/575 |
| 5,317,711 | 5/1994 | Bourekas et al. | 395/425 |
| 5,327,435 | 7/1994 | Warchol | 371/15.1 |
| 5,345,580 | 9/1994 | Tamaru et al. | 395/500 |
| 5,375,228 | 12/1994 | Leary et al. | 395/575 |
| 5,400,345 | 3/1995 | Ryan, Jr. | 371/22.3 |
| 5,418,452 | 5/1995 | Pyle | 324/158.1 |
| 5,425,036 | 6/1995 | Liu et al. | 371/23 |
| 5,442,641 | 8/1995 | Beranger et al. | 371/21.2 |
| 5,450,349 | 9/1995 | Brown, III et al. | 395/183 |
| 5,452,437 | 9/1995 | Richey et al. | 395/182 |
| 5,473,754 | 12/1995 | Folwell et al. | 395/183.2 |
| 5,475,815 | 12/1995 | Byers et al. | 395/183.08 |
| 5,479,652 | 12/1995 | Drever et al. | 395/183 |
| 5,488,688 | 1/1996 | Gonzales et al. | 395/183.1 |
| 5,504,755 | 4/1996 | Nozuyama | 371/22.2 |
| 5,519,715 | 5/1996 | Hao et al. | 371/22.3 |
| 5,526,365 | 6/1996 | Whetsel | 371/22.3 |
| 5,528,526 | 6/1996 | Klug et al. | 364/715.11 |
| 5,530,804 | 6/1996 | Edgington et al. | 395/183 |
| 5,535,331 | 7/1996 | Swoboda et al. | 395/183.2 |
| 5,541,935 | 7/1996 | Waterson | 371/22.5 |
| 5,548,775 | 8/1996 | Herhsey | 395/800 |
| 5,550,528 | 8/1996 | Offord et al. | 340/146.2 |
| 5,555,428 | 9/1996 | Radigan et al. | 395/800 |
| 5,557,619 | 9/1996 | Rapoport | 371/22.5 |
| 5,561,761 | 10/1996 | Hicok et al. | 395/183 |
| 5,564,041 | 10/1996 | Matsui et al. | 395/500 |
| 5,566,300 | 10/1996 | Naoe | 395/183 |
| 5,579,251 | 11/1996 | Sato | 364/579 |
| 5,579,492 | 11/1996 | Gay | 395/290 |
| 5,586,288 | 12/1996 | Dahlberg | 395/435 |
| 5,590,354 | 12/1996 | Klapproth et al. | 395/800 |
| 5,598,421 | 1/1997 | Tran et al. | 371/22.3 |
| 5,606,710 | 2/1997 | Hall et al. | 395/800 |
| 5,623,500 | 4/1997 | Whetsel, Jr. | 371/22.1 |
| 5,630,048 | 5/1997 | La Joie et al. | 395/183 |
| 5,640,508 | 6/1997 | Fujiwara et al. | 395/183 |
| 5,640,542 | 6/1997 | Whitsel et al. | 395/500 |
| 5,644,609 | 7/1997 | Bockhaus et al. | 377/64 |
| 5,699,516 | 12/1997 | Sapir et al. | 395/200.01 |

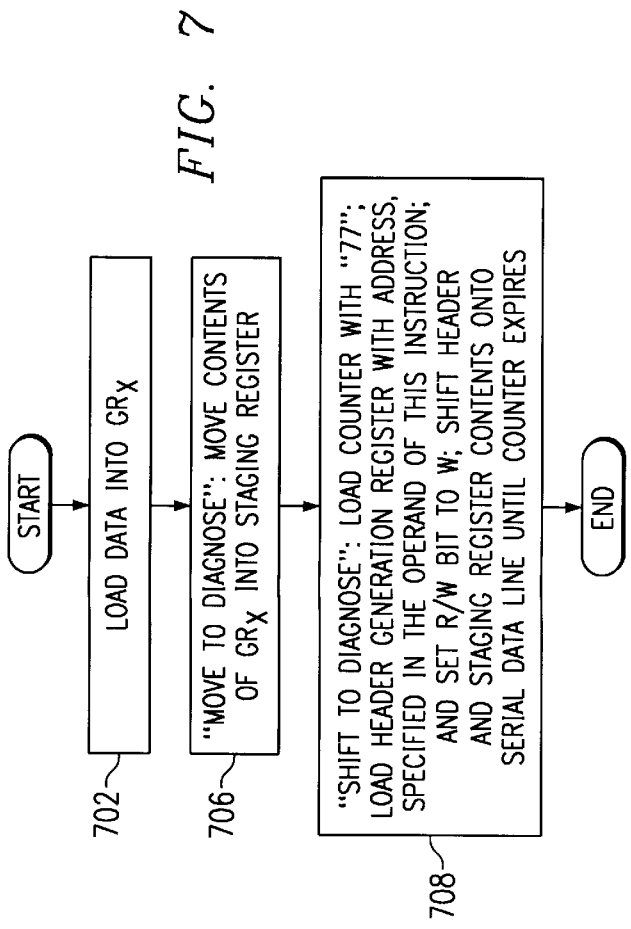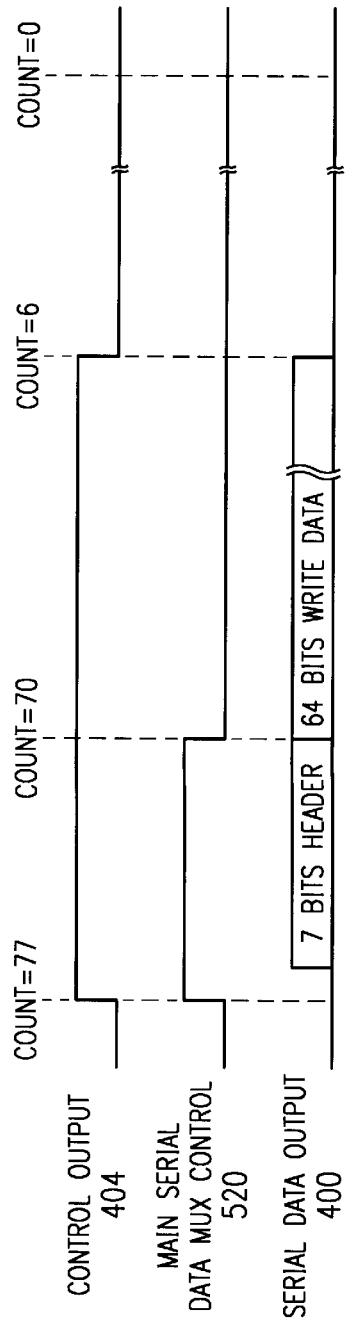

APPARATUS AND METHOD FOR COMPARING A GROUP OF BINARY FIELDS WITH AN EXPECTED PATTERN TO GENERATE MATCH RESULTS

FIELD OF THE INVENTION

This invention relates generally to microprocessor testing, and more particularly to apparatus and methods for comparing groups of binary fields with expected patterns to generate match results for use in debugging and performance monitoring in microprocessors and microprocessor systems.

BACKGROUND

It has become very difficult to diagnose failures in and to measure the performance of state-of-the-art microprocessors. This is because modern microprocessors not only run at very high clock speeds, but many of them also execute instructions in parallel, out of program order and speculatively. Moreover, visibility of the microprocessor's inner state has become increasingly limited due to the complexity of the microprocessors and to practical constraints on the number of external pads that can be provided on the chip package.

In the past, the traditional failure diagnosis and performance measurement tools have been external logic analyzers and in-circuit emulators. Logic analyzers are capable of monitoring signals on the chip pads and other externally-accessible system signals, capturing the state of these signals and generating triggers based on their states. Unfortunately, logic analyzers must rely solely on externally-accessible signals to accomplish this, not on signals that are internal to the chip itself. In-circuit emulators, on the other hand, are used to mimic the functional characteristics of a new microprocessor in a system environment and to add visibility to certain data values within the microprocessor. But such devices only emulate the functionality of the microprocessor. By their very nature, they cannot give an accurate representation of the performance characteristics of an actual silicon device. Therefore, they are primarily useful only for developing and debugging system software.

By way of background, U.S. Pat. No. 5,488,688, issued Jan. 30, 1996, to David R. Gonzales, et al., discloses a digital signal processor with a FIFO buffer configured on-chip to monitor a fixed set of internal bus signals. The FIFO buffer is coupled to a debug controller that is capable of operating in first and second modes. In the first mode, the CPU may be halted on the occurrence of one of four specifically-enumerated event conditions: after an external request; after a hardware breakpoint (occurrence of specific data or address values); after a software breakpoint (execution of a specific CPU instruction); or after a specified number of instructions have been executed. In the second mode, only the FIFO buffer is halted on the occurrence of an event condition. In either mode, the user may examine the contents of the FIFO buffer after a halt to determine what flow of software instructions were executed just prior to the event occurrence. An off-chip serial interface is used to communicate with the debug controller and to examine the contents of the FIFO buffer. The serial interface complies with the well-known Institute of Electrical and Electronics Engineers (IEEE) Standard 1149.1, "Test Access Port and Boundary Scan Architecture," also known as the Joint Test Action Group (JTAG) standard. A serial port conforming to this standard will hereinafter be referred to as a test access port or "TAP."

By way of further background, U.S. Pat. No. 5,418,452, issued May 23, 1995, to Norman C. Pyle, discloses an apparatus for testing integrated circuits using time division multiplexing. In order to reduce the number of pins necessary to communicate the signals from on-chip test nodes to an off-chip logic analyzer, Pyle employs a multiplexer on the chip under test and a demultiplexer in the logic analyzer. Each input of the multiplexer is coupled to an on-chip test node, and the multiplexer select lines are driven by counter outputs. By applying an identical set of counter outputs to the select lines of the demultiplexer, Pyle implements a time-division-multiplexed serial communication line between the chip under test and the logic analyzer. Signals from the numerous test nodes in the chip under test are coupled to the communication line in different time slices. The signals are then reconstructed by the demultiplexer in the logic analyzer.

By way of still further background, U.S. Pat. No. 5,473,754, issued Dec. 5, 1995 to Dale E. Folwell, et al., discloses a scheme for enabling an off-chip device to monitor the state of an on-chip 24-bit program counter in real time using an 8-bit port on the chip under test. Folwell assumes that discontinuities in the program counter will occur only in a limited number of situations. He then captures the contents of the program address bus only when one of these conditions occurs, and then sends those contents off chip via the 8-bit port. Because the contents of the program address bus are not captured with every increment of the counter, the volume of data that must be output via the 8-bit port is reduced.

By way of still further background, U.S. Pat. No. 5,317,711, issued May 31, 1994 to Philip A. Bourekas, et al., discloses a scheme for providing off-chip test access to the signals of an on-chip bus that connects an on-chip cache to an on-chip CPU. The signals of the bus are brought out to the chip's external address/data bus when the external address/data bus is not being used for transactions with main memory or peripherals. To accomplish this, reserved pins on the microprocessor are used to control a multiplexer. Depending on the state of the multiplexer's select lines, either the microprocessor's main memory read/write and data lines, or the address that is being provided to the internal cache memory, is coupled to the chip's external address/data bus.

By way of still further background, U.S. Pat. No. 4,910,417, issued Mar. 20, 1990 to Abbas El Gamal, et al., discloses an improved user-programmable interconnect architecture for logic arrays. Specifically, Gamal uses existing row-column selecting logic in combination with an output multiplexer for coupling user-selectable internal circuit nodes to a particular external chip pad for testing. Additionally, latches are provided for each chip input pin so that, with the assertion of an external signal, all chip inputs may be frozen. Then, the row-column select circuitry and output multiplexer may be used to probe nodes within the chip using the latched inputs as stimulus.

While the above structures are useful for the particular purposes for which they are proposed, they fall far short of teaching or suggesting a comprehensive structure for debugging and monitoring the performance of a state-of-the-art microprocessor or microprocessor system.

What is needed is a comprehensive system and method for enabling microprocessor and system designers to debug state-of-the-art microprocessors and systems more easily, and to do so in a highly flexible and sophisticated manner. Such a system and method should enable tests to be performed using the actual hardware of the device being evaluated, under actual system environment conditions, and while running the device at full speed. Such a system and method should enable programmers to defme a wide variety of possible kinds of events that may occur within the microprocessor or system, and to generate a variety of triggers based on those user-definable events.

One particularly troublesome problem that has stood in the way of developing such a system has been the problem of efficiently and flexibly comparing a group of binary fields, such as instructions, data, addresses, control information, status information and the like, with expected patterns in order to generate match results. The present invention provides a novel solution to this particular problem.

SUMMARY OF THE INVENTION

The invention will be best understood with reference to FIGS. 26–30 herein.

In one embodiment, the invention includes a method for efficiently and flexibly comparing a group of multi-bit binary fields with a multi-bit expected pattern to generate a set of final match results, one final match result for each binary field in the group. Sets of of bit-wise comparator results are generated, one set for each binary field, by bit-wise comparing each binary field with the expected pattern. Then, sets of bit-wise mask results are generated, one set for each binary field, by bit-wise masking each set of bit-wise comparator results with a mask pattern. Then, a set of preliminary match results is generated, one preliminary match result for each binary field. Each of the preliminary match results is equal to the logical AND of all bits making up the bit-wise mask result set for the corresponding binary field. Then, a set of secondary match results is generated, one secondary match result for each binary field, by negating all of the preliminary match results if a negate indicator is asserted. Finally, a set of final match results is generated, one final match result for each binary field, by individually gating all of the secondary match results with a separate enable indicator for each binary field.

In another embodiment, the invention includes an M×N comparator matrix, for accomplishing the just-described method. A set of N comparators is provided, each having M data inputs, one expected pattern input and M comparison outputs. Each of the M comparison outputs indicates the result of comparing information applied to the expected pattern input with information applied to one of the M data inputs. (Information applied to the M "data" inputs may be any kind of information, such as instructions, data, addresses, control information, status information or the like.) A set of N storage elements is also provided. Each of the storage elements is operable to store an expected pattern, and each is coupled to the expected patter input of a different one of the N comparators. A data bus is coupled to the data inputs on each of the N comparators in a manner allowing M sets of data to be applied to each of the N comparators simultaneously. In further embodiments, mask patterns, negate and enable bits are also provided to each of the N comparators, providing the programmer with additional flexibility.

In yet a further embodiment, the invention includes circuitry for comparing N binary fields with an expected pattern to generate N comparison results. N bit-wise comparators are provided. Each of the bit-wise comparators has a comparison data input, an expected pattern input and a bit-wise comparison result output. Each of the bit-wise comparators has its expected pattern input coupled to a source of the expected pattern, and has its comparison data input coupled to a source of a different one of the N binary fields. N bit-wise mask units are also provided. Each has a bit-wise comparison result input, a mask pattern input and a bit-wise mask result output. Each of the bit-wise mask units has its mask pattern input coupled to a source of a mask pattern, and has its bit-wise comparison result input coupled to a different one of the bit-wise comparison result outputs. Multi-input AND gates are used at the output of each bit-wise mask unit to determine whether all of the bits comprising the output of the corresponding bit-wise mask unit were asserted. The outputs of each of these multi-input AND gates are coupled to one input of a different exclusive OR gates. The other input of each exclusive OR gate is coupled to a negate indicator. Finally the outputs of each of these exclusive OR gates are coupled to one input of a different two-input AND gate. The other input of each of these latter AND gates is coupled to a different enable indicator. The outputs of these latter AND gates correspond to the N comparison results.

BRIEF DESCRIPTION OF THE DRAWINGS

The present invention is described herein with reference to the accompanying drawings, like reference numbers being used therein to indicate identical or functionally similar elements.

FIG. 7 is a flow diagram illustrating a preferred method for writing data to one of the control registers of FIG. 4.

FIG. 8 is a timing diagram illustrating the states of various signals during the write operation of FIG. 7.

DETAILED DESCRIPTION OF THE PREFERRED EMBODIMENTS

Table of Contents

1. Host systems . . .
    1.1 An exemplary host microprocessor . . .
    1.2 An exemplary multi-processor host computer system . . .
2. Preferred embodiment of the invention . . .
    2.1 Overview . . .
    2.2 Staging register and control registers . . .
        2.2.1 Writing to a remote register . . .
        2.2.2 Readingfrom a remote register . . .
    2.3 Programmable state machine, counters, CPU core and off-chip trigger interfaces . . .
    2.4 System bus interface components . . .
    2.5 Fetch unit components . . .
    2.6 Data cache interface components . . .
    2.7 Sort unit components. . .
    2.8 Retire unit components . . .
    2.9 Off-chip data interface . . .

1. Host systems

The present invention may be applied beneficially in a wide variety of different kinds of microprocessors. For purposes of illustration, the invention will be described herein with reference to a particular kind of microprocessor, namely a four-way superscalar reduced instruction set ("RISC") microprocessor. It is believed that this form of description will enable persons having ordinary skill in the art not only to make and use the invention, but also readily to perceive any modifications or adaptations necessary to apply the invention to microprocessors other than the one specifically described herein. This section one will describe the illustrative host microprocessor first without having any of the components of the invention added to it. The remaining sections will describe a preferred implementation of the invention within the context of the exemplary host microprocessor discussed in this section one.

1.1 An exemplary host microprocessor

Figure 1:
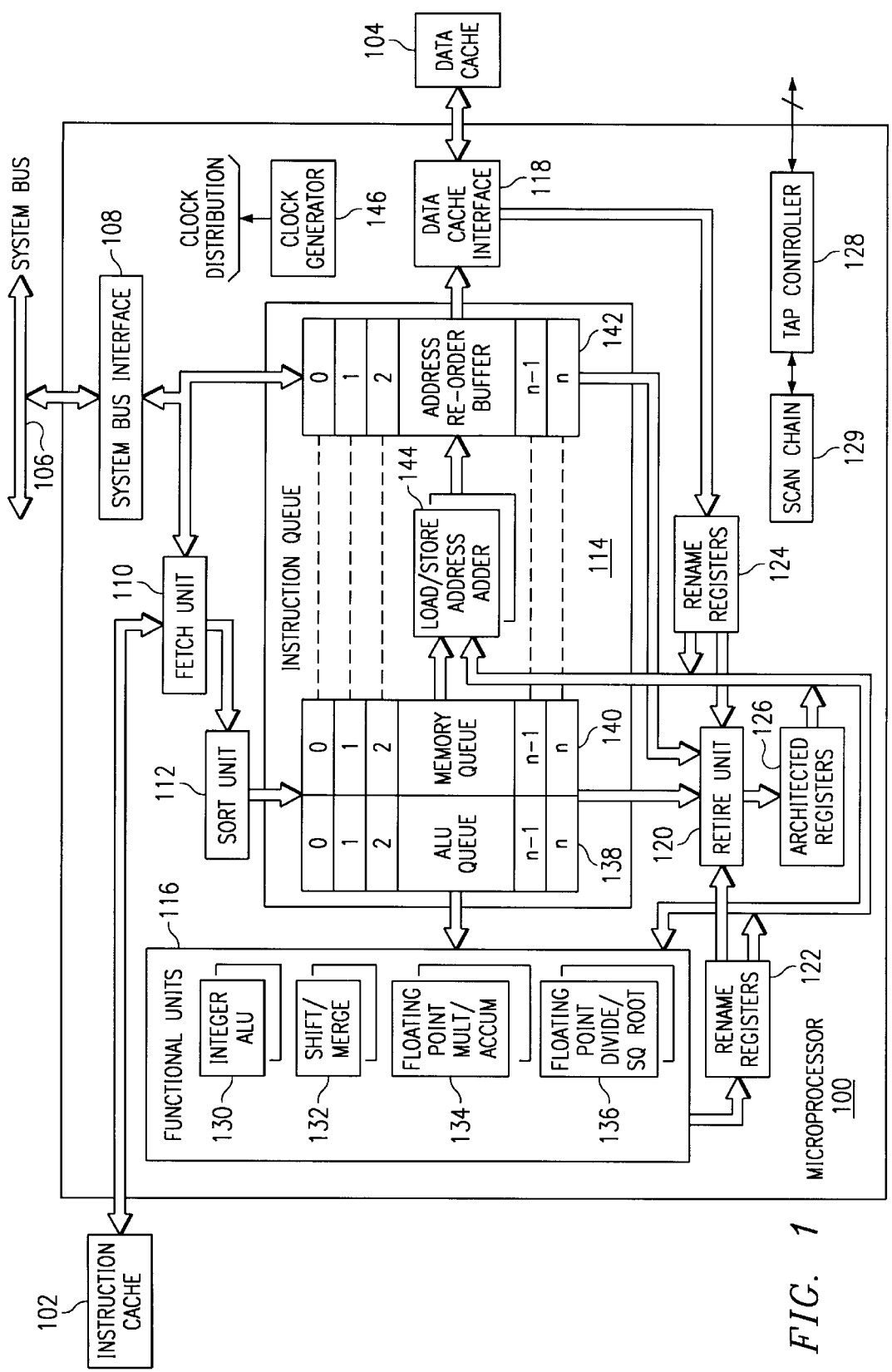
FIG. 1 is a block diagram illustrating a host four-way superscalar RISC microprocessor 100 coupled to an instruction cache, a data cache and a system bus.

FIG. 1 is a block diagram of an exemplary RISC microprocessor 100 before the addition of any of the components of the invention. Microprocessor 100 is coupled to an instruction cache 102, a data cache 104 and a system bus 106. Microprocessor 100 includes system bus interface unit 108, instruction fetch unit 110, sort unit 112, instruction queue unit 114, functional units 116, data cache interface unit 118, retire unit 120, rename register blocks 122, 124, architected register block 126, test access port ("TAP") controller 128, scan chain 129 and clock generator 146. Functional units 116 include dual integer ALUs 130, dual shift/merge units 132, dual floating point multiply/accumulate units 134, and dual floating point divide/square root units 136. Instruction queue unit 114 includes ALU instruction queue 138, memory instruction queue 140, address reorder buffer 142, and dual load/store address adders 144.

System bus 106 is a 64-bit multiplexed address/data split transaction bus that uses the same protocol as the system bus of the well-known PA-7200 microprocessor manufactured and sold by Hewlett Packard Company. System bus interface 108 is provided to implement the protocol necessary for microprocessor 100 to communicate with memory subsystem 208 and input/output subsystem 210 over system bus 106.

Instruction fetch unit 110 is provided to retrieve instructions from instruction cache 102 or, in the case of cache misses, from main memory subsystem 208. During normal operation, instruction fetch unit 10 is capable of retrieving up to four quadword-aligned instructions per cycle from single-level instruction cache 102. Cache lines can also be loaded into instruction queue 114 by sort unit 1 12 at the rate of four instructions per cycle, thus keeping pace with instruction fetch unit 110. When instruction fetch unit 110 indicates a cache miss, system bus interface 108 initiates instruction cache prefetches by fetching the next sequential line of instructions from main memory subsystem 208. High-bandwidth connections are provided both to instruction cache 102 and to data cache 104 to enhance performance. Data cache 104 is preferably dual-ported, with each port having access to a double word per cycle.

Because the overall objective behind the design of a microprocessor such as microprocessor 100 is to enhance performance by reducing the ratio of clock cycles per instruction executed, it is desirable that more than one instruction may be executed concurrently (thus the nomenclature "super-scalar"). In the example of microprocessor 100, duplicate functional units are provided so that as many as four separate instructions may be started during any one clock cycle. However, in order to keep these functional units fully occupied, it is necessary to find four instructions that may be executed simultaneously. This task is known as instruction scheduling and sometimes involves executing instructions out of program order. While instruction scheduling may be left to the compiler, any four sequential instructions are likely to contain data dependencies that cannot be resolved at compile time. Therefore, in microprocessor 100, a large instruction queue 114 is provided so that instruction scheduling may be achieved in hardware to extract maximum parallelism from the instruction stream. ALU queue 138 and memory queue 140 are each 28-entries deep. ALU queue 138 holds instructions destined for functional units 116, while memory queue 140 holds memory load/store instructions. Certain instruction types such as load-and-modify instructions and branch instructions go into both queues. As a result, microprocessor 100 has the ability to examine up to 56 recently-fetched instructions in order to find four instructions that may be executed simultaneously.

Once a group of instructions has been fetched, insertion of the instructions into instruction queue 114 is handled by sort unit 112. Specifically, sort unit 112 receives four instructions from instruction fetch unit 110 and determines which of the four were actually requested by the CPU. (Sometimes a fetched bundle of four instructions contains superfluous instructions simply because instructions are fetched four at a time.) This determination is called instruction validation. Sort unit 112 then routes the valid instructions to one or both of ALU queue 138 and memory queue 140. Each of the queues 138 and 140 can handle up to four instructions per cycle, so an arbitrary collection of four instructions may be inserted into the queues simultaneously. As was mentioned previously, queues 138 and 140 each have entries or "slots" for 28 different instructions. Once a new instruction has been placed into a slot within one of the queues, hardware monitors the previous instructions that are then launching from the queues to functional units 116 and address adders 144. This is done in order to determine whether any of the now-launching instructions will supply an operand needed by the new instruction. Once the last instruction upon which the new instruction depends has been launched to functional units 116 or address adders 144, then the slot containing the new instruction begins to arbitrate for its own launch to functional units 116 or address adders 144.

Up to two instructions may be launched simultaneously from each of ALU queue 138 and memory queue 140. Because the hardware within functional units 116 and address adders 144 is duplicated, arbitration in each of the queues is handled in two groups. For example, even-numbered slots within ALU queue 138 arbitrate for launch to ALU0, and odd numbered slots arbitrate for launch to ALU1. Arbitration proceeds similarly among the slots within memory queue 140. In each queue, the even-numbered slot with the oldest instruction and the odd-numbered slot with the oldest instruction win arbitration and are launched to functional units 116 or address adders 144.

Address reorder buffer 142 is provided to help eliminate performance penalties that are associated with load-store dependencies. When a load or store instruction in a slot of memory queue 140 has received all of its operands, it requests to be dispatched just like an ALU instruction. The destination of the load/store instruction, however, will be one of address adders 144 instead of one of functional units 116. Address adders 144 are provided so that the effective address for the load/store instruction may be calculated before executing the instruction. Once calculated, the effective address is stored into one of 28 slots within address reorder buffer 142. (Each of the 28 slots within address reorder buffer 142 is associated with one of the slots in memory queue 140.) The effective address also goes to the translation look-aside buffer (not shown), which returns a physical address that is placed into the same slot of address reorder buffer 142. With its address stored in address reorder buffer 142, the load/store instruction begins arbitrating for access to one of the banks of synchronous SRAM that make up dual-ported data cache 104. The instruction tries again on each successive cycle until it wins access. (Arbitration is based on the age of the original load/store instruction, not the time its address has been in address reorder buffer 142. Priority is given to the oldest instruction.) Address reorder buffer 142 also checks for store-to-load dependencies as follows: Whenever a store instruction has its effective address calculated, the address is compared to the addresses of any younger load instructions that have completed their cache accesses by executing out of order. If the addresses are the same, then the load and all younger instructions are flushed from address reorder buffer 142 and reexecuted. Similarly, whenever a load instruction has its address calculated, the addresses of all older stores in address reorder buffer 142 are compared with it. In the event of a match, the load waits until the store data becomes available. These mechanisms are provided to ensure that out-of-order execution cannot cause stale data to be read.

Retire block 120 is provided to remove instructions from instruction queue 114 in program order after they have successfully executed or after their trap status is known. Up to four instructions may be retired per cycle—two from ALU queue 138 and two from memory queue 140. If an instruction needs to signal a trap, the trap parameters are recorded in the architected state, and the appropriate trap vector is forwarded to instruction fetch unit 110, which then begins fetching from the new address.

Microprocessor 100 employs register renaming to execute (but not retire) instructions speculatively. Rename register blocks 122 and 124 contain a total of 56 rename registers, one for each slot within ALU queue 138 and memory queue 140. In addition, architected register block 126 contains 32 integer and 32 floating point architectural registers. At retire time, the contents of the rename register associated with a given instruction are committed to the appropriate architectural register, and any store data is forwarded to a buffer (not shown) that holds data to be written to data cache 104.

Test access port ("TAP") controller 128 is provided to implement a serial off-chip interface in accordance with the well-known Institute of Electrical and Electronics Engineers (IEEE) Standard 1149.1, "Test Access Port and Boundary Scan Architecture," also known as the Joint Test Action Group ("JTAG") standard. TAP controller 128 is coupled to numerous test nodes located adjacent to the chip pads of microprocessor 100. Such an arrangement of test nodes is commonly called a "scan chain," as is indicated in the drawing at 129. TAP controller 128 may be commanded to latch the state of the various test nodes constituting scan chain 129, and the data thus captured may then be shifted serially off-chip via the test access port for analysis by external equipment.

Further information about the structure and operation of microprocessor 100 may be found in the engineering and user documentation supplied with the PA-8000 microprocessor manufactured and sold by Hewlett Packard Company.

1.2 An exemplary multi-processor host computer system

Figure 2:
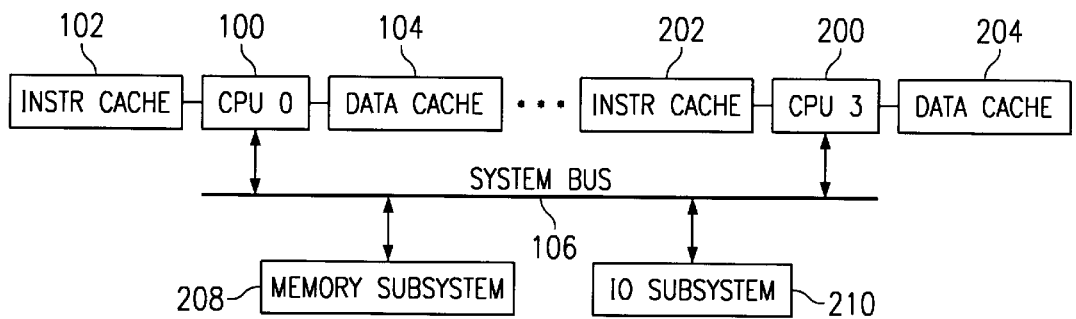
FIG. 2 is a block diagram illustrating a host multiprocessor computer system based on microprocessor 100.

As shown in FIG. 2, a complete computer system may be constructed using one or more microprocessors 100, 200 coupled via system bus 106 to a memory subsystem 208 and an input/output subsystem 210. In a multi-processor implementation such as that shown in FIG. 2, each of microprocessors 100, 200 would preferably have its own instruction cache 102, 202 and its own data cache 104, 204.

2. Preferred embodiment of the invention

FIG. 3 is a block diagram illustrating host microprocessor 100 having a preferred embodiment of the invention implemented therein.

2.1 Overview

State machine block 300 includes programmable state machine 302, counters 304, off-chip trigger interface 306 and CPU core interface 308. Off-chip trigger interface 306 provides a three-bit interface to components external to microprocessor 100. CPU core interface 308 provides a TRIG_TRAP signal to fetch unit 110, a control signal I to TAP controller 128, and two control signals J to clock generator 146.

Off-chip data interface 310 provides a 63-bit interface to components external to microprocessor 100. Its data inputs comprise 603 total signals coming from various points located throughout microprocessor 100.

System bus interface 108 is provided with system bus interface comparators 312 and performance signal generation logic 314. System bus interface comparators 312 take six bits of input from within system bus interface 108 and provide two output bits A to programmable state machine 302. Performance signal generation logic 314 provides six output bits B to programmable state machine 302.

Fetch unit 110 is provided with fetch unit comparators 316. Fetch unit comparators 316 take as inputs four instructions I0–I3, certain address bits ADR and a cache index CI. Address bits ADR and cache index CI correspond to the virtual address and the cache index for the fetched bundle of four instructions comprising instructions I0–I3. Fetch unit comparators 316 provide four output bits D to programmable state machine 302 and sixteen output bits 318 to sort unit 112.

Sort unit 112 is provided with validate logic 320. Validate logic 320 takes as inputs four bits from within sort unit 112, and the sixteen bits 318 that were generated by fetch unit comparators 316. Validate logic 320 provides four output bits E to programmable state machine 302 and sixteen output bits 322 to instruction queue 114.

Data cache interface 118 is provided with data cache interface comparators 324. Recall that data cache 104 is preferably organized as a dual-port unit. Thus, an even and an odd port exist for data loads. In this implementation, data stores share a common 64-bit data bus. Correspondingly, data cache interface comparators 324 have two sets of inputs for loads—one set for even loads and one set for odd loads. A third set of inputs is provided for stores, as shown. Data cache interface comparators 324 provide six total output bits F, G to programmable state machine 302. The four output bits F are also provided to instruction queue 114.

Data flow is provided from validate logic 320 and data cache interface comparators 324 to retire unit 120 via instruction queue 114. To accomplish this, new bit fields 326, 328 and 330 are added to each of the slots within ALU queue 138, memory queue 140 and address re-order buffer 142, respectively. The sixteen output bits 322 from validate logic 320 are stored in bit fields 326, 328. Output bits 322 include four bits per instruction (regardless of whether the instruction is an ALU-type or a memory-type instruction), and there is a potential maximum of four instructions entering instruction queue 114 from sort unit 112 during a given clock cycle. Thus, output bits 322 comprise a maximum of four different 4-bit sets. Each of the 4-bit sets is placed in the same slot of instruction queue 114 as the instruction to which it corresponds.

Similarly, the four output bits F from data cache interface comparators 324 comprise a maximum of two different 2-bit sets. These 2-bit sets are stored in bit field 330 in the same slot of instruction queue 114 as the instructions to which they correspond. Because results F from data cache interface comparators 324 always pertain to load-type memory instructions, and because even and odd load instructions are allowed to execute simultaneously in the architecture of microprocessor 100, one of these 2-bit sets will always correspond to an even load instruction, and the other will always correspond to an odd load instruction. Therefore, in order to represent this information properly in address re-order buffer 142, two bits in each slot of bit field 330 are reserved for one of the 2-bit sets produced by data cache interface comparators 324, and one additional bit in each slot of bit field 330 is reserved to indicate whether the 2-bit set just stored there derived from an even or an odd load instruction. Consequently, although outputs F comprise a maximum of four total bits (two result bits for each simultaneously-executing load instruction), a maximum of six bits may actually be stored in address-re-order buffer 142 during a given clock cycle. (In a preferred embodiment, the even/odd indicator need not be independently generated and stored in address re-order buffer 142 with the comparison results. This is because, in such an embodiment, the address of the load instruction will already be stored in address re-order buffer 142; therefore, the even/odd bit may be determined from this previously-stored address whenever it is needed.)

Retire unit 120 is provided with retiring instruction comparator matrix 332 and overall match generation matrix 334. Retiring instruction comparator matrix 332 takes, as its inputs, 24 bits of "retire-time information" from instruction queue 114. These 24 bits comprise six bits of retire-time information for each of the four instructions retiring during a given clock cycle. (Some of these bits will be null if fewer than four instructions actually retire during that clock cycle.) Retiring instruction comparator matrix 332 provides sixteen output bits to overall match generation matrix 334. Overall match generation matrix 334 takes these sixteen bits as inputs, as well as 22 other bits from instruction queue 114. The latter 22 bits include the 16 bits 322 from validation logic 320 that were previously placed in bit fields 326, 328, and the 6 bits deriving from data cache interface comparators 324 that were previously placed in bit field 330. Based on these inputs, overall match generation matrix 334 provides 12 output bits H to programmable state machine 302.

TAP controller 128 is provided with sample-on-the-fly circuitry 336. Sample-on-the-fly circuitry 336 takes as an input the control signal I generated by CPU core interface 308, and is coupled to numerous test nodes 0–n located throughout microprocessor 100. Its purpose is to latch, in a conventional manner, the state of test nodes 0–n whenever control signal I is asserted. After the state of the test nodes is so latched, TAP controller 128 may then be used to clock the latched information serially off-chip in a conventional manner via the test access port. The information may then be analyzed by components external to microprocessor 100.

Staging register circuitry 338 is provided, and is coupled to architected registers 126 via parallel data bus 340. This enables data to be transferred between architected registers 126 and staging register 338 by executing an instruction on microprocessor 100. Serial data and control lines 342 form a serial loop comprising staging register circuitry 338, fetch unit comparators control register circuitry 344, state machine/counters control register circuitry 346, system bus interface comparators control register circuitry 348, off-chip data interface control register circuitry 350, data cache interface comparators control register circuitry 352 and retire unit comparators control register circuitry 354.

2.2 Staging register and control registers

Staging register circuitry 338 and control register circuitries 344–354, as well as how data communication is achieved between them and architected registers 126, will now be described with reference to FIGS. 4–10.

Figure 4:
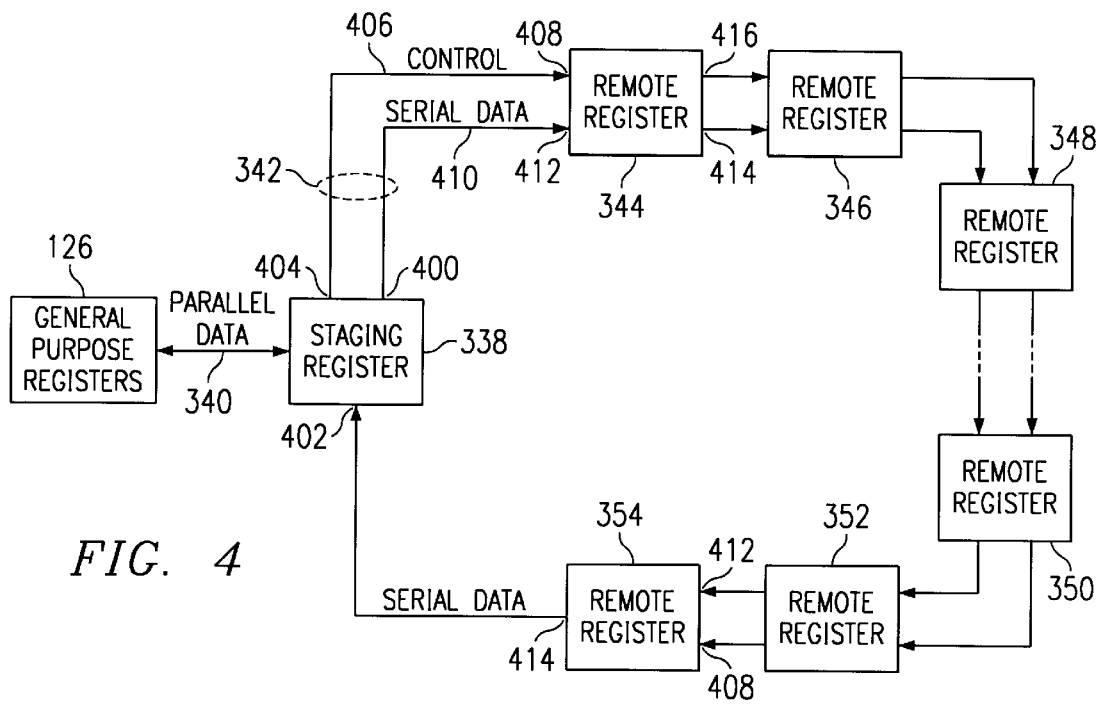
FIG. 4 is a block diagram illustrating a serial loop of control registers interfaced with a staging register and a general-purpose architected register.
Figure 3A:
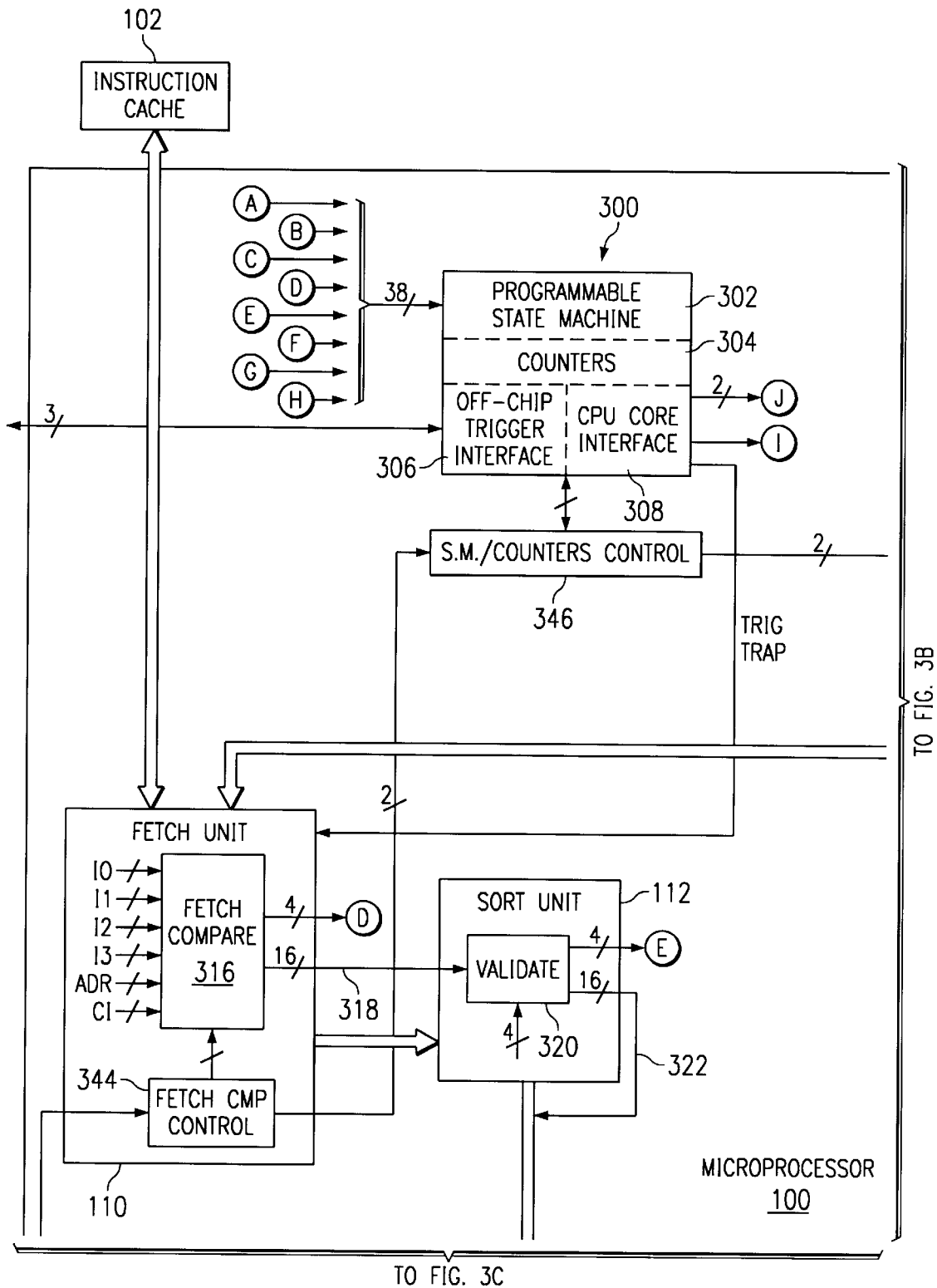
FIG. 3 is a block diagram illustrating host microprocessor 100 with a preferred embodiment of the invention implemented therein.
Figure 3B:
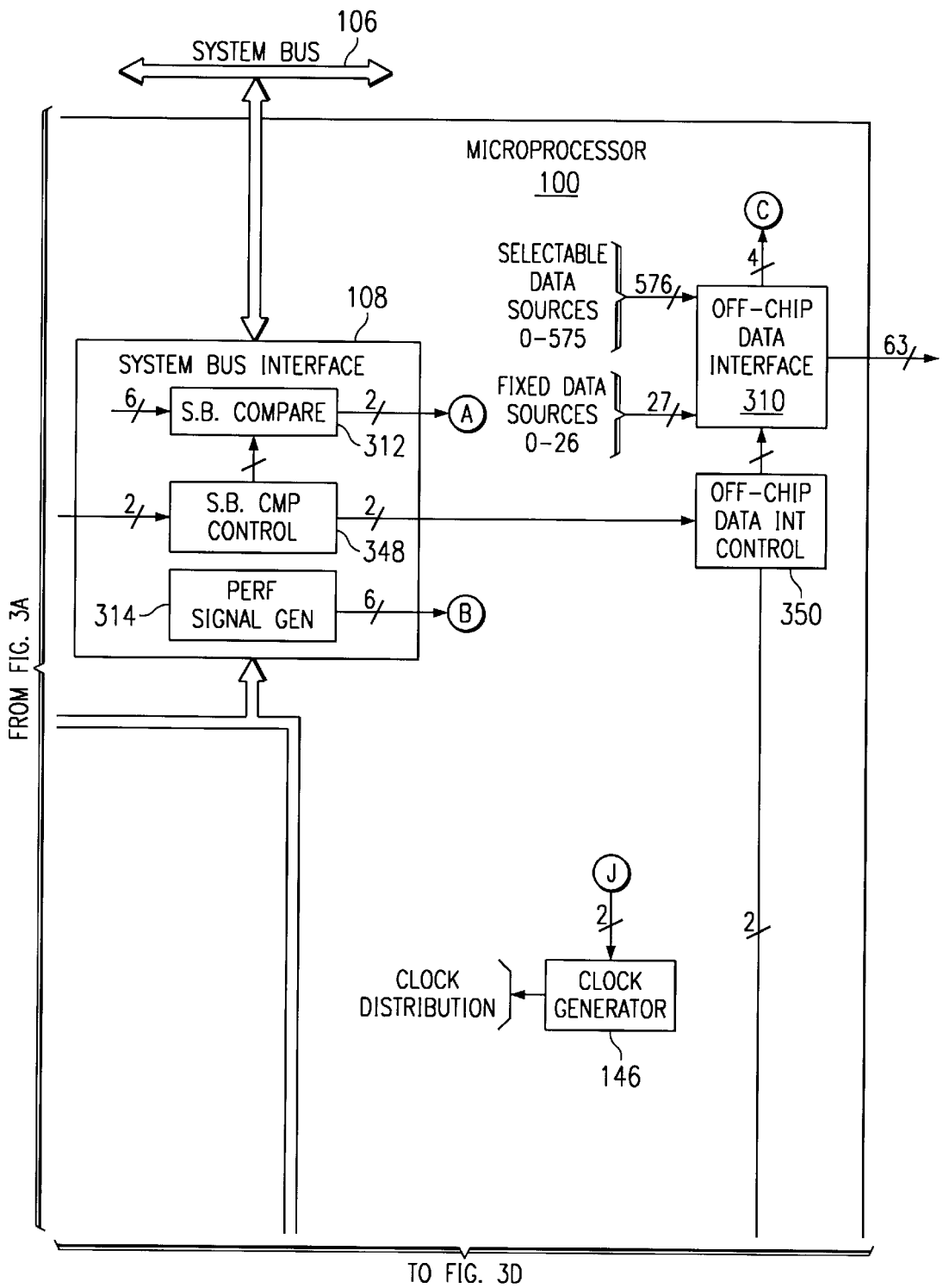
Figure 3C:
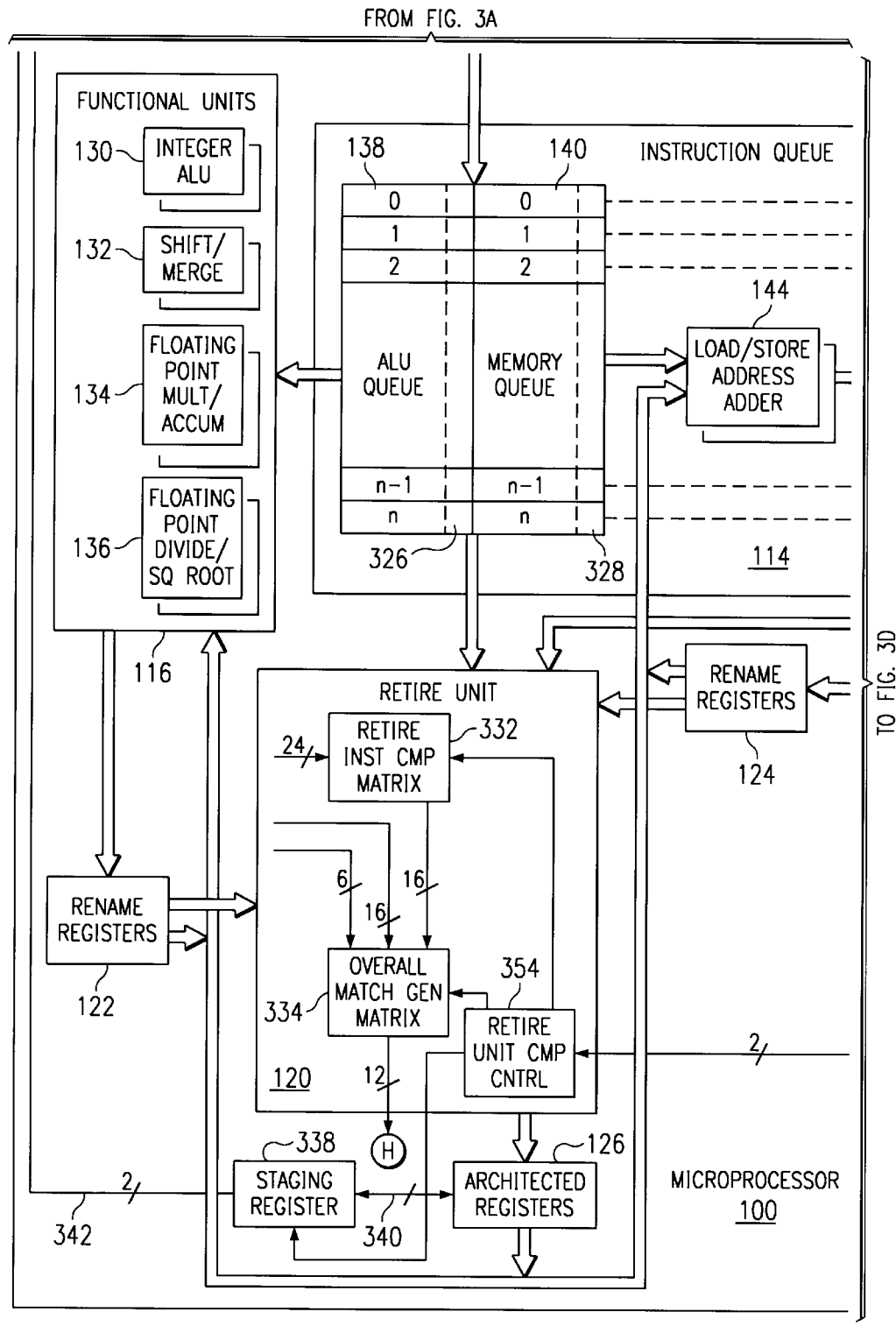
Figure 3D:
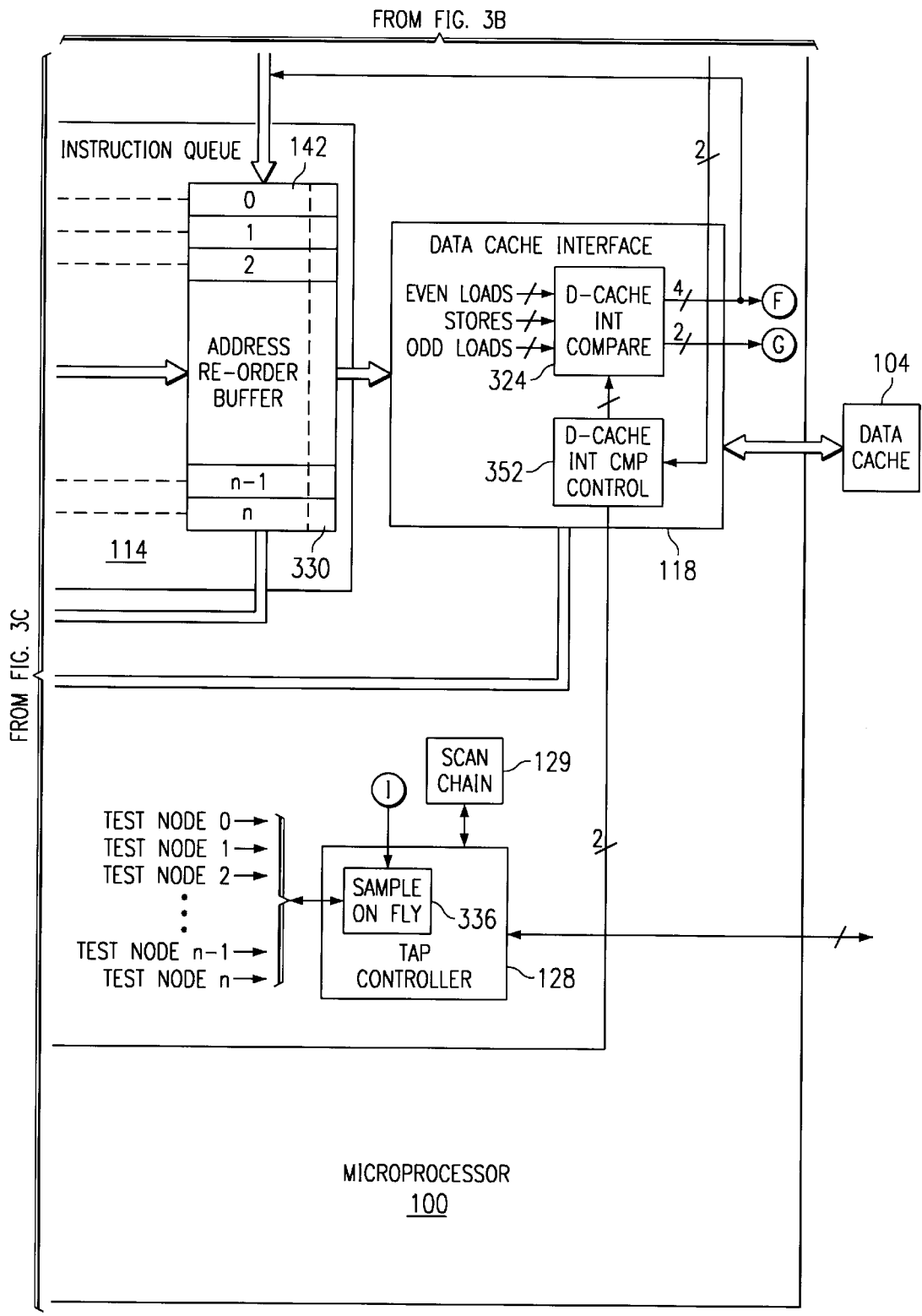

As can be seen in FIG. 4, a serial loop is formed by remote register circuitries 344–354 and staging register circuitry 338. Staging register circuitry 338 has a serial data output 400, a serial data input 402, and a control signal output 404. The staging register circuitry control signal output 404 is coupled via control line 406 to a corresponding control signal input 408 of remote register circuitry 344. Likewise, the staging register circuitry serial data output 400 is coupled via serial data line 410 to a corresponding serial data input 412 of remote register circuitry 344. Each of remote register circuitries 344–352 has a serial data input 412, a serial data output 414, a control signal input 408 and a control signal output 416. Remote register circuitry 354 has a serial data input 412, a serial data output 414 and a control signal input 408. Thus, the signal on serial data line 410 may be propagated in serial fashion from the serial data output 400 of staging register 338, through each of remote register circuitries 344–354 and back into the serial data input 402 of staging register circuitry 338. Similarly, the signal on control line 406 may be propagated from the control signal output 404 of staging register circuitry 338 to remote register circuitry 354 through each of the intervening remote register circuitries. Staging register circuitry 338 is coupled to general purpose register circuitry 126 via parallel data bus 340.

Figure 5:
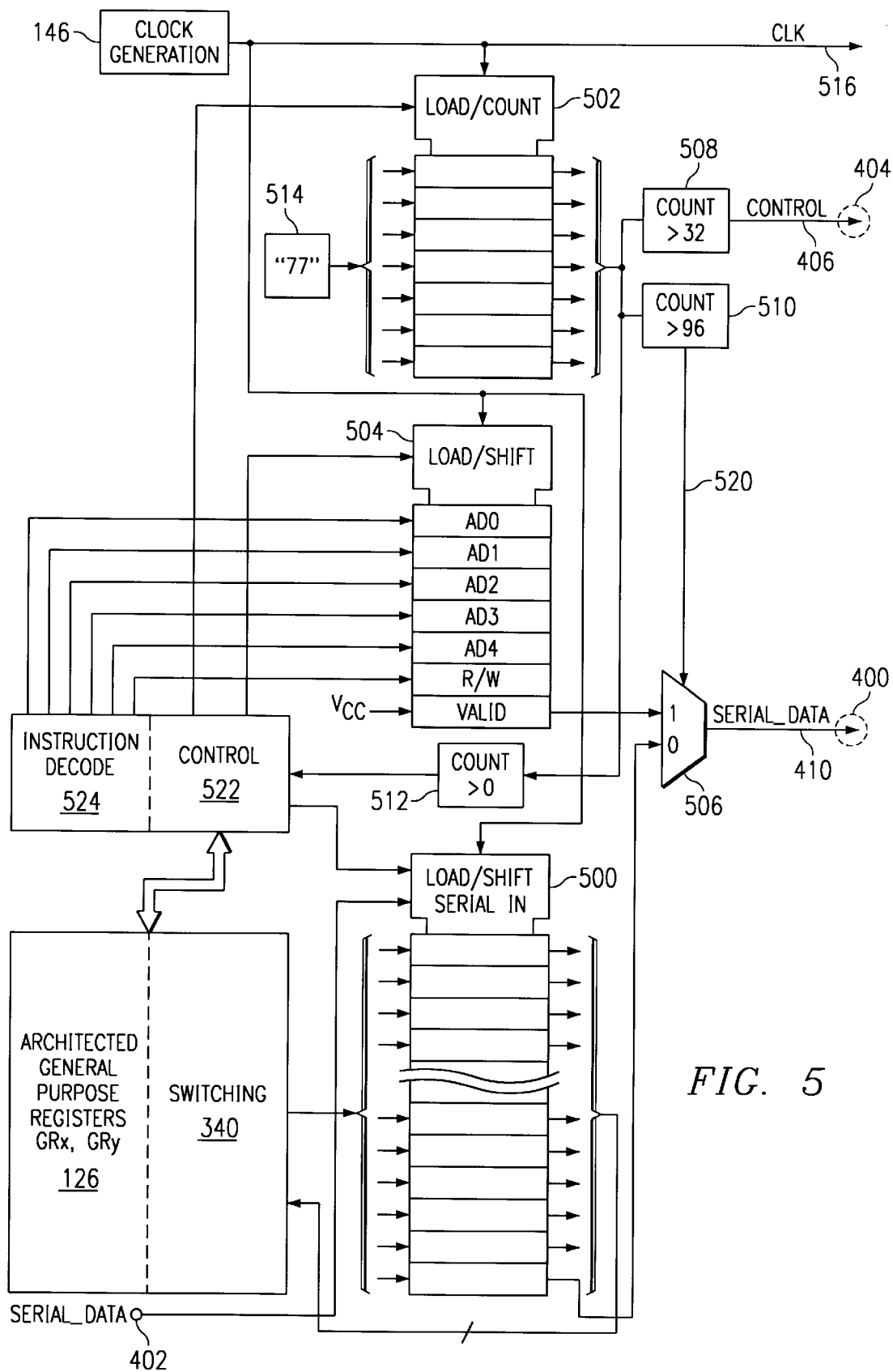
FIG. 5 is a block diagram illustrating the details of the staging register and general purpose registers of FIG. 4 and their associated logic.

FIG. 5 is a block diagram illustrating staging register circuitry 338 and general purpose register circuitry 126 in more detail. General purpose register circuitry 126 is coupled to staging register 500 via a parallel data bus 340. Data bus 340 is shown in FIG. 5 in the form of conventional switching circuitry appropriate for directing read and write data between staging register 500 and one of the general purpose registers within microprocessor 100's general purpose registers 126. Also shown in FIG. 5 is clock generation logic 146, counter 502, header generation register 504, multiplexer 506, comparators 508, 510 and 512, and ROM 514.

For the purpose of explaining the concept and preferred implementation of staging register circuitry 338 and control register circuitries 344–354 in this section 2.2, we will assume that the control registers contained in remote register circuitries 344–354 are each 64 bits deep. It will be apparent with reference to sections 2.3 et seq., however, that the number of actual bits contained in these control registers varies. Also, in actual implementations, the staging register need not be the same length as the remote registers. Moreover, the remote registers need not all be the same length as one another. (Multiple operations may be used to read and write remote registers that are longer than the staging register.)

ROM 514 may be implemented simply as hardwired connections to power supply and ground as required to present the binary equivalent of decimal "77" to the parallel data load inputs of counter 502. Counter 502 should be configured to count down whenever it receives a clock and its control input indicates count. When its control input indicates load, counter 502 will be reset to the value "77." Clock generation logic 146 generates clock signal 516, which may be used to drive clock inputs throughout the chip. Comparator 508 will assert control line 406 whenever the output of counter 502 exceeds decimal 6. Comparator 510 will assert main serial data multiplexer control line 520 whenever the output of counter 502 exceeds decimal 70. And comparator 512 will assert a signal to control logic 522 within microprocessor 100 whenever the output of counter 502 exceeds 0. As is indicated in the drawing, the control signals for counter 502, header generation register 504 and staging register 500 may be provided by control logic 522 within microprocessor 100. Also, the parallel data load inputs of header generation register 504 are provided by instruction decode logic 524 within microprocessor 100.

Figure 6:
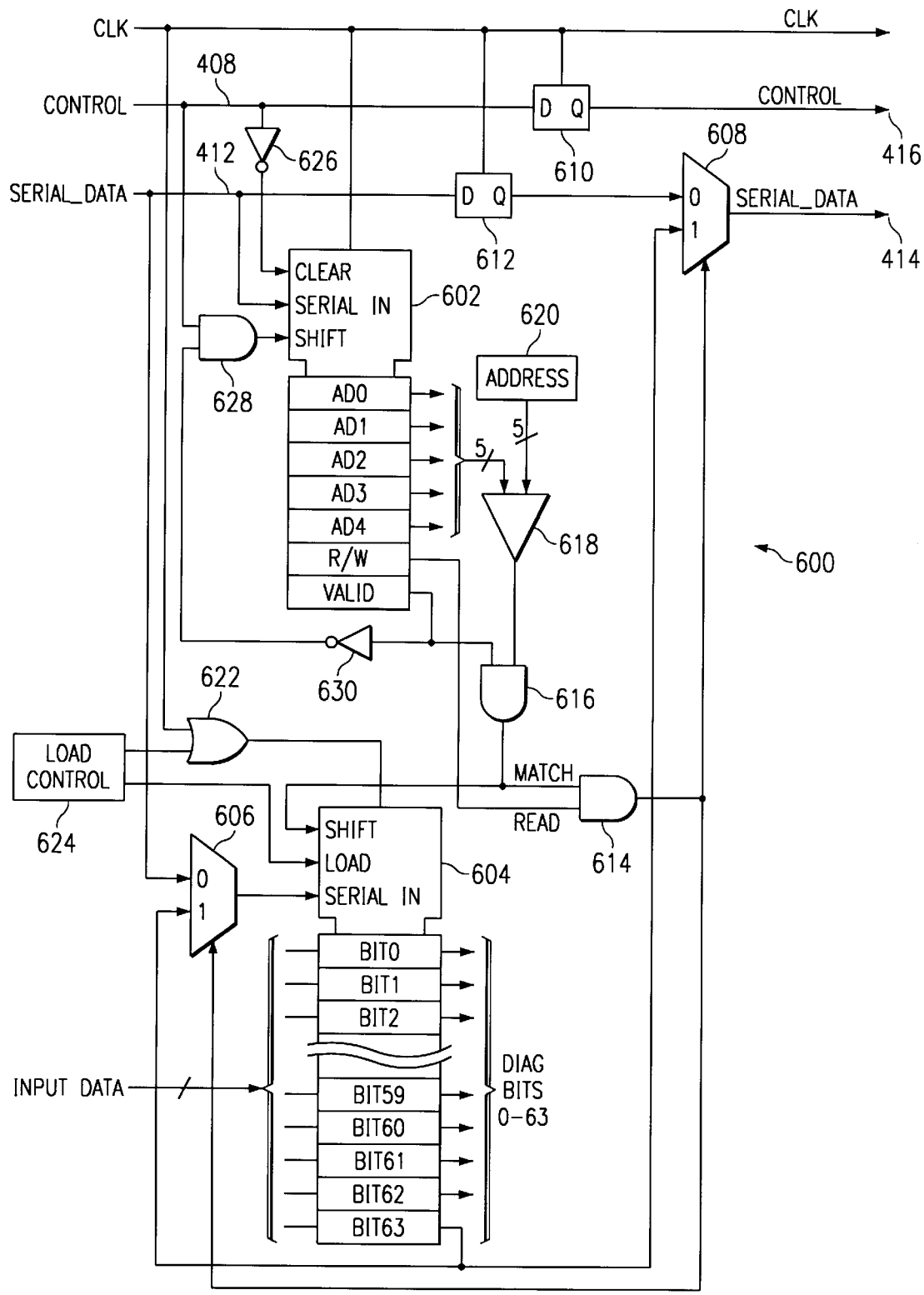
FIG. 6 is a block diagram illustrating the details of a representative one of the control registers of FIG. 4 and its associated logic.

FIG. 6 is a block diagram illustrating a representative one of remote register circuitries 344–354. (It should be understood that remote register circuitry 600 is representative of all remote register circuitries 344–354 shown in FIGS. 3 and 4, with the exception that remote register circuitry 354 does not include a control signal output.) Remote register circuitry 600 includes a header capture register 602, a remote register 604, an input multiplexer 606 and an output multiplexer 608. Control signal input 408 is coupled to control signal output 416 through one-bit latch 610. Serial data input 412 is coupled to one input of output multiplexer 608 through one-bit latch 612. The other input of output multiplexer 608 is coupled to the data shift output of remote register 604. Serial data output 414 is provided by the output of output multiplexer 608. The control input of output multiplexer 608 is provided by the output of a combinational logic system comprising AND gates 614 and 616, comparator 618 and ROM 620. ROM 620 stores the address that remote register circuitry 600 will respond to. (Preferably, each of remote register circuitries 344–354 will be configured to respond to a unique address.) Comparator 618 compares this address with bits AD0–4 from header capture register 602 and asserts one input of AND gate 616 if they are the same. A MATCH is indicated on the output of AND gate 616 if the output of comparator 618 is asserted and the VALID bit in header capture register 602 is also asserted. If MATCH is asserted and the R/W bit in header capture register 602 indicates a read, then the output of AND gate 614 will be asserted and the "1" inputs of both multiplexers 608 and 606 will be selected; otherwise, the "0" inputs of those multiplexers will be selected. OR gate 622 and load control logic 624 are provided to enable input data to be loaded into remote register 604 whenever desired.

Serial data input 412 is coupled to the "0" input of input multiplexer 606 and to the serial input of header capture register 602. The serial input of remote register 604 is coupled to the output of input multiplexer 606. The shift input of remote register 604 is coupled to the MATCH signal, while its load input is supplied by load control logic 624. Control input 408 is coupled to a clear input of header capture register 602 via inverter 626. The shift input of header capture register 602 is driven by the output of AND gate 628, whose first input is coupled to the control input 408, and whose second input is coupled to the VALID bit through inverter 630.

It is contemplated that microprocessor 100 will include within its instruction set certain opcodes for writing data to and reading data from specific remote registers. For example, one instruction may be designed to move the contents of a specified one of general purpose registers 126 into staging register 500. Another instruction may be designed to load header generation register 504 with the address of the desired remote register, to set the R/W bit in header generation register 504 to "R" in the case of a read or to "W" in the case of a write, and to shift the header out onto serial data line 410. A third instruction might be designed to move the contents of staging register 500 into a specified one of general purpose registers 126.

2.2.1 Writing to a remote register

FIG. 7 illustrates a preferred method for writing a data value to a remote register using the apparatus just described. In step 702, a microprocessor instruction is executed to load the data into general purpose register GRx. In step 706, using another microprocessor instruction, the contents of GRx are loaded into staging register 500. In step 708, a "shift to diagnose" instruction is executed. Preferably, this instruction should contain the address of the target remote register as immediate informnation. The effect of the instruction is to load the address into bits AD0–4 of header generation register 504, and to set the R/W bit of that register to W. (The VALID bit in header generation register 504 always loads with VALID.) Then, after loading counter 502 with the number 77, the contents of header generation register 504 and staging register 500 are shifted onto serial data line 410 by supplying appropriate control signals to the two registers. The shifting ceases when counter 502 counts down to zero.

Because, when initially loaded, the value in counter 502 exceeds both 6 and 70, control signal 406 and multiplexer control line 520 are both asserted (as indicated at COUNT=77 in FIG. 8). Thus, main serial data multiplexer 506 routes the serially shifting output from header generation register 504 onto serial data line 410. As soon as the seven header bits from header generation register 504 have been shifted onto serial data line 410, the count in counter 502 will have fallen to 69. At this time, main serial data multiplexer control line 520 is unasserted (as shown at COUNT=69 in FIG. 8). Thus, the data from staging register 500 is selected and begins to be shifted serially out onto serial data line 410. At the same time, data from serial data input 402 is shifted serially into staging register 500. Although the write data will have been completely shifted out of staging register 500 when COUNT=5 (as shown in FIG. 8), the write operation continues for several additional clock cycles until COUNT=0. This is necessary because each of remote register circuitries 344–354 interposes a one-bit latch on serial data line 410 and on control line 406. In the example being discussed, there are six remote registers. Thus, six additional shifts are necessary to assure that all bits are communicated to the 6th remote register in the serial loop before shifting ceases.

Activity at the remote registers can best be understood with reference to FIG. 6. It can be seen that header capture register 602 will have been cleared while CONTROL was unasserted. When CONTROL is asserted, header capture register will begin clocking bits in serially from serial data input 412. As soon as the VALID bit is clocked in, the shift input is disabled and no further shifting occurs in header capture register 602. Instantaneously, a comparison is then made with address 620. If the address matches the header address bits, then remote register 604 begins clocking bits in serially from serial data input 412 until CONTROL is no longer asserted. The result will be that 64 data bits will have been written into remote register 604.

2.2.2 Reading from a remote register

Reading data from a particular remote register is very similar procedurally to writing data to the register, except that microprocessor 100 sets the R/W bit in header generation register 504 to R, and need not load any data value into staging register 500 before executing the read operation.

Figure 9:
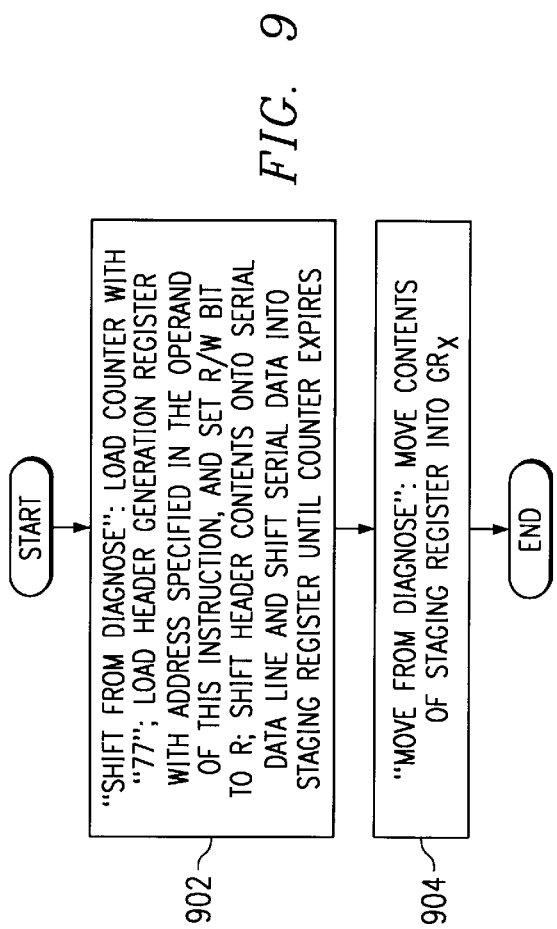
FIG. 9 is a flow diagram illustrating a preferred method for reading data from one of the control registers of FIG. 4.

FIG. 9 illustrates a preferred method for reading data from a remote register. In step 902, a "shift from diagnose" instruction is executed to load counter 506 with 77, load address bits AD0–4 of header generation register 504 with the address specified in the instruction, and set the RJW bit of that register to "R." The header is then shifted out onto serial data line 410, and at the same time serial data is shifted back into staging register 500 from serial data input 402. The shifting ceases when counter 502 counts down to zero. In step 904, another microprocessor instruction is executed to move the contents of staging register 500 into a specified one of architected registers 126, thus completing the read operation.

Figure 10:
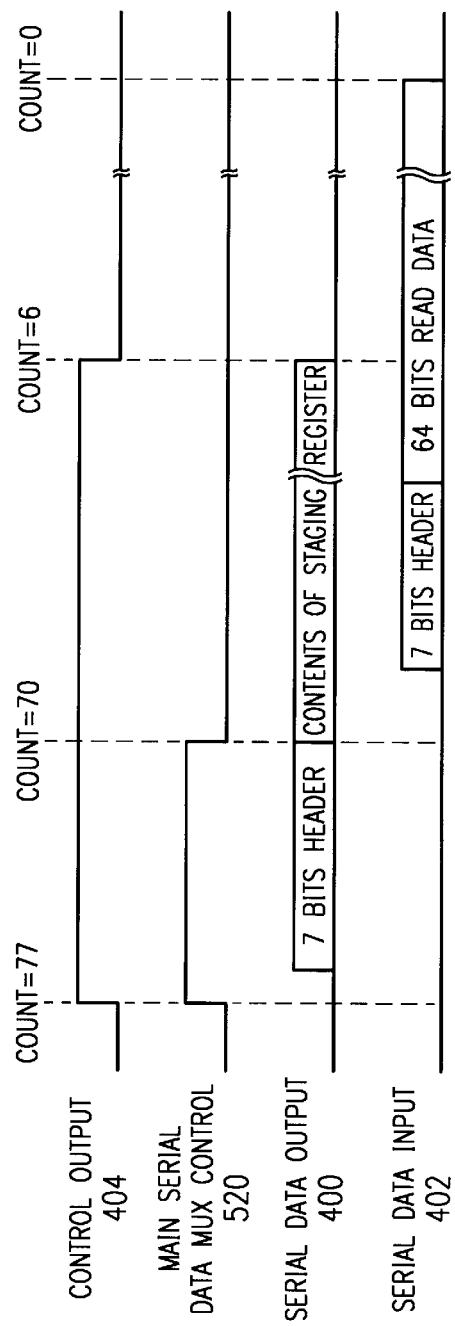
FIG. 10 is a timing diagram illustrating the states of various signals during the read operation of FIG. 9.

As can be seen in FIG. 10, the 6-bit latency caused by the latches in the serial loop of remote register circuitries causes the last of the read data to be clocked into staging register 500 from serial data input 402 when COUNT=0. As the header is propagated through the loop of remote register circuitries 344–354, each of the remote register circuitries compares bits AD0–4 in the header with its own address to determine if it has been selected. If the addresses are the same, then MATCH is asserted. The R/W having been set to R causes READ also to be asserted. The result is that multiplexer 608 routes data from remote register 600 onto serial data line 414, enabling the data to be shifted serially back into serial data input 402 of staging register circuitry 338 as desired. The control inputs of remote register 604 are also controlled so that data shifted out of the register is recirculated to the serial input, thus making non-destructive reads possible if the remote register is either 64 bits long or an evenly divisible submultiple of 64.

When implementing the invention on a die that is already dense with other circuitry, the reader will find that the apparatus and procedures discussed in this section 2.2 provide important advantages. For example, the remote registers can be quite large (on the order of 1,000 bits or more) and very numerous, and yet only two interconnect lines are necessary to access all of them. Also, the apparatus can be expanded to include many more or less than the six remote registers used in the example discussed herein, simply by adding to or subtracting from the number of bits used in the header address field (bits AD0–4). Moreover, addition of a remote register, no matter its size, adds only one bit of latency to the serial loop.

2.3 Programmable state machine, counters, CPU core and off-chip trigger interfaces Programmable state machine 302, counters 304, off-chip trigger interface 306 and CPU core interface 308 will now be described with reference to FIGS. 11–21.

Figure 11:
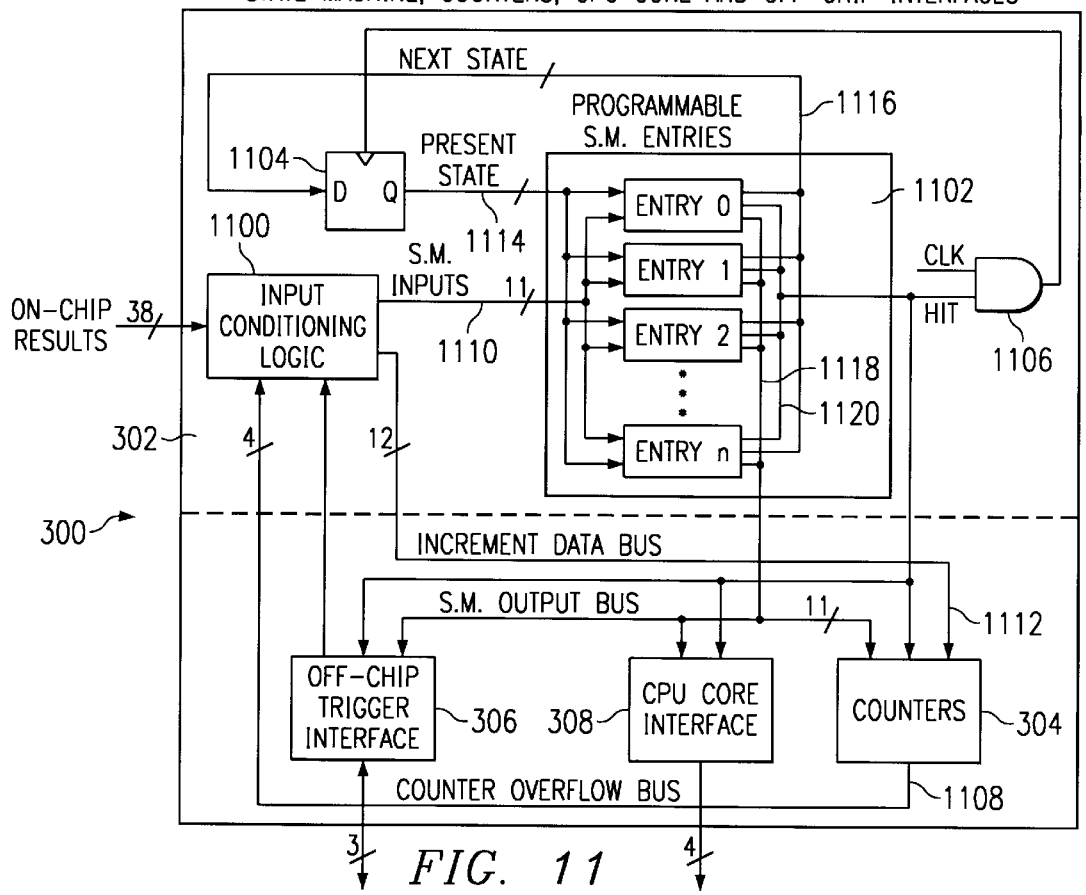
FIG. 11 is a block diagram illustrating the state machine, counters, CPU core and off-chip trigger interfaces of FIG. 3.

FIG. 11 illustrates the contents of block 300 in detail. Block 300 contains programmable state machine 302, counters 304, CPU core interface 308 and off-chip trigger interface 306. Programmable state machine 302 includes input conditioning logic 1100, programmable state machine entries 1102, multi-bit present state latch 1104 and AND gate 1106. The inputs to input conditioning logic 1100 include thirty-eight bits from on-chip results A–H, four bits from counters 304 (via counter overflow bus 1108), and one bit from off-chip trigger interface 306. Input conditioning logic 1100 provides twenty-three total output bits. Eleven of these are provided to programmable state machine entries 1102 as state machine inputs 1110. The other twelve are provided to counters 304 via increment data bus 1112. As can be seen in the drawing, the inputs of each of programmable state machine entries 0–n are coupled to multi-state latch 1104 via present state bus 1114 and also to state machine inputs 1110. The outputs of each of programmable state machine entries 0–n are coupled to next state bus 1116, state machine output bus 1118 and HIT bus 1120. The HIT signal is combined with CLK by AND gate 1106 to derive a signal that is used to control multi-state latch 1104.

Figure 12:
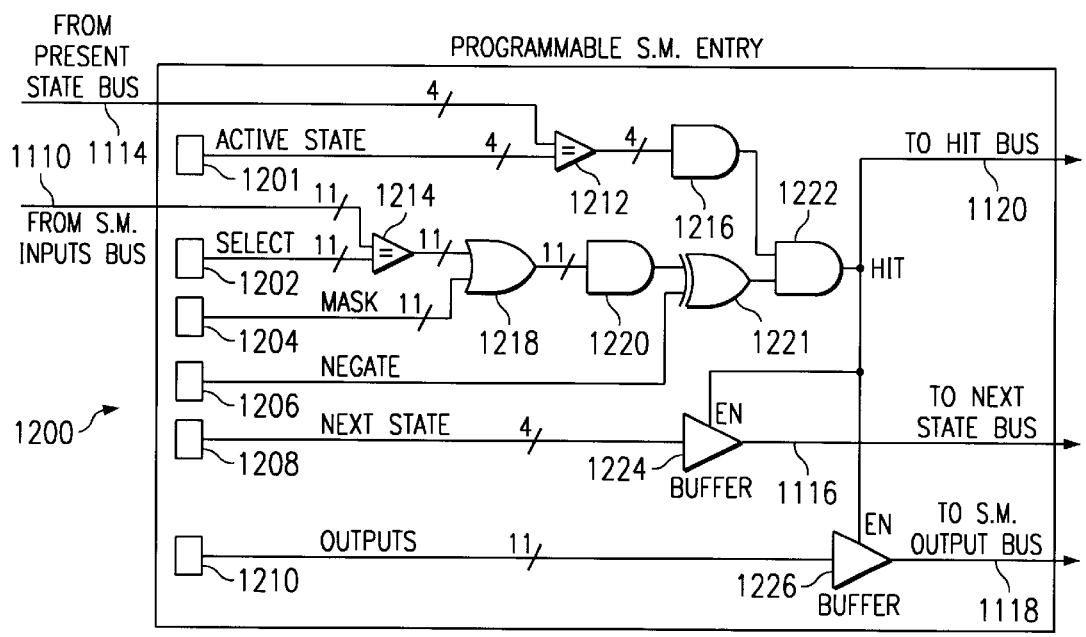
FIG. 12 is a block diagram illustrating a representative one of the programmable state machine entries of FIG. 11.

FIG. 12 illustrates a representative one of programmable state machine entries 0–n. It is contemplated that storage elements 1201–1210 would be included within state machine/counters control register circuitry 346. Thus, storage elements 1201–1210 would be loaded with data by writing to state machine/counters control register circuitry 346 using the method and apparatus described above in section 2.2.

The four bits of present state bus 1114 are provided to one of the inputs of comparator 1212 so that they may be compared with the contents of storage element 1201, which specifies the present state during which entry 1200 will become active. The four bits that are output from comparator 1212 are ANDed together at AND gate 1216, yielding a one-bit match result for present state. Similarly, the contents of storage element 1202 (bit-wise select) are compared with the eleven bits of state machine input bus 1110 by comparator 1214. OR gate 1218 is used to mask the output bits of comparator 1214 with the contents of storage element 1204 (bit-wise mask). The results of this masking operation are ANDed together using AND gate 1220, resulting in a match result for the state machine input bus. Exclusive OR gate 1221 couples the output of AND gate 1220 to one of the inputs of AND gate 1222 as shown, and also provides a selectable inversion function. That is, when negate bit 1206 is set to "O," the output of exclusive OR gate 1221 follows the output of AND gate 1220; but when negate bit 1206 is set to "1," the output of exclusive OR gate 1221 is the opposite of the output of AND gate 1220. The match results for present state and for the state machine input bus are ANDed together by AND gate 1222 to produce the HIT signal, which is coupled to HIT bus 1120. If HIT happens to become asserted as a result of the match results for present state and the state machine input bus, then tri-state buffers 1224 and 1226 are enabled, allowing the contents of storage elements 1208 and 1210 to drive next state bus 1116 and state machine output bus 1118, respectively.

Figure 13:
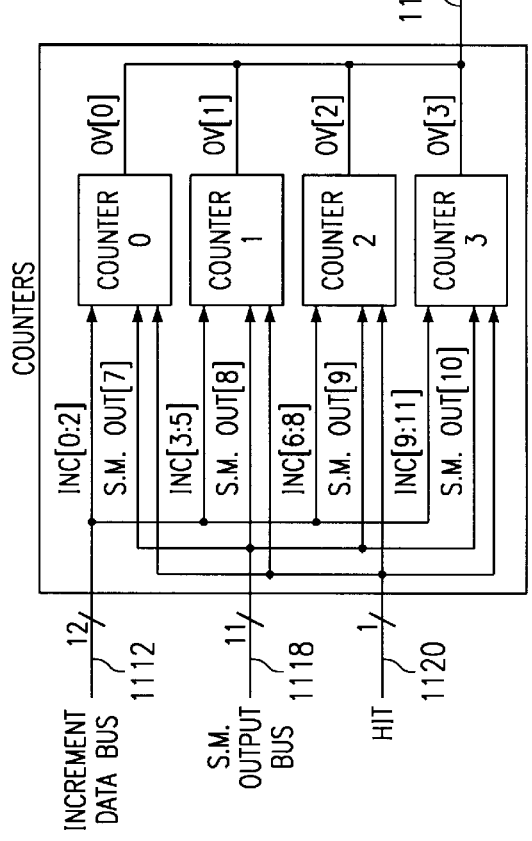
FIG. 13 is a block diagram illustrating the counters of FIG. 11.

FIG. 13 illustrates counters 304 in detail. As can be seen in the drawing, counters block 304 includes four separate counters labeled counter 0–3. On the input side, each of counters 0–3 is coupled to increment data bus 1112, state machine output bus 1118 and HIT bus 1120. Specifically, bits 0–2 of increment data bus 1112 are coupled to counter 0, bits 3–5 are coupled to counter 1, bits 6–8 are coupled to counter 2, and bits 9–11 are coupled to counter 3. Bit 7 of state machine output bus 1118 is coupled to counter 0, bit 8 to counter 1, bit 9 to counter 2, and bit 10 to counter 3. The HIT signal is coupled to each counter. Each of counters 0–3 also generates an overflow bit, labeled OV 0–3 in the drawing. These four overflow bits constitute counter overflow bus 1108.

Figure 14:
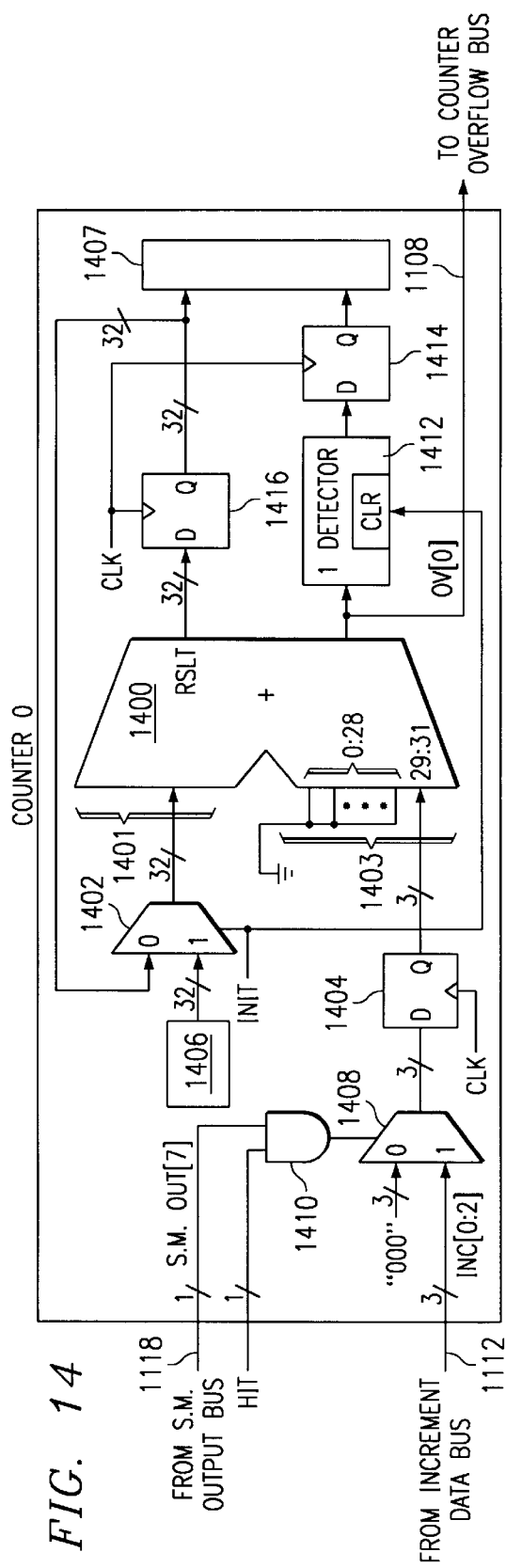
FIG. 14 is a block diagram illustrating a representative one of the counters of FIG. 13.

FIG. 14 illustrates counter 0 in detail. (Counter 0 is representative of each of counters 0–3.) It is contemplated that storage elements 1406 and 1407 would be included within state machine/counters control register circuitry 346. Thus, storage element 1406 would be loaded with data by writing to state machine/counters control register circuitry 346 using the method and apparatus described above in section 2.2. Storage element 1407 may be loaded from latches 1414 and 1416 using logic such as load control logic 624, and may be read by reading from state machine/counters control register circuitry 346 using the method and apparatus described above in section 2.2 (section 2.2.2 in particular).

Counter 0 contains a thirty-two bit adder 1400, which has two addend inputs 1401 and 1403. Addend input 1401 is coupled to the output of multiplexer 1402. One input of multiplexer 1402 is coupled to a latched copy of the sum output (RSLT) of adder 1400, as shown. The other input of multiplexer 1402 is coupled to the output of storage element 1406 (initial value). Thus, depending on the state of the INIT signal, addend input 1401 will be coupled either to RSLT or to the initial value stored in storage element 1406. (Preferably, the INIT signal is generated whenever storage element 1406 is written to.) The least significant three bits of addend input 1403 are coupled to three-bit latch 1404. The twenty-nine most significant bits are coupled to ground. The input of latch 1404 is coupled to the output of multiplexer 1408. One input of multiplexer 1408 is coupled to ground, yielding an input value of "000." The other input of multiplexer 1408 is coupled to bits 0-2 of increment data bus 1112. Thus, depending on the output of AND gate 1410, the input of latch 1404 is provided either by bits 0–2 of increment data bus 1112 or by ground. The former will be selected whenever HIT is asserted and bit 7 of state machine output bus 1118 is asserted. Thus, counter 0 may be incremented by any value between 0 and 7 depending on the content of increment data bus bits 0–2.

"1-detector" 1412 (constructed by conventional means) is provided to catch asynchronously any assertions of the overflow signal OV by adder 1400. In turn, this signal is latched by latch 1414. "1-detector" 1412 will be cleared upon the assertion of the INIT signal. The sum output RSLT of adder 1400 is latched by latch 1416. The contents of latches 1414 and 1416 are preferably stored by storage element 1407 for later retrieval as previously discussed. Overflow signal OV is also supplied to counter overflow bus 1108.

Figure 15:
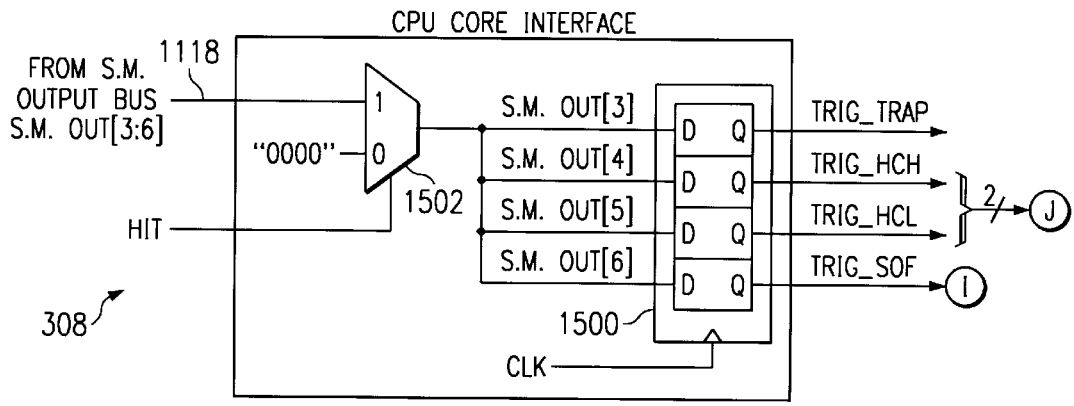
FIG. 15 is a block diagram illustrating the CPU core interface of FIG. 11.

Referring now to FIG. 15, CPU core interface 308 includes 4-bit latch 1500, whose inputs are coupled to the output of 4-bit multiplexer 1502. One 4-bit input of multiplexer 1502 is coupled to ground, yielding the input value "0000." The other input is coupled to bits 3–6 of state machine output bus 1118. The select input of multiplexer 1502 is provided by the HIT signal. When TRIG_TRAP is asserted, fetch unit 110 will preferably begin fetching instructions from the address associated with the trap routine. When TRIG_HCH (TRIG_HCL) is asserted, clock generator 146 will hold the system clock high (low). When TRIG_SOF is asserted, sample-on-the-fly logic 336 will latch the state of test nodes 0–n for later retrieval by an external system via conventional TAP controller 128.

Figure 16:
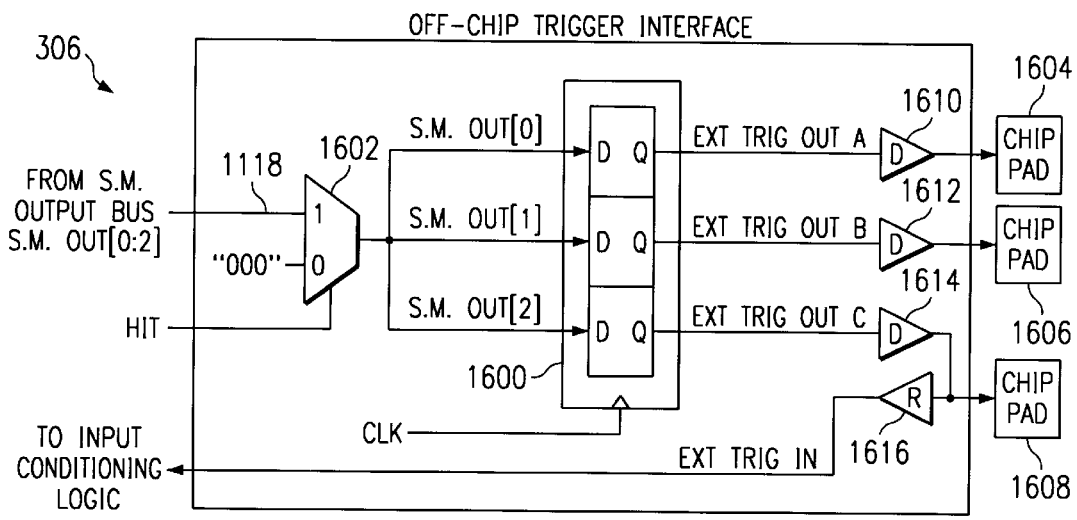
FIG. 16 is a block diagram illustrating the off-chip trigger interface of FIG. 11.

Referring now to FIG. 16, off-chip trigger interface 306 includes 3-bit latch 1600, whose inputs are coupled to the output of 3-bit multiplexer 1602. One 3-bit input of multiplexer 1602 is coupled to ground, yielding the input value "000." The other input is coupled to bits 0–2 of state machine output bus 1118. The select input of multiplexer 1502 is provided by the HIT signal. The outputs of latch 1600 are called EXT_TRIG_OUT A, B and C. EXT_TRIG_OUT A, B and C are coupled to chip pads 1604, 1606 and 1608, respectively, via output driver buffers 1610, 1612 and 1614. While chip pads 1604 and 1606 constitute output signals for microprocessor 100, chip pad 1608 is bidirectional by virtue of the fact that it is coupled not only to output driver buffer 1614, but also to receive buffer 1616. The output of receive buffer 1616 is designated EXT_TRIG_IN and constitutes one of the inputs of input conditioning logic 1100 (which will be discussed next).

Figure 17:
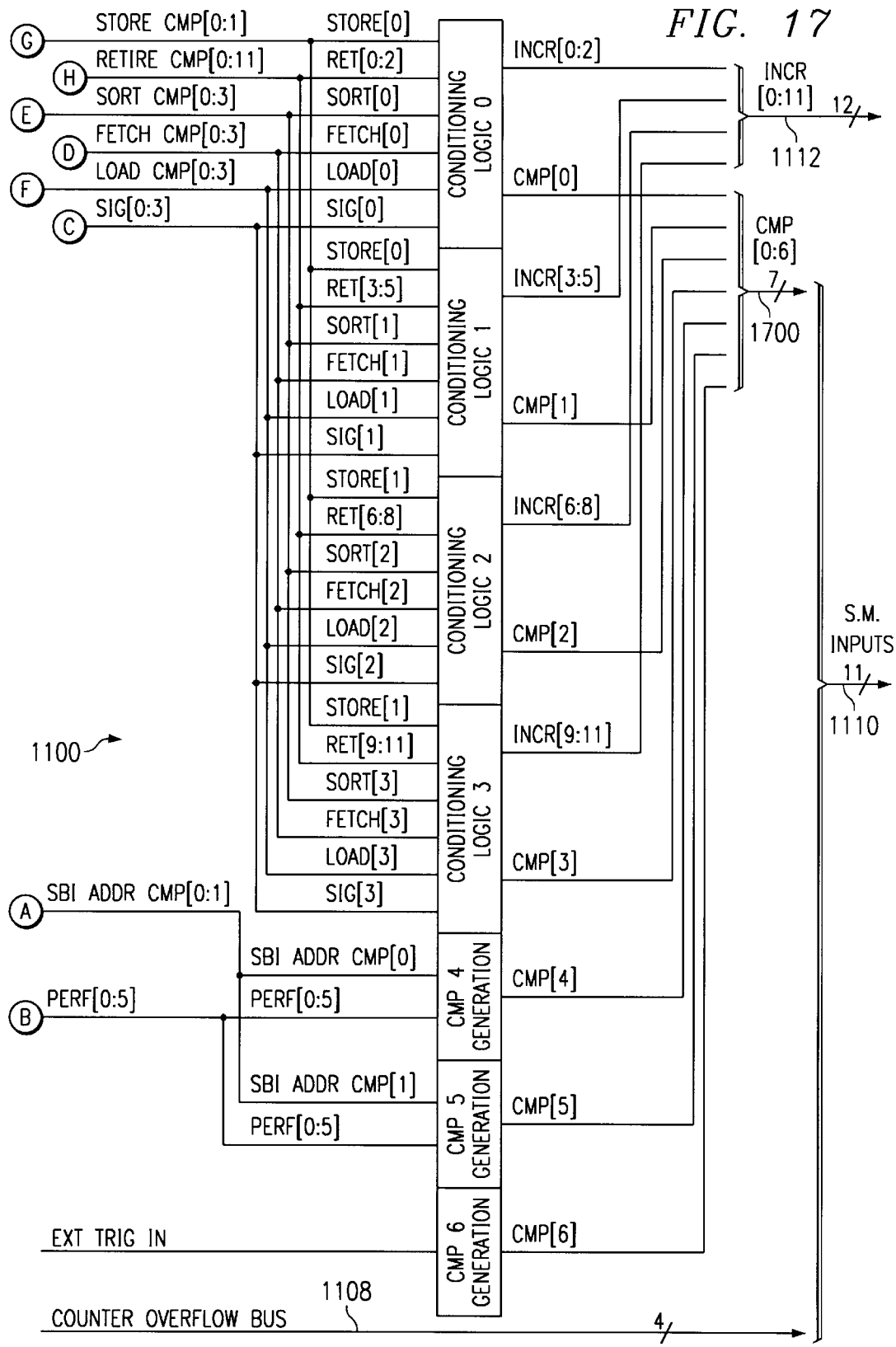
FIG. 17 is a block diagram illustrating the input conditioning logic of FIG. 11.

FIG. 17 illustrates input conditioning logic 1100 in detail. The chief purpose of input conditioning logic 1100 is to allow the programmer to select which information will be used as inputs to programmable state machine 302. A secondary purpose of input conditioning logic is to determine which increment values will be used to increment counters 0–3. Input conditioning logic 1100 includes conditioning logic blocks 0–3 and CMP generation blocks 4–6. Signal sets C, D, E, F, G and H are provided to conditioning logic blocks 0–3 as shown. Signal sets A and B are provided to CMP generation blocks 4 and 5 as shown. The only input for CMP generation block 6 is the EXT_TRIG_IN signal previously discussed in relation to FIG. 16. Counter overflow bus 1108 is fed straight through to the output of input conditioning logic 1100 without manipulation. Each of conditioning logic blocks 0–3 provides three of the twelve total bits that comprise increment data bus 1112, as shown. Also, each of input conditioning logic blocks 0–3 provides one of the seven total bits that comprise comparator result bus 1700. The other three bits of comparator result bus 1700 are provided by CMP generation blocks 4–6. Together, comparator result bus 1700 and counter overflow bus 1108 comprise state machine input bus 1110.

Figure 18:
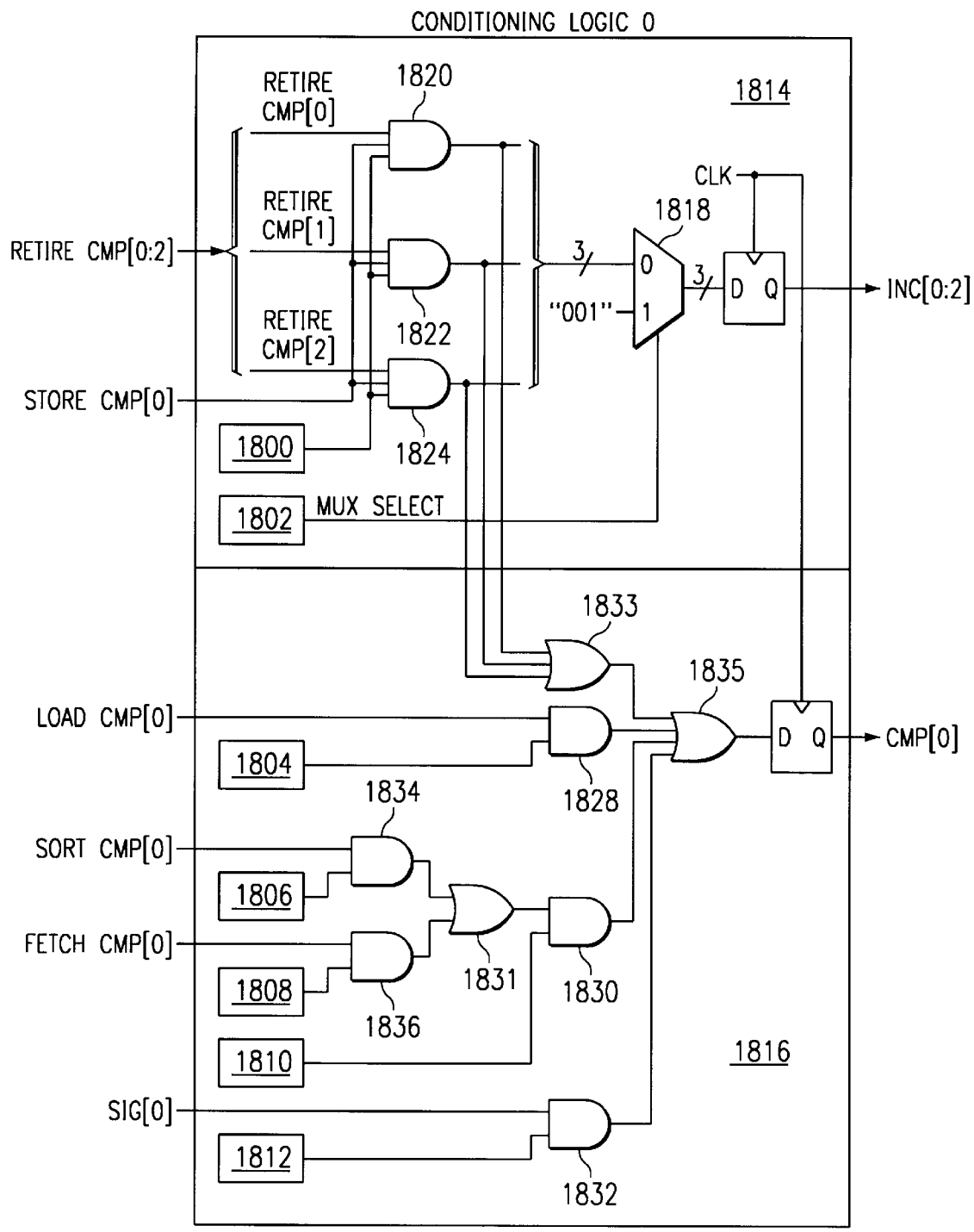
FIG. 18 is a block diagram illustrating a representative one of the conditioning logics 0–3 shown in FIG. 17.

FIG. 18 illustrates the contents of conditioning logic 0 in detail. (Conditioning logic 0 is representative of conditioning logic 0–3). It is contemplated that storage elements 1800–1812 would be included within state machine/counters control register circuitry 346. Thus, storage elements 1800–1812 would be loaded with data by writing to state machine/counters control register circuitry 346 using the method and apparatus described above in section 2.2. The purpose of the circuitry within sub-block 1814 is to produce one of the four 3-bit increment values that are placed on increment data bus 1112. The ROM value "001" is coupled to the "1" input of multiplexer 1818 so that, by storing a "1" in storage element 1802, the increment value can be forced to "001." Otherwise, the increment value will be determined by the state of overall match generator output bits 0, 1 and 2, as shown. These overall match generator output bits are gated by AND gates 1820–1824. In this manner, they may be enabled or disabled by setting the value in storage element 1800 as desired. STORE_MATCH is also provided to AND gates 1820–1824 to enable the programmer to focus exclusively on store-type instructions. If this is not desired, then STORE_MATCH may be forced to a "1" in a manner to be explained below in relation to FIG. 32.

As can be seen in FIG. 18, the programmer is free to generate CMP[0] by using various combinations of the following: overall match generator results, load match information from data cache interface comparators 324, validated instruction match information from validate logic 320, unvalidated instruction match information from fetch unit comparators 316, and user-selected signals taken from a variety of possible locations within microprocessor 100 by off-chip data interface 310. These combination possibilities are provided by AND gates 1834, 1836, 1828, 1830 and 1832; OR gates 1831, 1833 and 1835; and the enable bits stored in storage elements 1800–1812.

Figure 19:
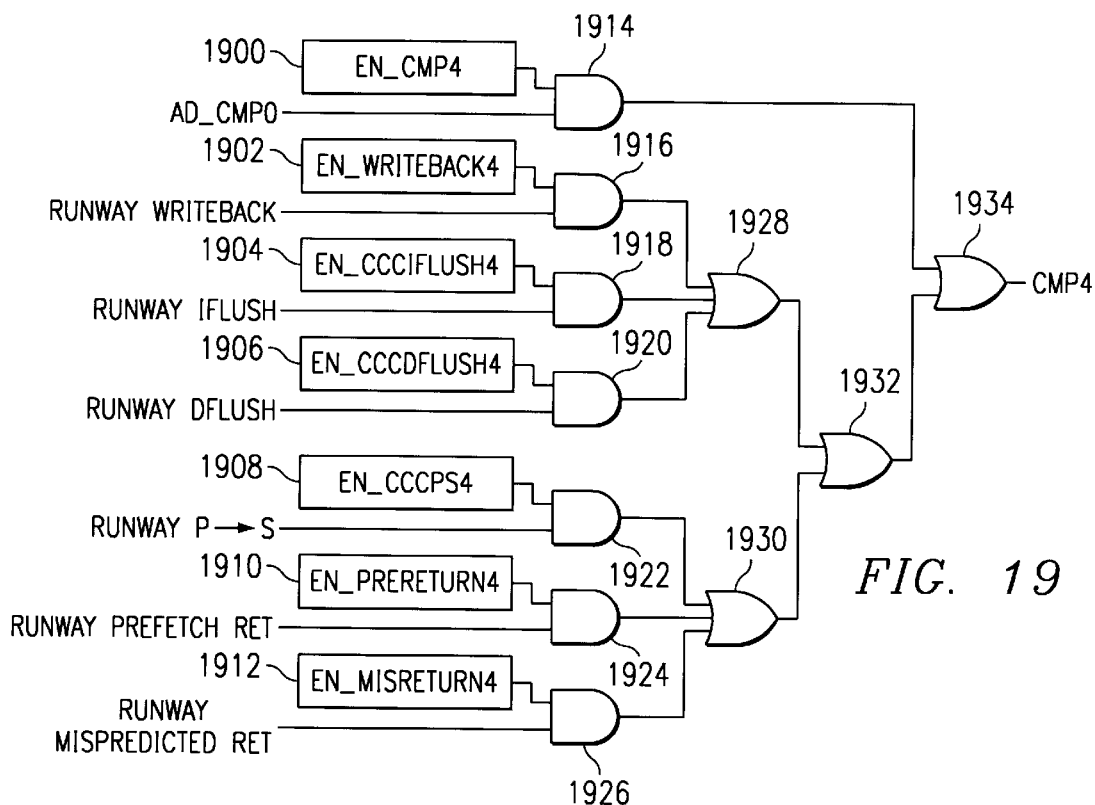
FIG. 19 is a block diagram illustrating the CMP4 generation logic of FIG. 17.
Figure 20:
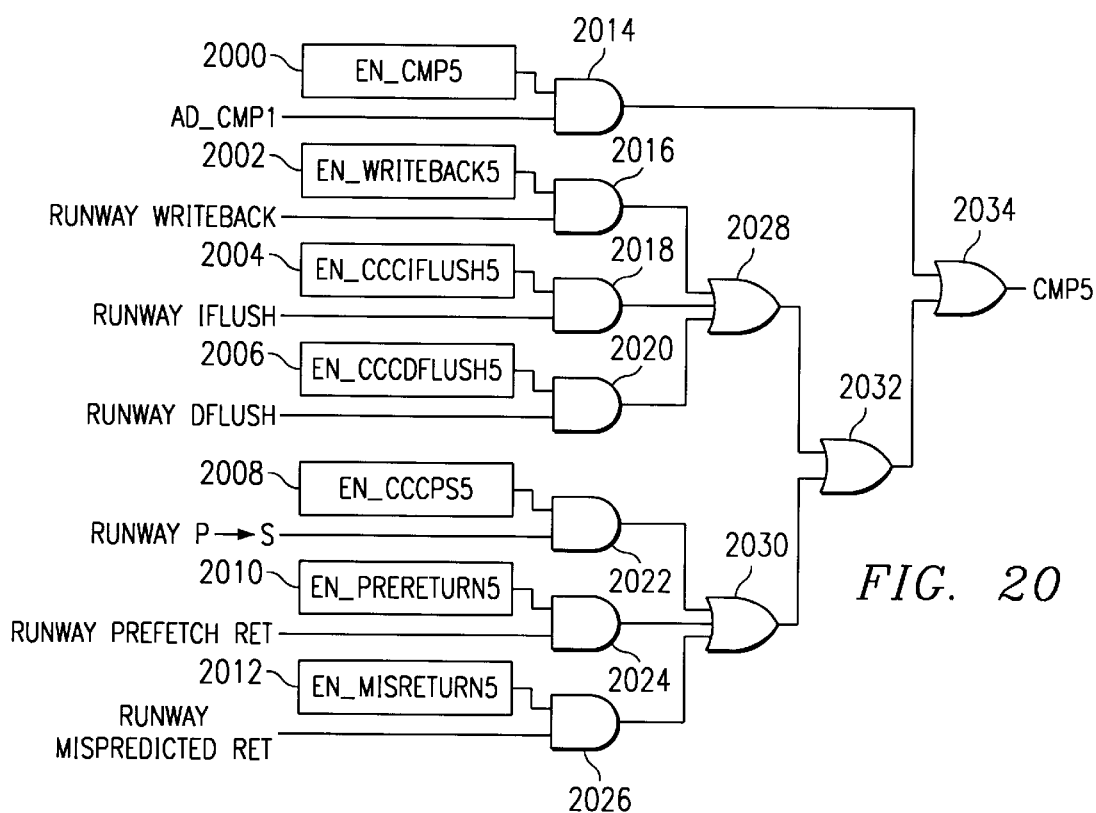
FIG. 20 is a block diagram illustrating the CMP5 generation logic of FIG. 17.

FIGS. 19 and 20 illustrate the generation logic for CMP 4 and 5, respectively. It is contemplated that storage elements 1900–1912 and 2000–2012 would be included within state machine/counters control register circuitry 346. Thus, storage elements 1900–1912 and 2000–2012 would be loaded with data by writing to state machine/counters control register circuitry 346 using the method and apparatus described above in section 2.2. Once again, the purpose of this circuitry is to enable the programmer to select which information will be used as an input to programmable state machine 302. As can be seen in FIGS. 19 and 20, the programmer may use AND gates 1914–1926 (2014–2026), OR gates 1928–1934 (2028–2034) and storage elements 1900–1912 (2000–2012) to construct an OR term using any or all of the following signals: System Bus Writeback, System Bus I-Flusb, System Bus D-Flush, System Bus Private-to-Shared, System Bus Interface Prefetch Buffer Hit, System Bus Interface Misprediction Buffer Hit, and the outputs from system bus address/data comparators 312. (The meaning of the six system bus performance signals just mentioned will be discussed below in connection with FIGS. 22–25.) The generation options for CMP5 are identical to those for CMP 4 except that, in the case of CMP5, the output of system bus address/data comparator 1 is used instead of the output of system bus address/data comparator 0. (System bus address/data comparators 0 and I are discussed in the next section.)

Figure 21:
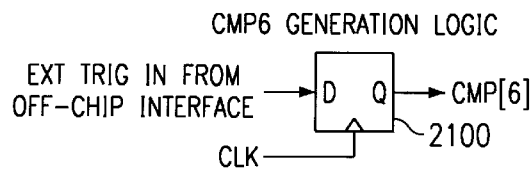
FIG. 21 is a block diagram illustrating the CMP6 generation logic of FIG. 17.

FIG. 21 illustrates the generation logic for CMP6. Latch 2100 is provided to store the state of the EXT_TRIG_IN signal. CMP6 tracks the state of the output of latch 2100.

2.4 System bus interface components

System bus interface comparators 312 and performance signal generation logic 314 will now be discussed with reference to FIGS. 22–25.

Figure 22:
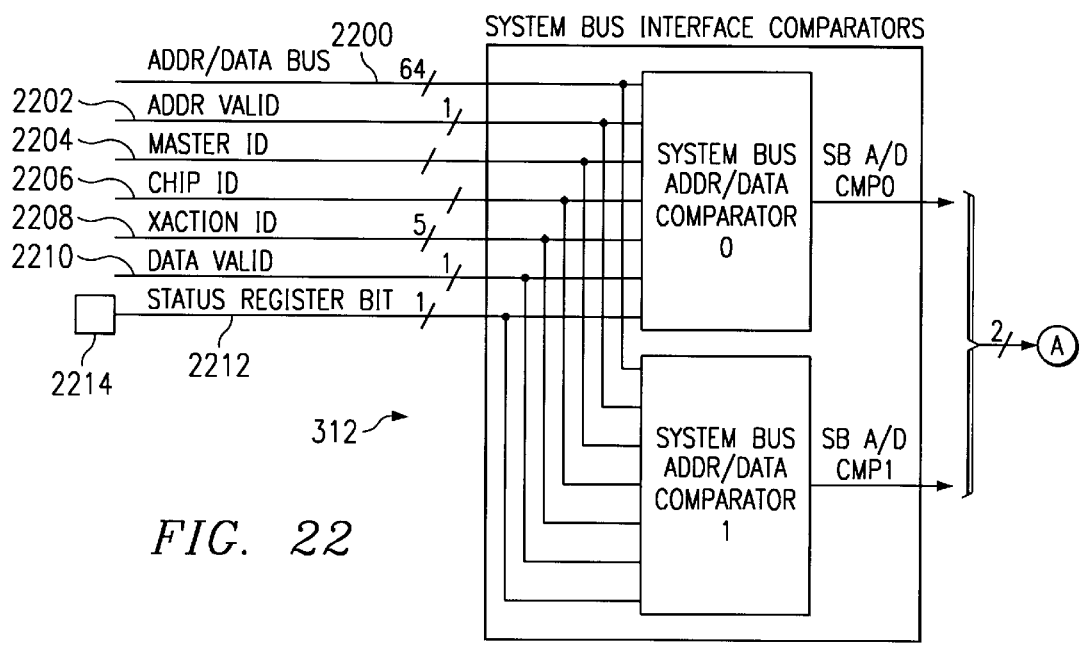
FIG. 22 is a block diagram illustrating the system bus interface comparator shown in FIG. 3.

As shown in FIG. 22, system bus interface comparators block 312 includes system bus address/data comparators 0 and 1. Each of system bus address/data comparators 0 and 1 is coupled to the 64-bit system address/data bus 2200, an address valid bit 2202, a master ID bus 2204, a chip ID bus 2206, a transaction ID bus 2208, a data valid bit 2210 and a status register bit 2212 stored in storage element 2214. The outputs of the two system bus address/data comparators are labeled SBA/DCMP 0 and 1, and are coupled to programmable state machine 302 at A.

As was discussed above, system bus 106 operates according to the protocol of the well-known PA-7200 microprocessor manufactured and sold by Hewlett Packard Company. Consequently, address and data pertinent to a given bus transaction may be presented on address/data bus 2200 in non-contiguous bus cycles. Thus, a transaction ID is associated with each bus transaction and is presented on transaction ID bus 2208 in conjunction with each presentation of address or data so that the components interfaced to the bus can determine to which transaction the address or data belongs. In addition, a master ID is presented on master ID bus 2204 to indicate which microprocessor or other chip in the computer system is initiating the bus transaction. A chip ID for microprocessor 100 is stored in a storage element and is communicated to system bus interface 108 via chip ID bus 2206. System bus interface 108 uses the chip ID to determine, based on a comparison between the chip ID and the information present on master ID bus 2204, whether the information then-present on the bus is intended for microprocessor 100.

Figure 23:
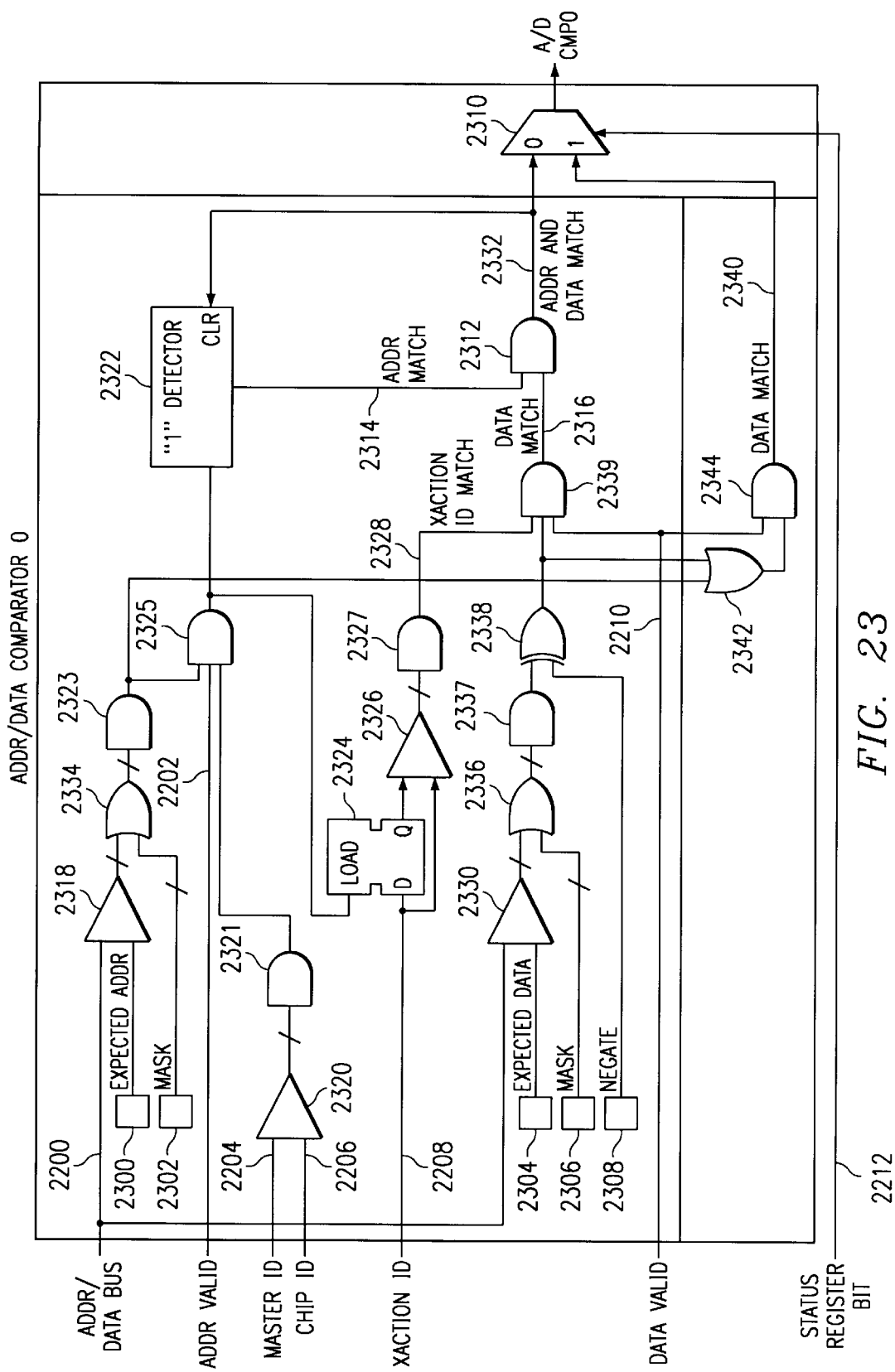
FIG. 23 is a block diagram illustrating addr/data comparator 0 shown in FIG. 22.

FIG. 23 illustrates system bus address/data comparator 0 in detail. It is contemplated that storage elements 2300–2308, as well as storage element 2214, would be included within system bus interface comparators control register circuitry 348. Thus, storage elements 2300–2308, as well as storage element 2214, would be loaded with data by writing to system bus interface comparators control register circuitry 348 using the method and apparatus described above in section 2.2.

System bus address/data comparator 0 is operable in two different modes, depending on the state of status register bit 2212. (Status bit 2212 determines the mode by selecting which signal will be presented on the output of multiplexer 2310.) When status register bit 2212 is "0," system bus address/data comparator 0 operates in a "normal" mode. When status register bit 2212 is "1," system bus address/data comparator 0 operates in an "alternate" mode.

In the normal mode, the output of address/data comparator 0 indicates whether a match has occurred on both the expected address stored in storage element 2300 and the expected data stored in storage element 2304. To accomplish this, the output of AND gate 2312 is presented on the output of multiplexer 2310. The inputs of AND gate 2312 are ADDR MATCH 2314 and DATA MATCH 2316. ADDR MATCH 2314 is asserted when AND gate 2325 is asserted. AND gate 2325 is asserted when: (1) the information present on addr/data bus 2200 matches the expected address information stored in storage element 2300, as indicated by the output of comparator 2318 (which output is bit-wise masked by OR gate 2334, the results of which are ANDed by multiple-input AND gate (2323); (2) address valid bit 2202 is asserted, indicating that the information present on addr/data bus 2200 is in fact a valid address; and (3) comparator 2320 (the bit-wise outputs of which are ANDed by multiple-input AND gate 2321) indicates that there is a match between master ID 2204 and chip ID 2206. When all three of these conditions occur, the match is stored by conventional "1 detector" 2322 for later use by AND gate 2312 in determining the overall addr/data match. Also, because the data corresponding to the address of interest may not be presented on addr/data bus 2200 on the next bus cycle, the transaction ID is stored in latch 2324 for later use by comparator 2326.

Once the transaction ID is stored in latch 2324, a recurrence of the same transaction ID on transaction ID bus 2208 (which presumably will occur when the awaited data is presented on address/data bus 2200) will cause XACTION ID MATCH 2328 to be asserted by virtue of the fact that the bit-wise outputs of comparator. DATA MATCH 2316 is asserted when AND gate 2339 is asserted. AND gate 2339 is asserted when: (1) XACTION ID MATCH 2328 is asserted; (2) comparator 2330 indicates that the information present on addr/data bus 2200 matches the expected data stored in storage element 2304; and (3) data valid bit 2210 is asserted, indicating that the information present on addr/data bus 2200 is in fact valid data. The operations of multiple-input AND gate 2337, bit-wise OR gate 2336 and comparator 2330 are analogous to those of AND gate 2323, OR gate 2334 and comparator 2318, discussed above.

Once both ADDR MATCH 2314 and DATA MATCH 2316 are asserted, the overall ADDR/DATA MATCH signal 2332 is asserted. When this occurs, "1 detector" 2322 is cleared. Additional flexibility is provided by OR gates 2334 and 2336, which allow the programmer to mask certain of the bits from the comparisons made by comparators 2318 and 2330, respectively. Also, exclusive OR gate 2338 is provided, allowing the programmer optionally to negate the output of OR gate 2336.

In the alternate mode, expected data is stored not only in storage element 2304, but also in storage element 2300, and the output of system bus address/data comparator 0 is indicative of data matches only. Moreover, in the alternate mode, no consideration is given to the transaction ID. (In this mode, multiplexer 2310 presents only the DATA MATCH 2340 signal on the output of system bus address/data comparator 0.) The output of AND gate 2323 is coupled to one input of OR gate 2342. The output of exclusive OR gate 2338 is coupled to the other input of OR gate 2342. One input of AND gate 2344 is provided by the output of OR gate 2342. The other input of AND gate 2344 is provided by DATA VALID signal 2210. The output of AND gate 2344 is the DATA MATCH signal 2340.

Figure 24:
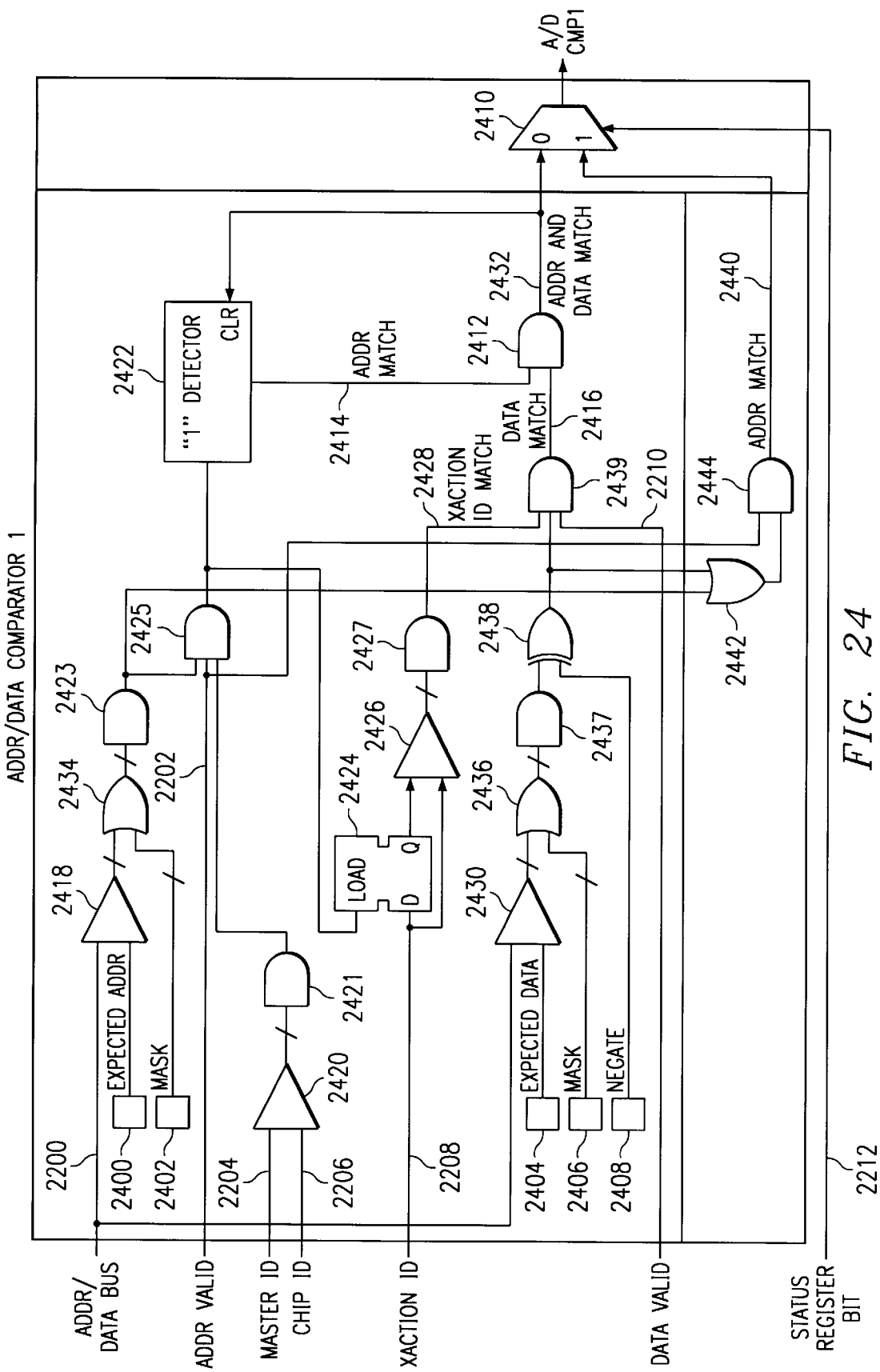
FIG. 24 is a block diagram illustrating addr/data comparator 1 shown in FIG. 22.

FIG. 24 illustrates system bus address/data comparator 1 in detail. As is apparent from the drawing, system bus address/comparator 1 is constructed and operates exactly like system bus address/data comparator 0, except for the following: In the alternate mode, address/data comparator I is used for address comparisons only (as opposed to data comparisons only). Thus, in the alternate mode for system bus address/data comparator 1, expected address is stored not only in storage element 2400, but also in storage element 2404. Again, in the alternate mode, transaction ID information is disregarded, and address matches are reported on ADDR MATCH signal 2440 whenever they have occurred in both comparators 2418 and 2430.

Figure 25:
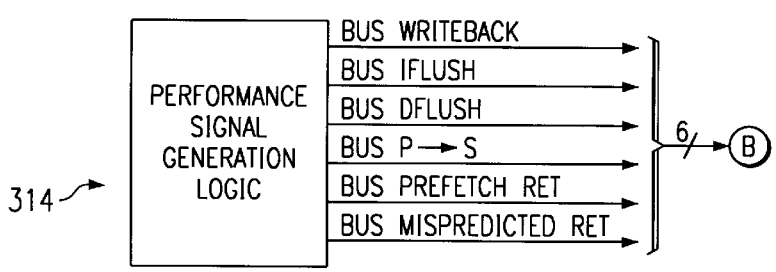
FIG. 25 is a block diagram illustrating the performance signal generation logic shown in FIG. 3.

FIG. 25 illustrates in detail the signals that are generated by performance signal generation logic 314. It is contemplated that the generation of the signals shown in FIG. 25 may be accomplished by conventional means, and that numerous alternative methods for doing so will be apparent to those having ordinary skill in the art based on the following signal descriptions:

BUS WRITEBACK: This signal is asserted when a "dirty" cache line is being written back to main memory 208.

BUS I-FLUSH: This signal is asserted when a line from instruction cache 102 has just been flushed in response to a command received over system bus 106 from another component in the computer system. This activity is commonly done in connection with maintaining cache coherency with main memory 208.

BUS D-FLUSH: This signal is asserted when a line from data cache 104 has just been flushed in response to a command received over system bus 106 from another component in the computer system. This activity is commonly done in connection with maintaining cache coherency with main memory 208.

BUS P>S: This signal is asserted when a previously-private cache line is changed to shared (or is flushed, if dirty, to main memory).

BUS PREFETCH BUFFER HIT: System bus interface 108 is equipped with a buffer for instructions that have been prefetched from main memory 208 but not yet requested by fetch unit 110. Once fetch unit 110 does request such a prefetched instruction, a hit occurs on the prefetch buffer, and the BUS PREFETCH BUFFER HIT signal is asserted at this time.

BUS MISPREDICTED BUFFER HIT: System bus interface 108 is also equipped with a buffer for instructions that have been fetched speculatively, but turn out to have been mispredicted. In the event fetch unit 110 eventually requests such an instruction while it is still in the mispredicted instruction buffer, a hit occurs on the buffer. When this happens, BUS MISPREDICTED BUFFER HIT is asserted.

All six of the signals generated by performance signal generation logic 314 are coupled to programmable state machine 302 at B.

2.5 Fetch unit components

Figure 26:
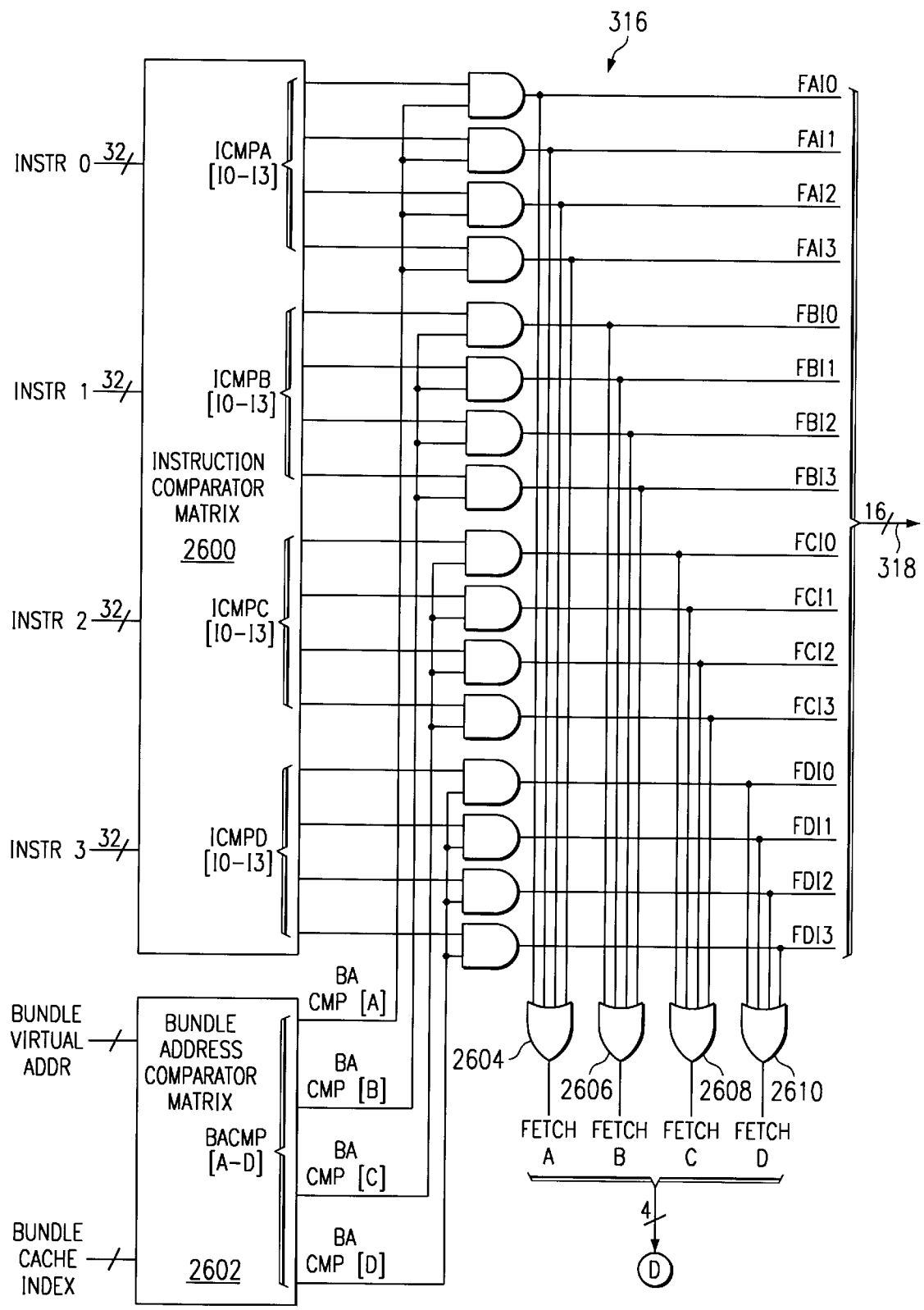
FIG. 26 is a block diagram illustrating the fetch unit comparators of FIG. 3.

Fetch unit comparators 316 will now be discussed with reference to FIGS. 26–30. FIG. 26 illustrates the content of fetch unit comparator block 316. As each bundle of four instructions I0–I3 is fetched by fetch unit 110, the instructions are provided to instruction comparator matrix 2600. Simultaneously, the cache index and certain bits of the virtual address for the bundle of four instructions are provided to address comparator matrix 2602. As will be discussed in more detail below, instruction comparator matrix 2600 contains four instruction comparators called instruction comparators A–D. Each of instruction comparators A–D provides one result for each of the four instructions in the bundle (four results total). Thus, instruction comparator matrix 2600 provides sixteen total results for each bundle of instructions. For convenience, the results for instruction comparator A are called ICMPA[I0], ICMPA[I1], ICMPA[I2], and ICMPA[I3]. The four complete sets of results from instruction comparator matrix 2600 are labeled as follows in FIG. 26: ICMPA[I0–I3], ICMPB[I0–I3], ICMPC[I0–I3] and ICMPD[I0–I3].

Address comparator matrix 2602 contains four bundle address comparators A–D. Because there is only one address associated with each bundle of four instructions, bundle address comparator matrix 2602 provides only one set of results for each bundle of instructions. In the drawing, these results are labeled BACMP[A–D].

As is shown, the result from BACMP[A] is ANDed with all four of the results from ICMPA. Likewise, the result from BACMP[B] is ANDed with all four of the results from ICMPB; the result from BACMP[C] is ANDed with all four of the results from ICMPC; and the result from BACMP[D] is ANDed with all four of the results from ICMPD. The sixteen results from these AND operations are provided to validate logic 320 via bus 318. In addition, each group of four AND results is ORed together by OR gates 2604–2610. The resulting four bits, labeled FETCHA–D in the drawing, are provided to programmable state machine 302 at D.

Figure 27:
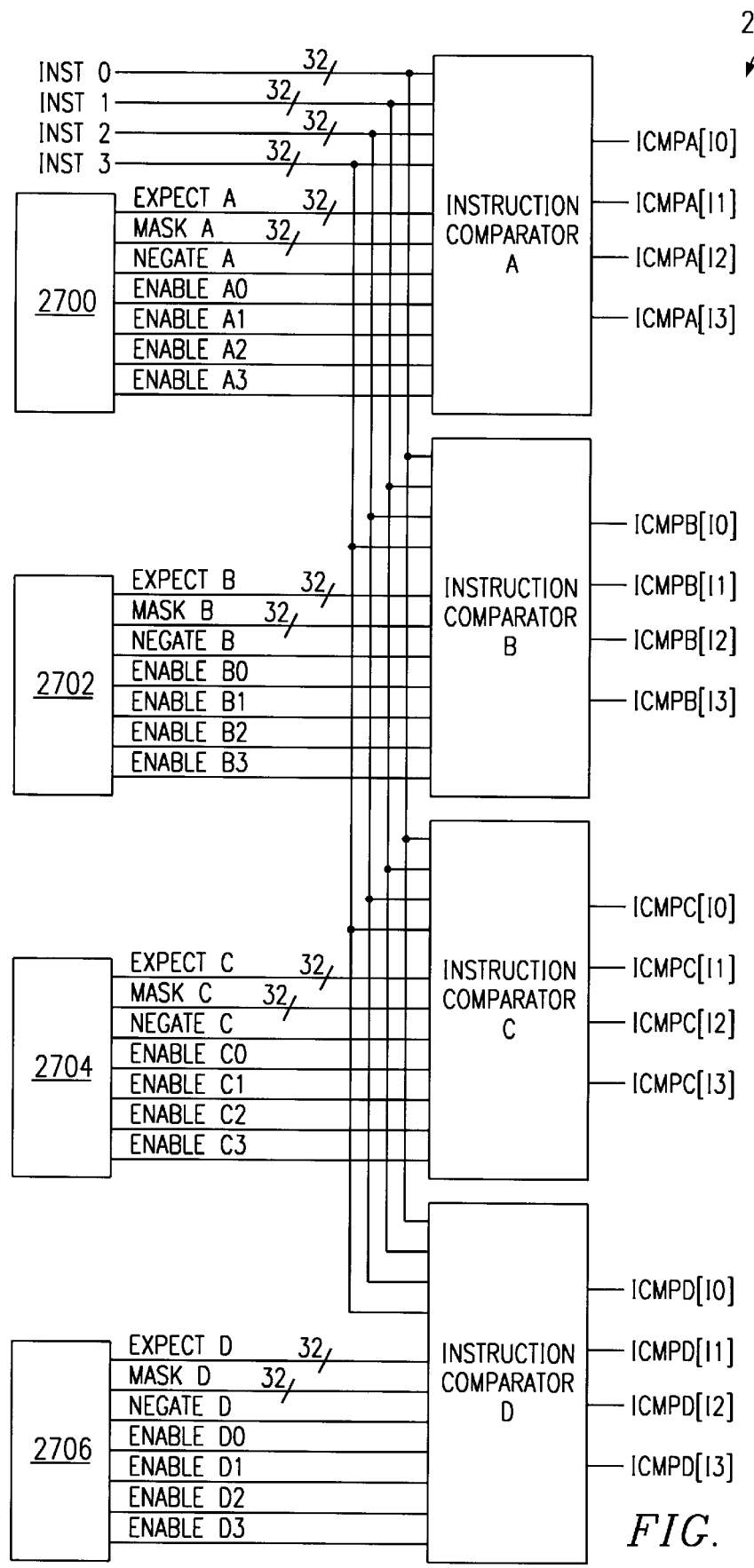
FIG. 27 is a block diagram illustrating the instruction comparator matrix of FIG. 26.

FIG. 27 illustrates instruction comparator matrix 2600 in detail. It is contemplated that storage elements 2700–2706 would be included within fetch comparators control register circuitry 344. Thus, storage elements 2700–2706 would be loaded with data by writing to fetch comparators control register circuitry 344 using the method and apparatus described above in section 2.2. As is shown, instructions I0–I3 are provided to each of instruction comparators A–D. But each of instruction comparators A–D compares instructions I0–I3 with different expected instructions A–D stored in storage elements 2700–2706, respectively. For additional flexibility, each instruction comparator is also provided with a separate set of mask, negate and enable bits, as shown.

Figure 28:
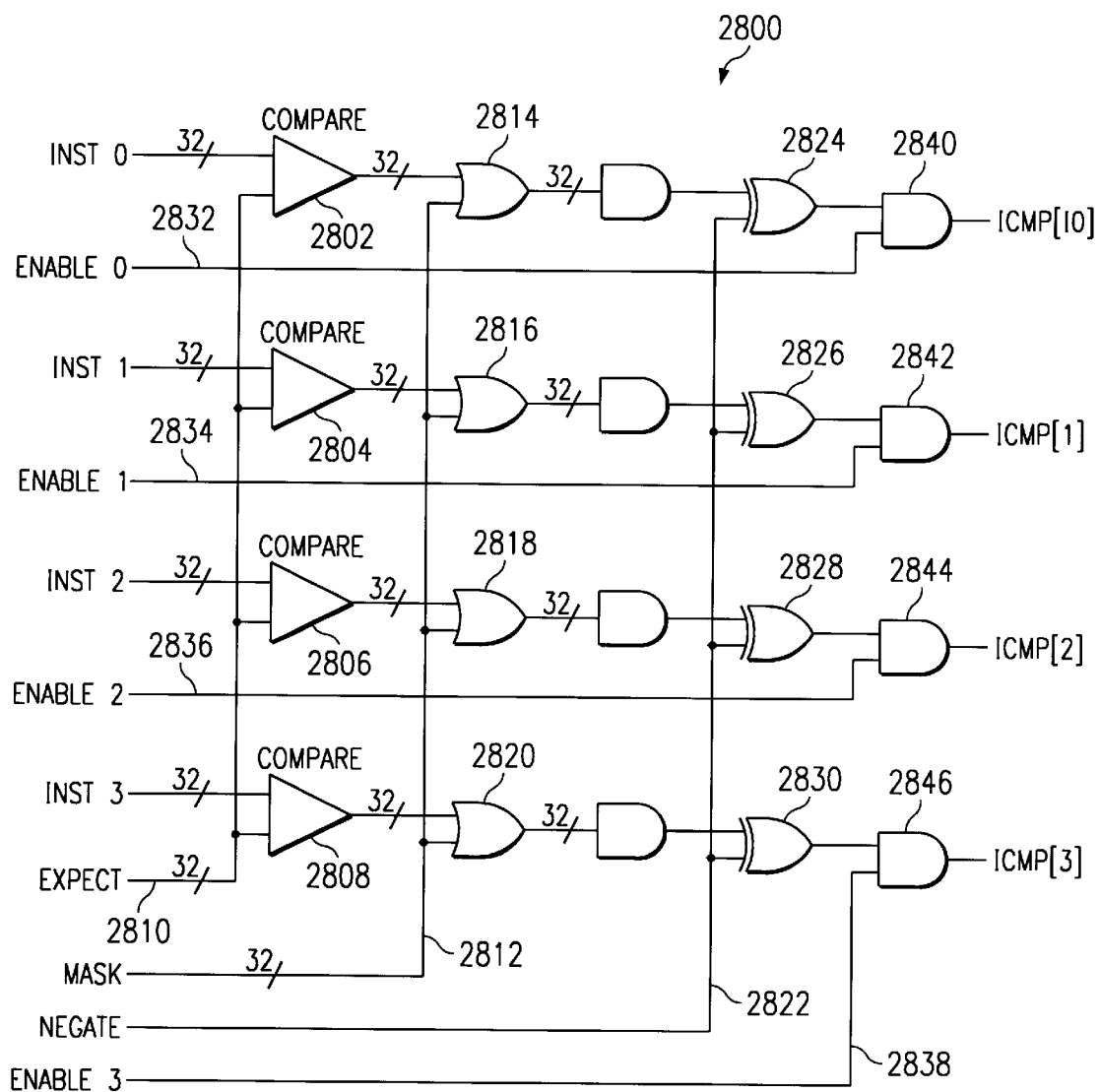
FIG. 28 is a block diagram illustrating a representative one of the instruction comparators of FIG. 27.

FIG. 28 illustrates in detail a representative one of instruction comparators A–D. Instruction comparator 2800 contains four 32-bit comparators 2802–2808. One 32-bit input of each comparator 2802–2808 is coupled to 32-bit EXPECTed instruction 2810. The other input of each comparator 2802–2808 is coupled to a different one of the four instructions I0–3. A thirty-two bit MASK 2812 is provided to each of OR gates 2814–2820, allowing the programmer the option of bit-wise masking certain of the bits from each instruction comparison result. A NEGATE bit 2822 is provided to exclusive OR gates 2824–2830, allowing the programmer the option of negating each of the instruction comparison results. Finally, a set of ENABLE bits 2832–2838 is provided to AND gates 2840–2846, allowing the programmer the option of individually enabling or disabling each of the instruction comparison results.

Figure 29:
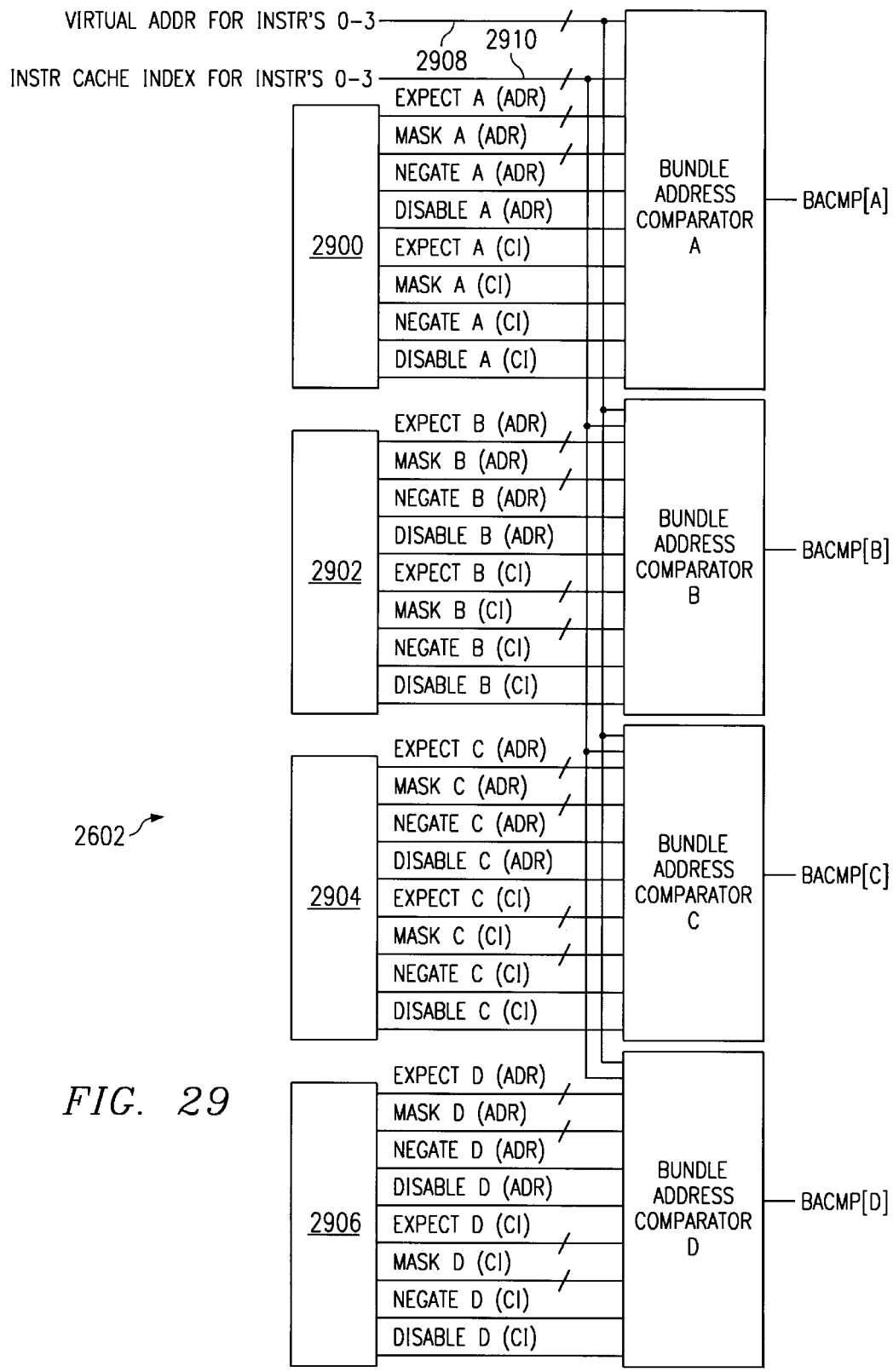
FIG. 29 is a block diagram illustrating the address comparator matrix of FIG. 26.

FIG. 29 illustrates address comparator matrix 2602 in detail. It is contemplated that storage elements 2900–2906 would be included within fetch comparators control register circuitry 344. Thus, storage elements 2900–2906 would be loaded with data by writing to fetch comparators control register circuitry 344 using the method and apparatus described above in section 2.2. As mentioned above, bundle address comparator matrix 2602 contains four bundle address comparators A–D. Each of bundle address comparators A–D is coupled to selected bits 2908 of the virtual address for the bundle of instructions I0–I3. Each of bundle address comparators A–D is also coupled to the cache index 2910 for the bundle of instructions I0–I3. But each of bundle address comparators A–D compares the virtual address bits 2908 and the cache index 2910 with different expected addresses A–D stored in storage elements 2900–2906, respectively. For additional flexibility, each address comparator is also provided with a separate set of mask, negate and enable bits, as shown.

Figure 30:
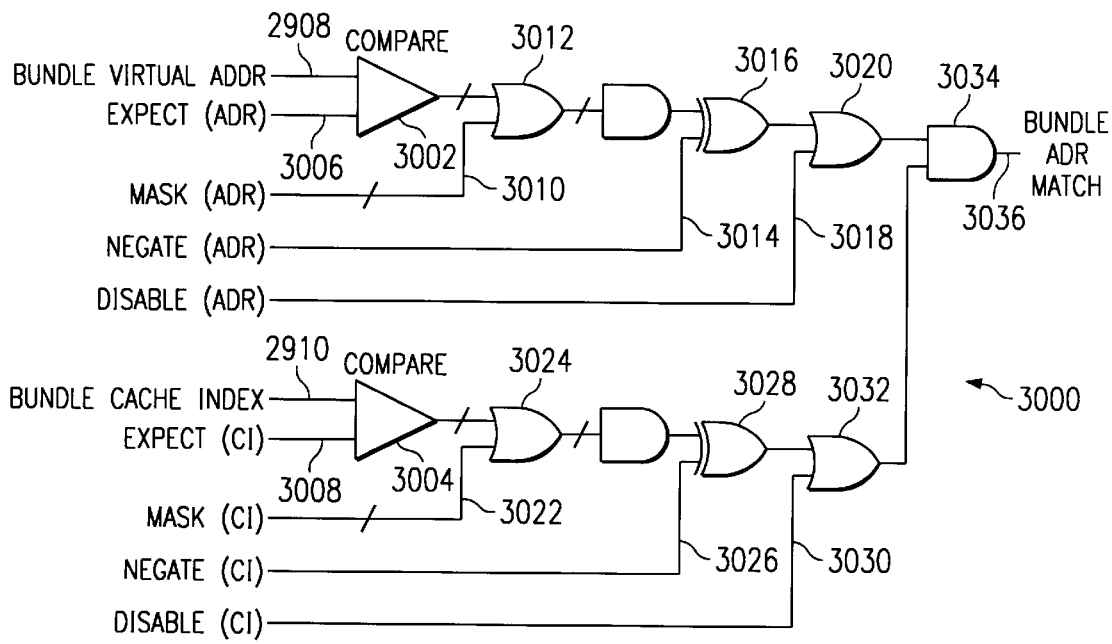
FIG. 30 is a block diagram illustrating a representative one of the address comparators of FIG. 29.

FIG. 30 illustrates in detail a representative one of bundle address comparators A–D. Bundle address comparator 3000 contains comparators 3002 and 3004. Comparator 3002 is used to compare bundle virtual address bits 2908 with EXPECTed bundle virtual address bits 3006. Comparator 3004 is used to compare bundle cache index 2910 with EXPECTed bundle cache index 3008. A MASK 3010 is provided to OR gate 3012, allowing the programmer the option of masking certain of the bits from the bundle virtual address comparison. A NEGATE bit 3014 is provided to exclusive OR gate 3016, allowing the programmer the option of negating the result of the bundle virtual address comparison. And a DISABLE bit 3018 is provided to OR gate 3020, allowing the programmer the option of enabling or disabling the result of the bundle virtual address comparison. Similarly, a MASK 3022 is provided to OR gate 3024, allowing the programmer the option of masking certain of the bits from the bundle cache index comparison. A NEGATE bit 3026 is provided to exclusive OR gate 3028, allowing the programmer the option of negating the result of the bundle cache index comparison. And a DISABLE bit 3030 is provided to OR gate 3032, allowing the programmer the option of enabling or disabling the result of the bundle cache index comparison. Finally, the results of the bundle virtual address comparison and the bundle cache index comparison are ANDed by AND gate 3034, yielding a BUNDLE ADDR MATCH signal 3036. This latter signal corresponds to the BACMP signals shown in FIG. 29.

2.6 Data cache interface components

Figure 31:
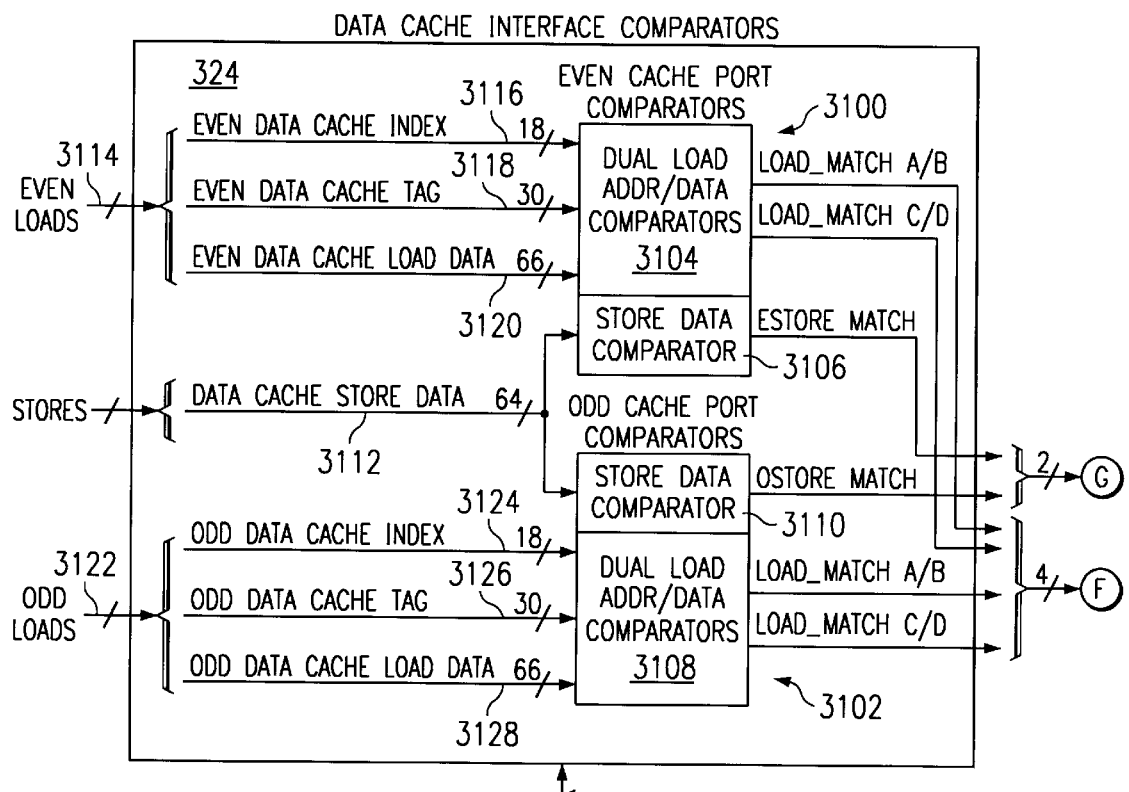
FIG. 31 is a block diagram illustrating the data cache interface comparators of FIG. 3.

Data cache interface comparators 324 will now be discussed with reference to FIGS. 31–34. FIG. 31 illustrates the content of data cache interface comparators 324 in detail. As is shown, data cache interface comparators block 324 contains even cache port comparators 3100 and odd cache port comparators 3102. Even cache port comparators block 3100 contains dual load address/data comparators 3104 and store data comparator 3106. Odd cache port comparators block 3102 contains dual load address/data comparators 3108 and store data comparator 3110. Sixty-four bit data cache store data bus 3112 is provided to both store data comparators 3106 and 3110. (Microprocessor 100 is designed to be capable of executing two load operations simultaneously— one odd and one even. Store operations, on the other hand, may only be executed one at a time.)

Even loads bus 3114 includes even data cache index bus 3116, even data cache tag bus 3 118 and even data cache load data bus 3120. All three of these busses are provided to dual load address/data comparators 3104. Odd loads bus 3122 includes odd data cache index bus 3124, odd data cache tag bus 3126 and odd data cache load data bus 3 128. All three of these buses are provided to dual load address/data comparators 3108.

Dual load address/data comparators 3104 provide two output signals, ELOADMATCH0 and ELOADMATCH1. Dual load address/data comparators 3108 provide two output signals, OLOADMATCH0 and OLOADMATCH1. These four bits are provided to programmable state machine 302 at F. In addition, these four bits are also stored in address reorder buffer 330, as will be discussed in more detail below in relation to FIG. 36. Store data comparator 3106 provides one output signal, ESTOREMATCH. Store data comparator 3110 provides one output signal, OSTOREMATCH. These two bits are provided to programmable state machine 302 at G.

Figure 32:
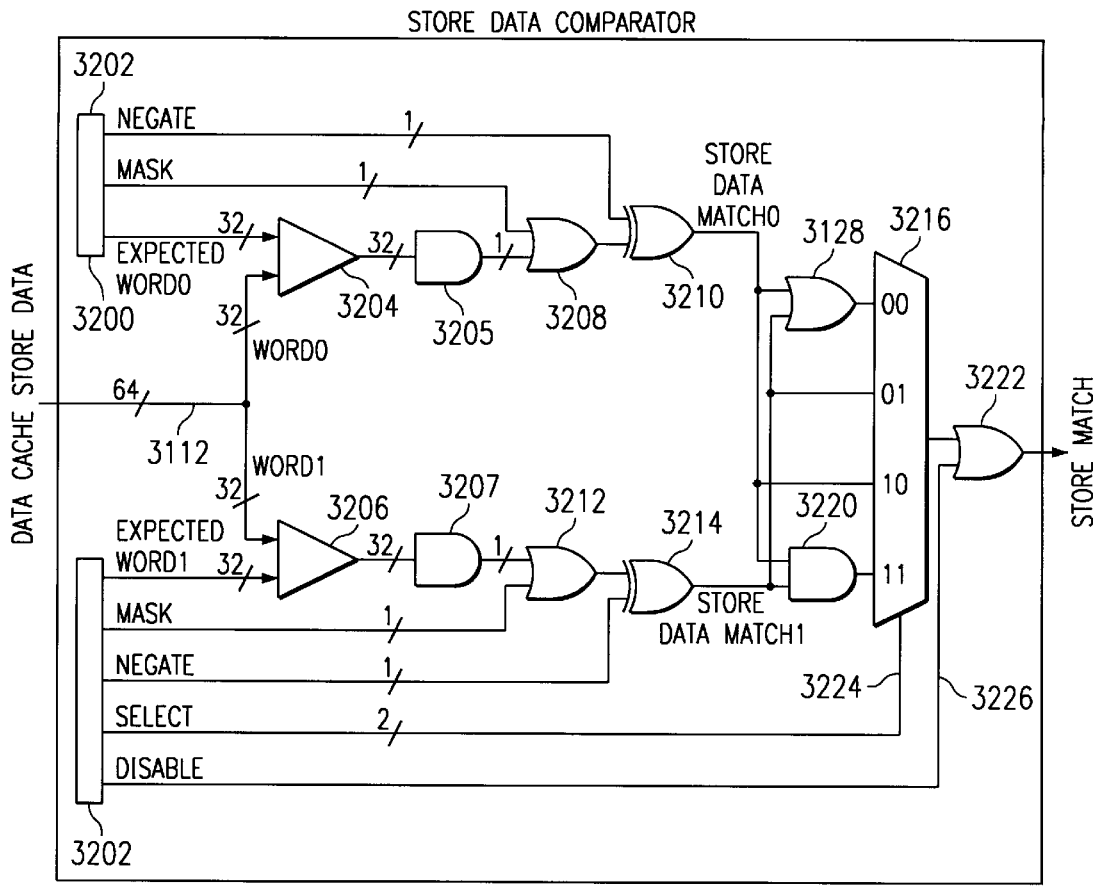
FIG. 32 is a block diagram illustrating a representative one of the store comparators of FIG. 31.

FIG. 32 illustrates in detail a representative one of store data comparators 3106 and 3110. It is contemplated that storage elements 3200 and 3202 would be included within data cache interface comparators control register circuitry 352. Thus, storage elements 3200 and 3202 would be loaded with data by writing to data cache interface comparators control register circuitry 352 using the method and apparatus described above in section 2.2. Each 32-bit word of 64-bit data bus 3112 is sent to a different one of comparators 3204 and 3206. Comparator 3204 compares word 0 with EXPECTed word 0, and comparator 3206 compares word 1 with EXPECTed word 1. The results of the bit-wise comparison for word 0 are ANDed by multiple-input AND gate 3205, the output of which may be masked by OR gate 3208 and negated by exclusive OR gate 3210, at the option of the programmer. The results of the bit-wise comparison for word 1 are ANDed by multiple-input AND gate 3207, the output of which may be masked by OR gate 3212 and negated by exclusive OR gate 3214, at the option of the programmer.

Additional flexibility is provided by multiplexer 3216, OR gate 3218, AND gate 3220 and OR gate 3222. SELECT bits 3224 may be set by the programmer so that STOREMATCH (the output of the store data comparator) reflects any one of the following: (0) the logical OR of store data match 0 and store data match 1; (1) just store data match 1; (2) just store data match 0; or (3) the logical AND of store data match 0 and store data match 1. Moreover, by setting DISABLE bit 3226 appropriately, the programmer may choose to override all of the previously mentioned results, effectively "forcing" a match.

Figure 33:
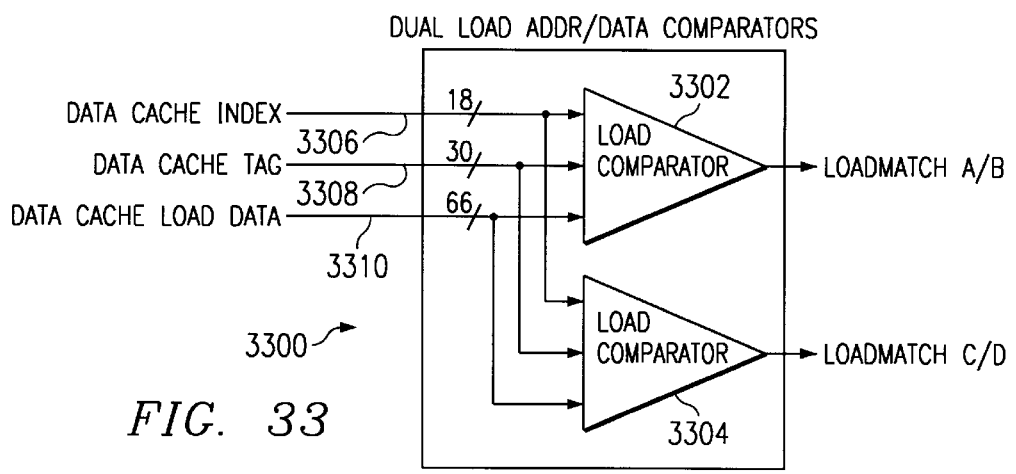
FIG. 33 is a block diagram illustrating a representative one of the dual load addr/data comparators of FIG. 31.

FIG. 33 illustrates in detail a representative one of dual load address/data comparators 3104 and 3108. As is shown, dual load address/data comparator 3300 contains load comparators 3302 and 3304. Each is coupled to data cache index bus 3306, data cache tag bus 3308 and data cache load data bus 3310. The outputs of load comparators 3302 and 3304 are LOADMATCH0 and LOADMATCH1, respectively.

Figure 34:
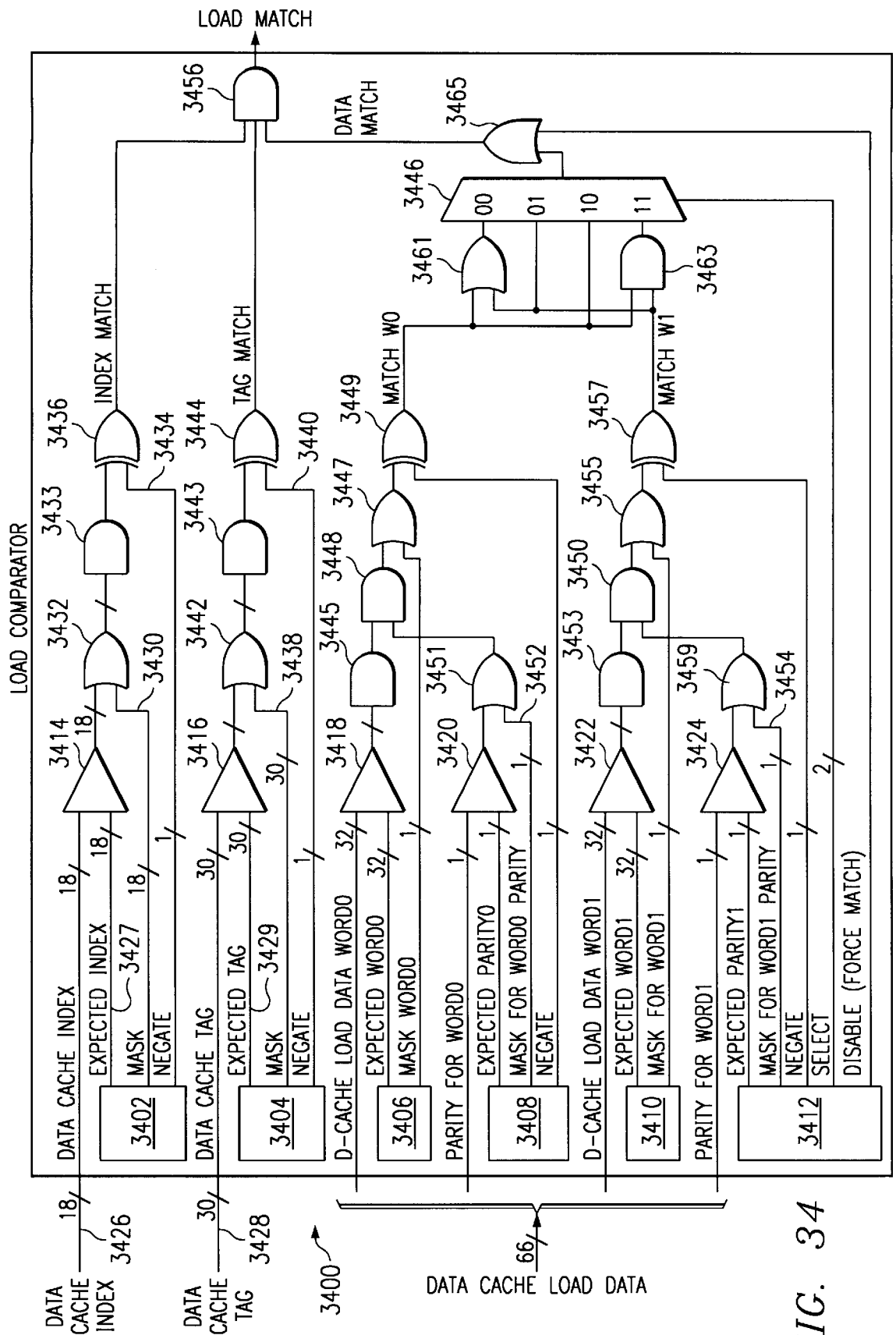
FIG. 34 is a block diagram illustrating a representative one of the load comparators of FIG. 33.

FIG. 34 illustrates in detail a representative one of load comparators 3302 and 3304. It is contemplated that storage elements 3402–3412 would be included within data cache interface comparators control register circuitry 352. Thus, storage elements 3402–3412 would be loaded with data by writing to data cache interface comparators control register circuitry 352 using the method and apparatus described above in section 2.2. Comparator 3414 compares data cache index 3426 with EXPECTed data cache index 3427. Comparator 3416 compares data cache tag 3428 with EXPECTed data cache tag 3429. For additional flexibility, MASK bits 3430 are provided to OR gate 3432, allowing the programmer to mask individual bits from the data cache index comparison results. The bit-wise outputs of OR gate 3432 are ANDed by AND gate 3433, and the result is provided to one input of exclusive OR gate 3436. NEGATE bit 3434 is provided to the other input of exclusive OR gate 3436, allowing the programmer to negate the data cache index comparison result. In respect of the data cache tag comparison results, the same flexibility is provided to the programmer by MASK bits 3438, OR gate 3442, and gate 3443, NEGATE bit 3440 and exclusive OR gate 3444.

Comparators 3418 and 3422 and multiplexer 3446 are used to produce DATA MATCH in exactly the same manner as comparators 3204 and 3206 and multiplexer 3216 are used to produce STOREMATCH, with one exception: Comparators 3420 and 3424 are added to consider whether there is also a match between the parity bits for cache load data words 0 and 1 and the corresponding EXPECTed parity bits. The results of the parity comparisons are merged with the data comparisons by AND gates 3448 and 3450. MASK bits 3452 and 3454 are provided for parity word 0 and 1 comparisons, respectively, providing the programmer with additional flexibility. The optional masking functionality is provided by OR gates 3447, 3451, 3455 and 3459. The optional negating functionality is provided by exclusive OR gates 3449 and 3457. Multiple-input AND gates 3445 and 3453 are provided to AND the bit-wise results of comparators 3418 and 3422, respectively. OR gate 3461 and AND gate 3463 are configured to provide several logical permutations of the MATCH W0 and MATCH W1 signals at the inputs to multiplexer 3446, as shown. The output of multiplexer 3446 may be overridden via the DISABLE signal applied to OR gate 3465. Ultimately, INDEXMATCH, TAGMATCH and DATAMATCH are ANDed together by AND gate 3456 to produce LOADMATCH.

2.7 Sort unit components

Figure 35:
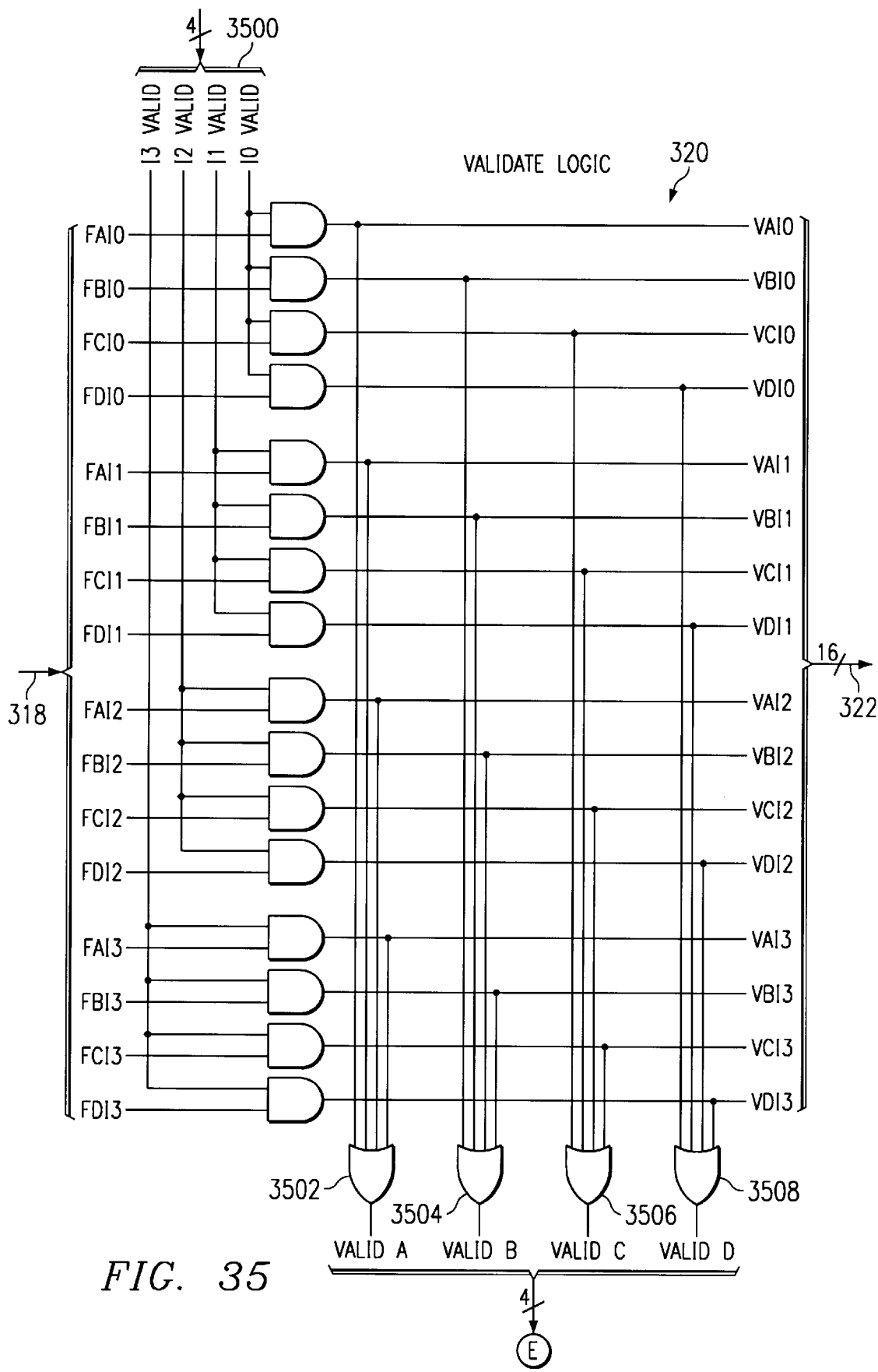
FIG. 35 is a block diagram illustrating the validate logic of FIG. 3.

FIG. 35 illustrates validate logic 320 in detail. As was discussed above, one of the functions of sort unit 112 is to determine which of the four instructions in a fetched bundle were actually requested and are therefore "valid," versus which of them were not requested and are therefore "invalid." It is contemplated that four bits (one "valid/invalid" bit for each instruction) will be produced by conventional means within sort unit 112 in order to convey this information to validate logic 320. In FIG. 35, these bits are labeled I0VALID, I1VALID, I2VALID and I3VALID. Bus 318 carries sixteen result bits from fetch unit comparators 3 16 over to validate logic 320. The VALID bits are ANDed with the corresponding fetch unit comparator results, as shown, resulting in the validate logic results. For example, all of the fetch unit comparator results for instruction 0 (FAI0, FBI0, FCI0 and FDI0) are ANDed with the I0VALID bit. The resulting four bits are called VAI0, VBI0, VCI0 and VDI0. Sixteen bits result from this ANDing operation. They are provided via bus 322 to instruction queue 114 for storage along with the instructions to which they correspond. In addition, the validated results for each fetch unit comparator A–D are ORed together, instruction by instruction, by OR gates 3502–3508. The outputs of these OR gates are provided to programmable state machine 302 at E.

2.8 Retire unit components

A maximum of four instructions may retire from instruction queue 114 during any given clock cycle—two from ALU queue 138 and two from memory queue 140. For the remainder of this discussion, these retiring instructions will be referred to as ALU instructions 0 and 1, and MEM instructions 0 and 1 (hereinafter denoted ALU[0], ALU[1], MEM[0] and MEM[1]). The reader should note that these retiring instructions do not necessarily correspond to the instructions I0–I3 discussed previously. Rather, during any given clock cycle, a bundle of four instructions I0–I3 may be fetched, and at the same time a group of four instructions ALU[0], ALU[1], MEM[0] and MEM[1] may be retired.

Figure 36:
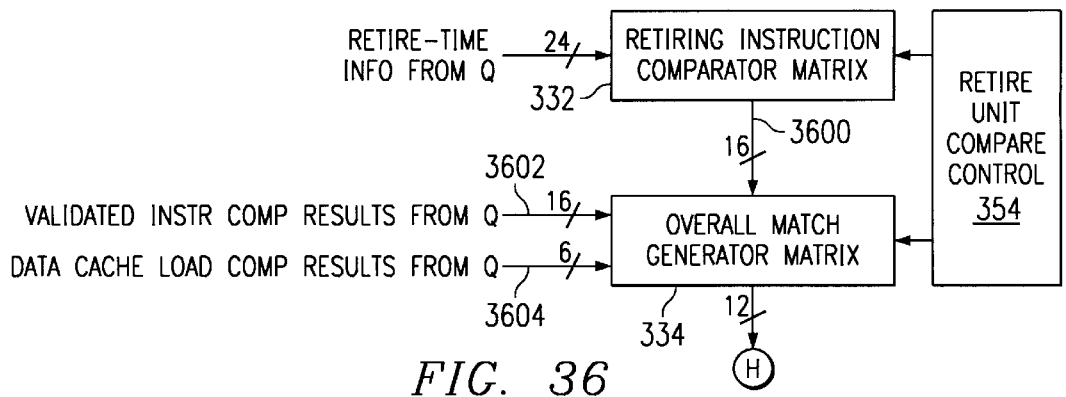
FIG. 36 is a block diagram illustrating the retire unit components shown in FIG. 3.

FIG. 36 illustrates components that reside within retire unit 120. As was discussed previously, retiring instruction comparator matrix 332 takes, as its inputs, 24 bits of "retire-time information" from instruction queue 114. Retiring instruction comparator matrix 332 provides sixteen output bits 3600 to overall match generation matrix 334. Overall match generation matrix 334 takes these sixteen bits as inputs, as well as 22 other bits from instruction queue 114. The latter 22 bits include validated instruction comparison results 3602 (which correspond to the 16 bits 322 from validation logic 320 that were previously placed in bit fields 326, 328), and data cache load comparison results 3604 (which correspond to the 6 bits deriving from data cache interface comparators 324 that were previously placed in bit field 330). Based on these inputs, overall match generation matrix 334 provides 12 output bits H to programmable state machine 302.

Figure 37:
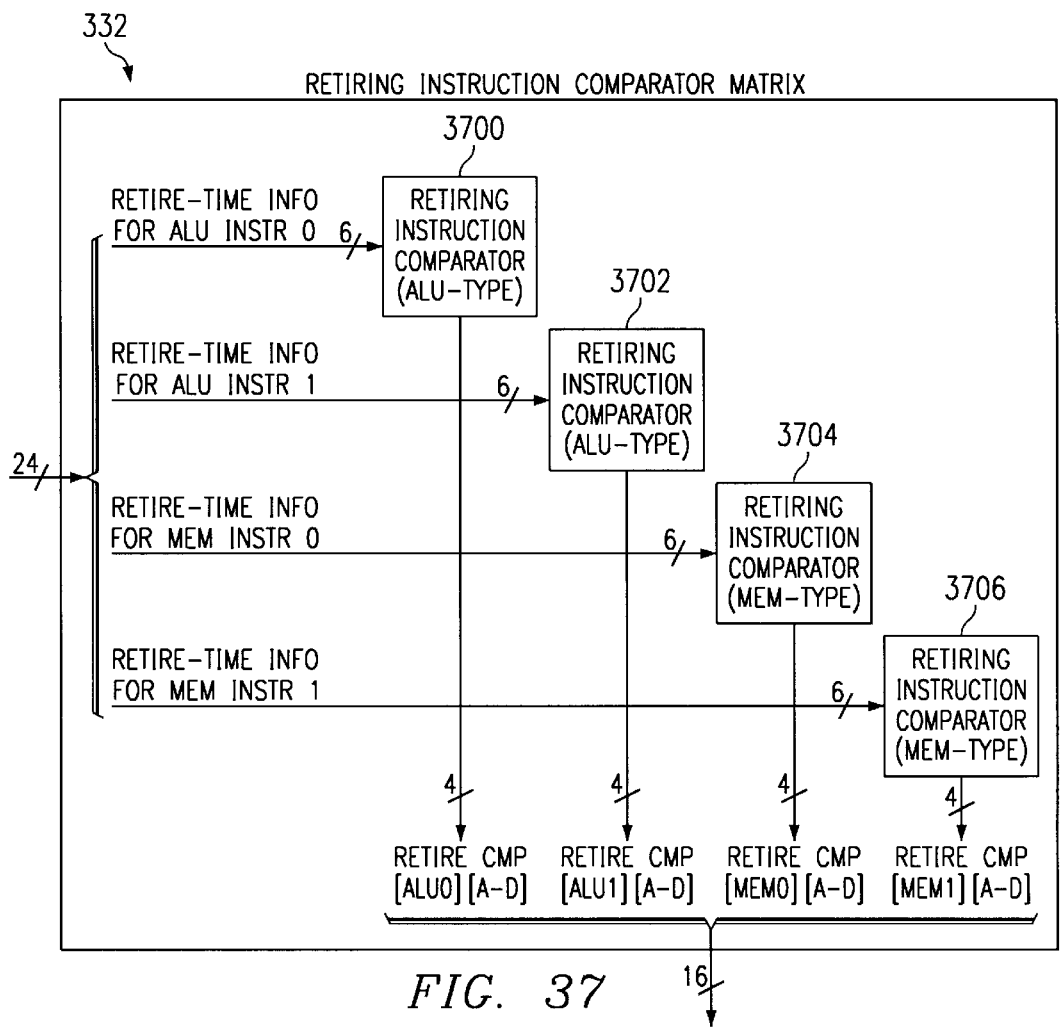
FIG. 37 is a block diagram illustrating the retiring instruction comparator matrix of FIG. 36.

FIG. 37 illustrates retiring instruction comparator matrix 332 in detail. Retiring instruction comparator matrix 332 contains four retiring instruction comparators 3700–3706, one for each of the four possible retiring instructions. Because a maximum of two ALU-type instructions and a maximum of two MEM-type instructions may retire at once, retiring instruction comparators 3700 and 3702 are dedicated to ALU-type retiring instructions, while retiring instruction comparators 3704 and 3706 are dedicated to MEM-type retiring instructions. Six bits of RETIRE-TIME INFO are supplied to each retiring instruction comparator. Each set of six bits corresponds to one of the retiring instructions, as shown. Within each of the four retiring instruction comparators are four retire match generators A–D. (This will be discussed in more detail below in relation to FIGS. 38 and 39.) Thus, each of the retiring instruction generators 3700–3706 produces four retire match bits. It follows that the total output for matrix 332 is sixteen total bits of match results presented as four different 4-bit sets-- one set for each of the possible retiring instructions. In the drawing, these sets are denoted RETIRE_CMP [ALU0] [A–D], RETIRE_CMP [ALU1] [A–D], RETIRE_CMP [MEM0] [A–D] and RETIRE_CMP [MEM1] [A–D].

Figure 38:
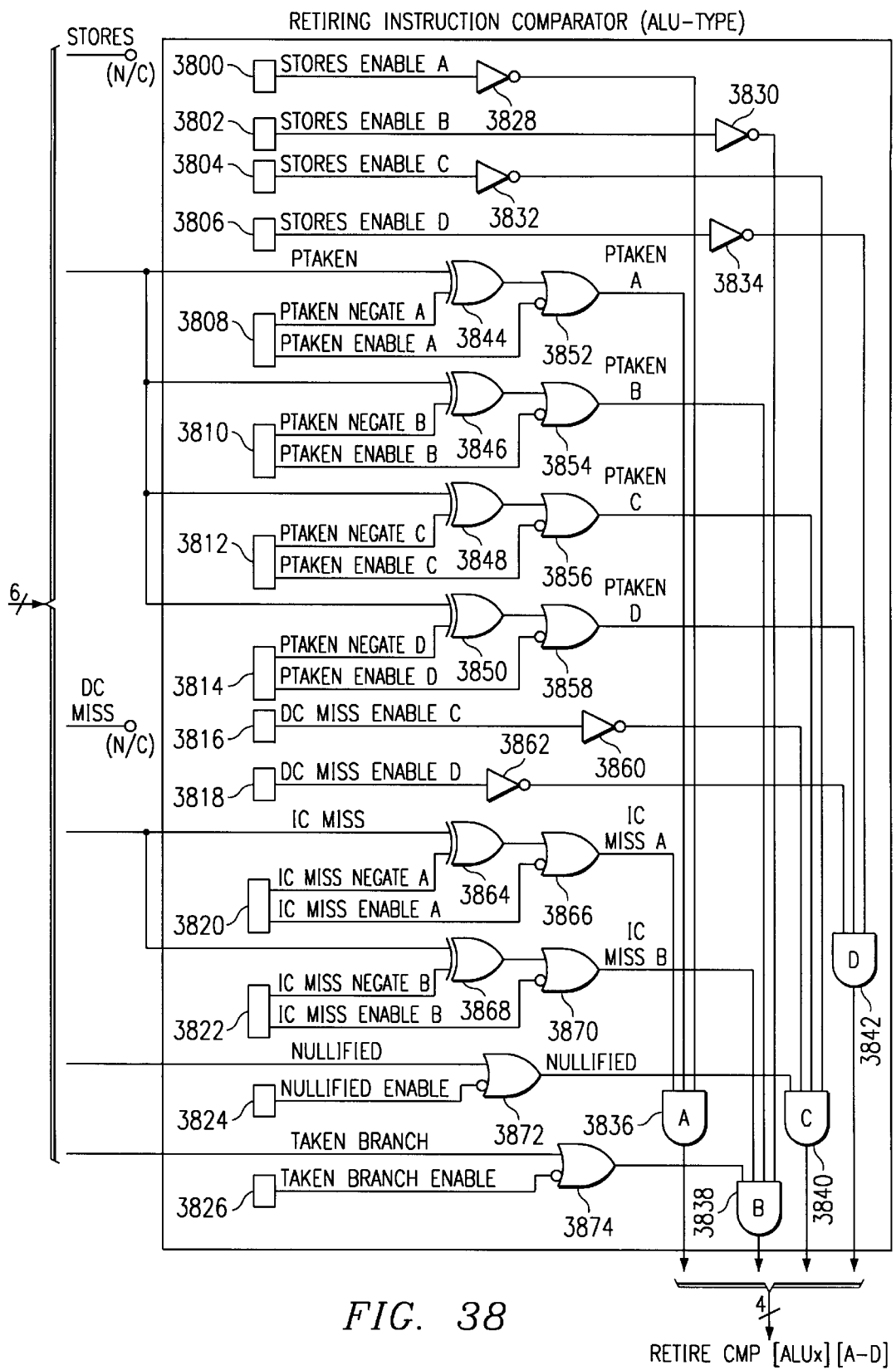
FIG. 38 is a block diagram illustrating a retiring instruction comparator representative of the ALU-type retiring instruction comparators of FIG. 37.

FIG. 38 illustrates in detail a representative one of ALU-type retiring instruction comparators 3700 and 3702. It is contemplated that storage elements 3800–3826 would be included within retire unit comparators control register circuitry 354. Thus, storage elements 3800–3826 would be loaded with data by writing to retire unit comparators control register circuitry 354 using the method and apparatus described above in section 2.2. The generation of the six "retire-time info" signals shown in FIG. 38 may be accomplished by any conventional means. Numerous alternative methods for doing so will be apparent to those having ordinary skill in the art based on the following signal descriptions:

STORES: This bit indicates whether the associated retiring instruction was a store-type memory instruction. (This information is pertinent only to MEM-type instructions.)

PTAKEN: For every conditional branch or jump-type instruction encountered, microprocessor 100 makes a prediction about whether the (upcoming) evaluation of the condition will cause the branch or jump to be taken. This bit indicates whether the associated instruction was a branch instruction whose branch was predicted to be taken.

DCMISS: This bit indicates whether the associated instruction caused a data cache miss. (This information is pertinent only to MEM-type instructions.)

ICMISS: This bit indicates whether the associated instruction caused an instruction cache miss.

NULLIFIED: The instruction set of microprocessor 100 includes the capability to "nullify" certain instructions in the instruction stream based on the outcome of other instructions or conditions within microprocessor 100. This bit indicates whether the associated instruction was nullified for any reason.

TAKENBRANCH: This bit indicates whether the associated instruction was a branch instruction whose branch was actually taken. (This information is pertinent only to ALU-type instructions.)

Bits 3800–3826 are provided for the programmer's flexibility. By setting them appropriately, the programmer may configure the retiring instruction comparator to produce a variety of different kinds of results at its outputs. Four STORES enable bits 3800–3806 are provided. Each is coupled to one of the inputs of one of AND gates 3836–3842 through inverters 3828–3834. (This is done so that the ALU-type retiring instruction comparator will not produce any match indications when the programmer is interested in store-type memory instructions.) Storage elements 3808–3814 contain PTAKEN negate and enable bits for each of AND gates 3836–3842, respectively. The negate function is achieved by exclusive OR gates 3844–3850. The enable function is achieved by OR gates 3852–3858 (each of which has an inverted input for the enable bit). Two DCMISS enable bits are provided. One is provided to an input of AND gate 3840 through inverter 3860. The other is provided to an input of AND gate 3842 through inverter 3862. Storage elements 3820–3822 contain ICMISS negate and enable bits for each of AND gates 3836–3838, respectively. The negate function is achieved by exclusive OR gates 3864–3868. The enable function is achieved by OR gates 3866–3870 (each of which has an inverted input for the enable bit). Storage element 3824 contains a NULLIFIED enable bit for AND gate 3840. The enable function is performed by exclusive OR gate 3872, which has an inverted input for the enable bit. Storage element 3826 contains a TAKEN_BRANCH enable bit for AND gate 3838. The enable function is performed by exclusive OR gate 3874, which has an inverted input for the enable bit.

Figure 39:
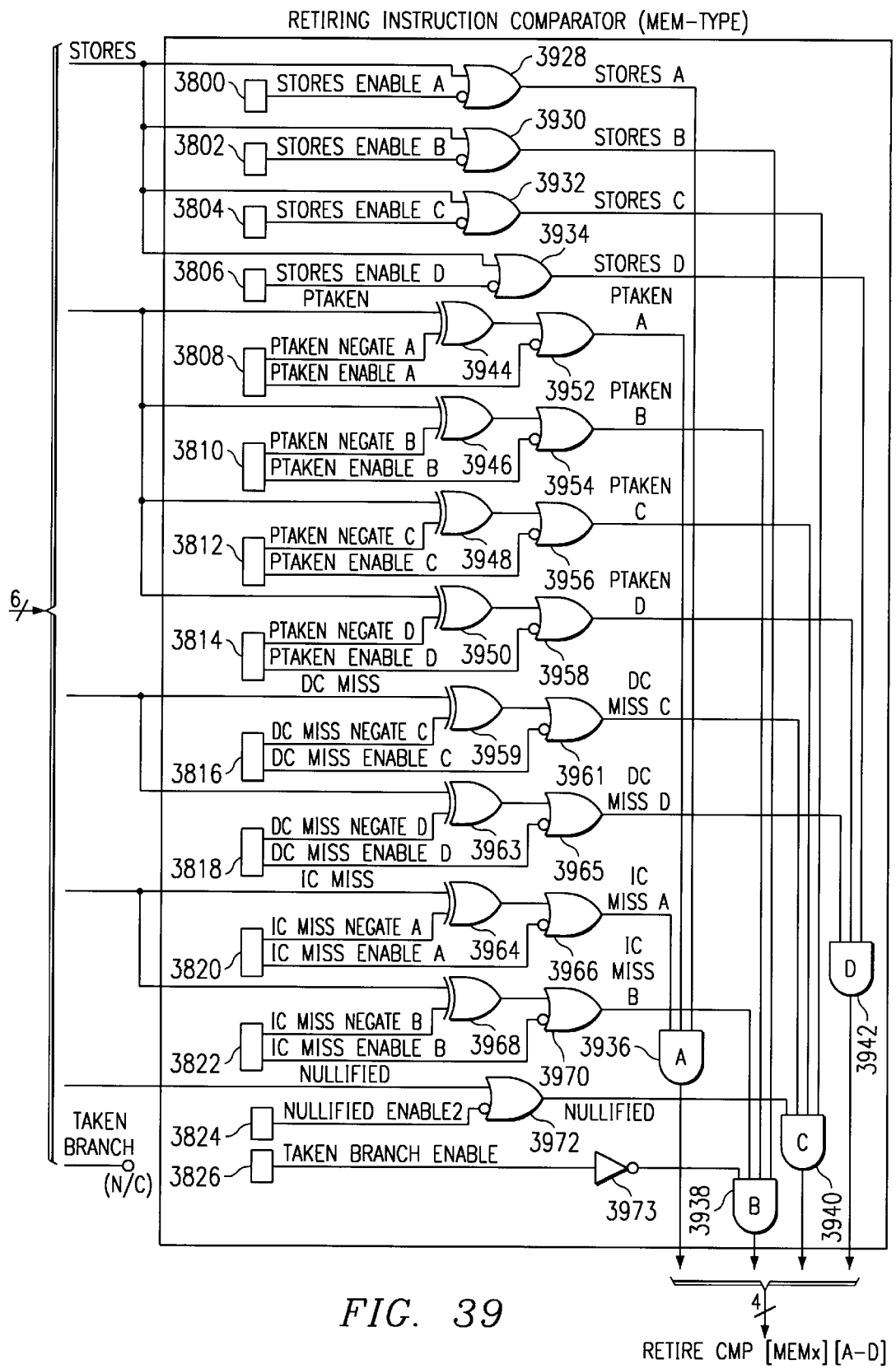
FIG. 39 is a block diagram illustrating a retiring instruction comparator representative of the MEM-type retiring instruction comparators of FIG. 37.

FIG. 39 illustrates in detail a representative one of MEM-type retiring instruction comparators 3704 and 3706. The same bits contained in storage elements 3800–3826 that were provided to comparators 3700–3702 are also provided to comparators 3704–3706, as shown. The STORES enable bits 3800–3806 are used for all four of AND gates 3936–3942. The enable function is provided by OR gates 3928–3934, all of which have an inverted input for the enable bit. The PTAKEN negate and enable bits 3808–3814 are used in exactly the same manner as they are used in the ALU-type comparator shown in FIG. 38, as are the ICMISS negate and enable bits 3820–3822 and the NULLIFIED enable bit 3824. The two sets of DCMISS negate and enable bits are used for AND gates 3940 and 3942. The negate function is provided by exclusive OR gates 3959 and 3963. The enable function is provided by OR gates 3961 and 3965, each of which has an inverted input for the enable bit. The TAKEN_BRANCH enable bit 3826 is provided to one input of AND gate 3938 through inverter 3973.

Figure 40:
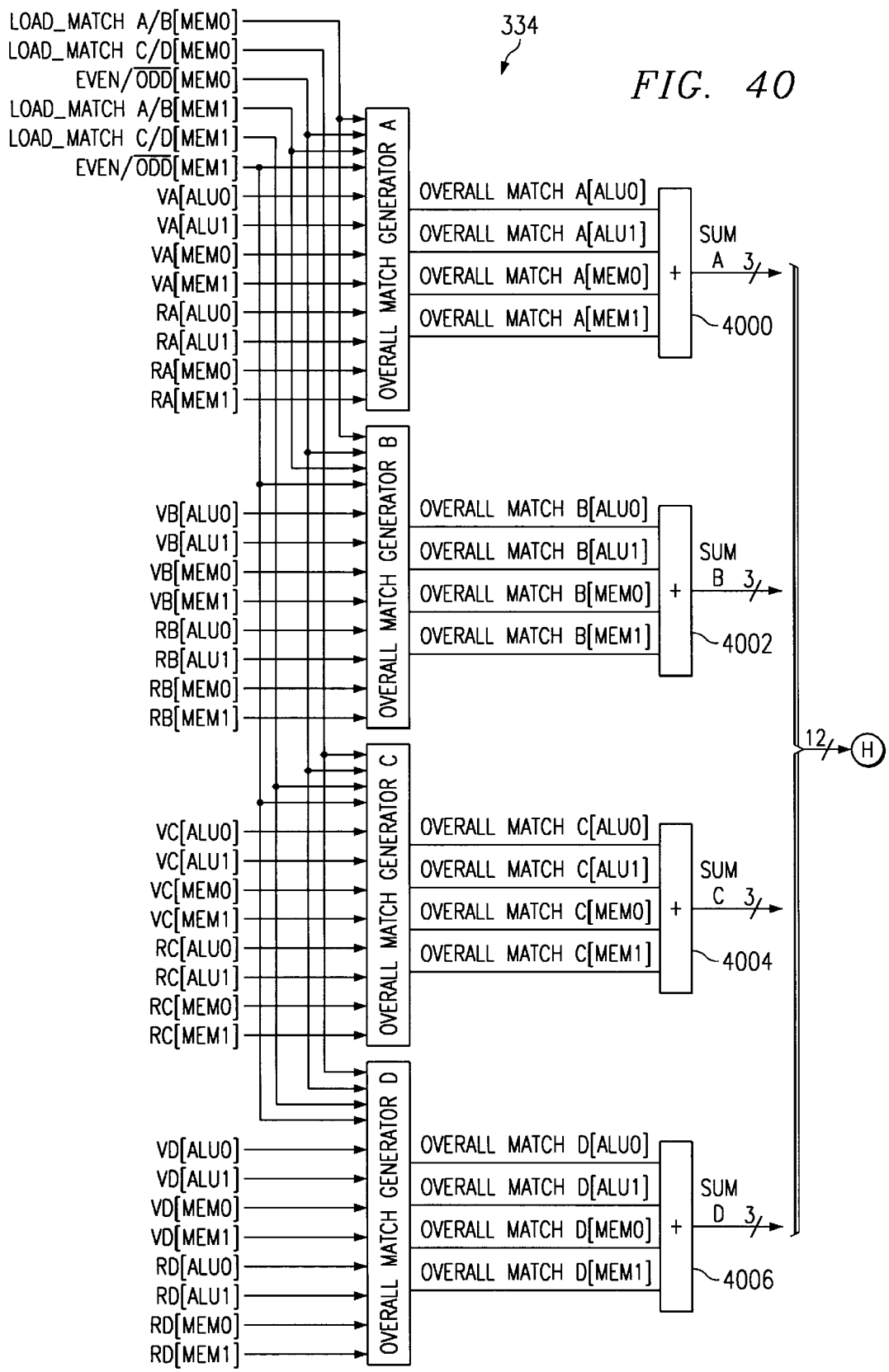
FIG. 40 is a block diagram illustrating the overall match generator matrix of FIG. 36.

FIG. 40 illustrates overall match generator matrix 334 in detail. Overall match generator matrix 334 includes overall match generators A–D. A total of thirty-eight input bits are provided to overall match generator matrix 334. For each of the four possible retiring instructions MEM[0], MEM[1], ALU[0] and ALU[1], there are the following inputs: 4 bits from retiring instruction matrix 332, labeled R[A–D]; and 4 bits from validated instruction comparison results 3602, labeled V[A–D]. In addition, the 6 bits from data cache load comparison results 3604 are distributed as follows: The LOAD_MATCH A/B result bits for instructions MEM[0] and MEM[1] go to overall match generators A and B. The LOAD_MATCH C/D result bits for instructions MEM[0] and MEM[1] go to overall match generators C and D. The EVEN/ODD bits for instructions MEM[0] and MEM[1] go to each of overall match generators A–D.

Based on these inputs, each of the overall match generators produces one overall match bit for each of instructions ALU[0], ALU[1], MEM[0] and MEM[1], as shown. These four sets of overall match results are provided to adders 4000–4006. The purpose of each adder is to determine how many of its four input bits were asserted. Thus, SUM A indicates how many retiring instructions produced a match at the end of comparator chain A. SUM B indicates how many retiring instructions produced a match at the end of comparator chain B, and so on. The twelve bits comprising SUMs A–D are provided to the input of programmable state machine 302 at H.

Figure 41:
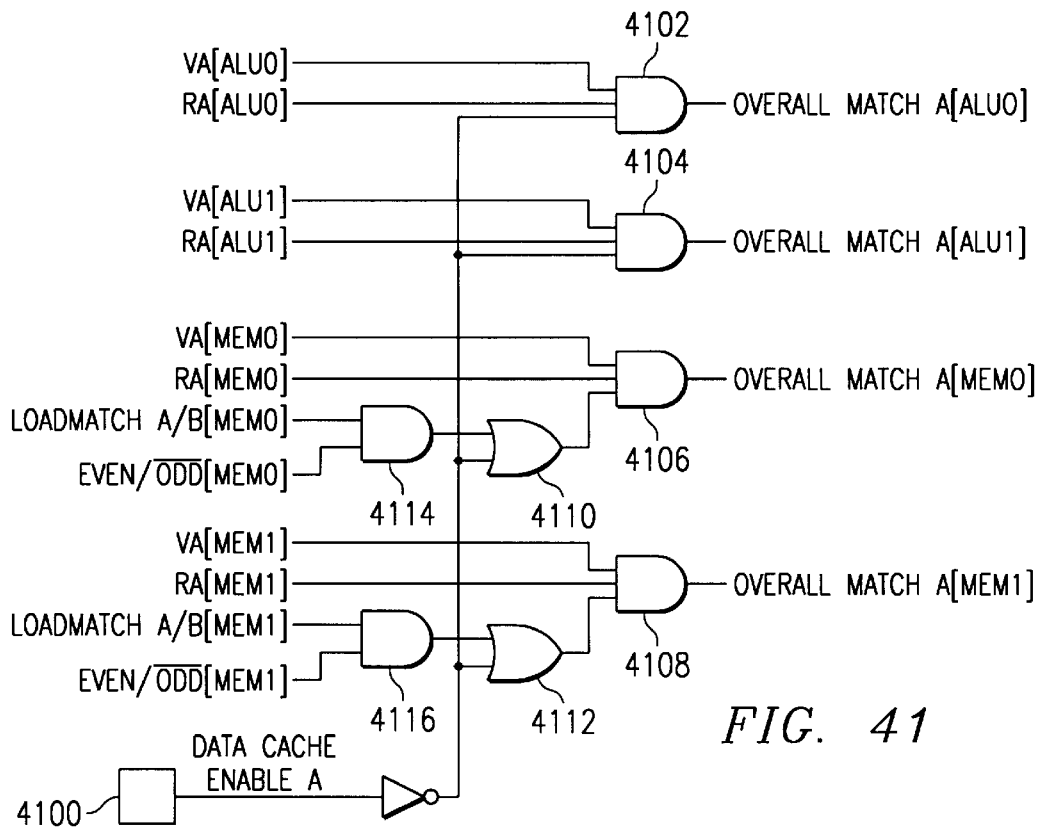
FIG. 41 is a block diagram illustrating overall match generator A shown in FIG. 40.

Each of overall match generators A–D is slightly different from the others. FIG. 41 illustrates overall match generator A in detail. It is contemplated that storage elements 4100 would be included within retire unit comparators control register circuitry 354. Thus, storage element 4100 would be loaded with data by writing to retire unit comparators control register circuitry 354 using the method and apparatus described above in section 2.2. Overall match generator A contains AND gates 4102–4108. The output of each one of these four AND gates provides the "A" overall match result for one of the four retiring instructions. Thus, these outputs are labeled OVERALL_MATCH_A [ALU0], OVERALL_MATCH_A [ALU 1], OVERALL_MATCH_A [MEM0] and OVERALL_MATCH_A [MEM1]. An inverted version of data cache enable A is provided to AND gates 4102 and 4104 directly, and to AND gates 4106 and 4108 through OR gates 4110 and 4112. This is done so that, when data cache enable A is asserted (meaning the programmer is interested in MEM-type instructions on comparator chain A), there will be no overall match results generated for ALU-type instructions on comparator chain A. Results for MEM-type instructions, on the other hand, will be enabled. The EVEN ODD bits for MEM[0] and MEM[1] are provided to AND gates 4114 and 4116 without inversion. Thus, overall match generator A is configured to derive its MEM[O] and MEM[1] match results from the LOAD_MATCH A/B comparison result of even memory load instructions only.

Figure 42:
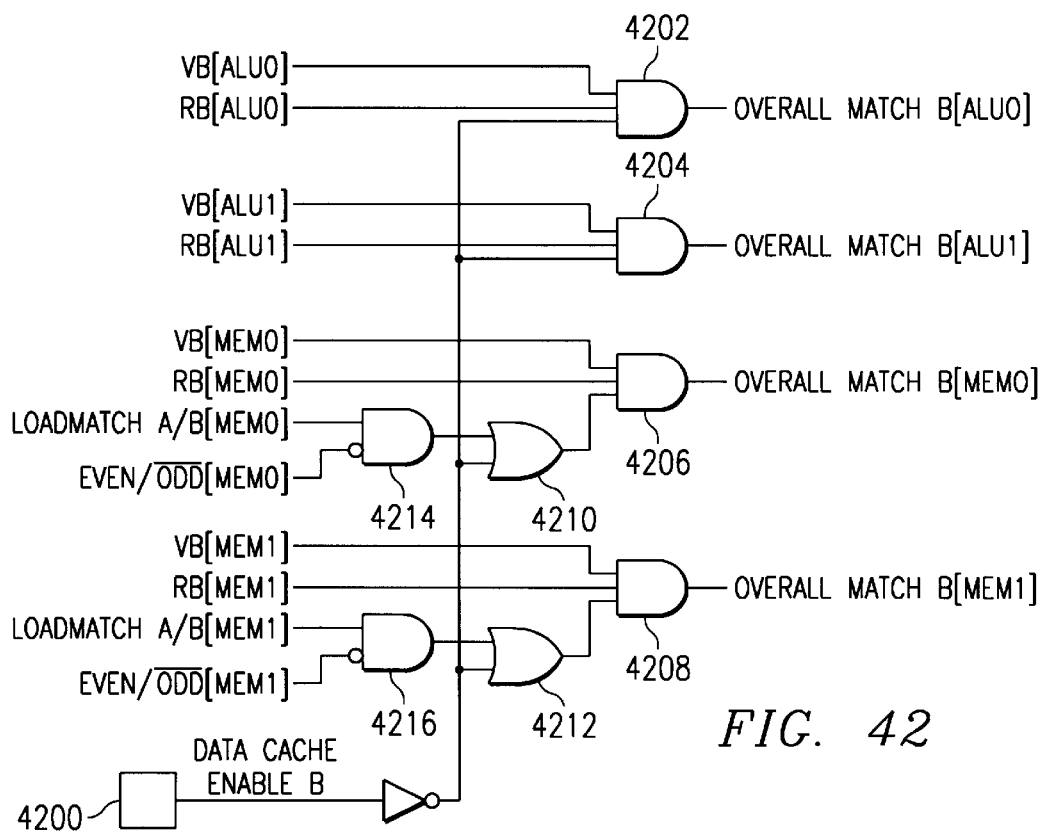
FIG. 42 is a block diagram illustrating the overall match generator B shown in FIG. 40.

FIG. 42 illustrates overall match generator B in detail. As can be seen, its structure is completely analogous to that of overall match generator A. The difference is that overall match generator B is configured to derive its MEM[0] and MEM[1] match results from the LOAD_MATCH A/B comparison result of odd memory load instructions only (by virtue of the inverted input on AND gates 4214 and 4216).

Figure 43:
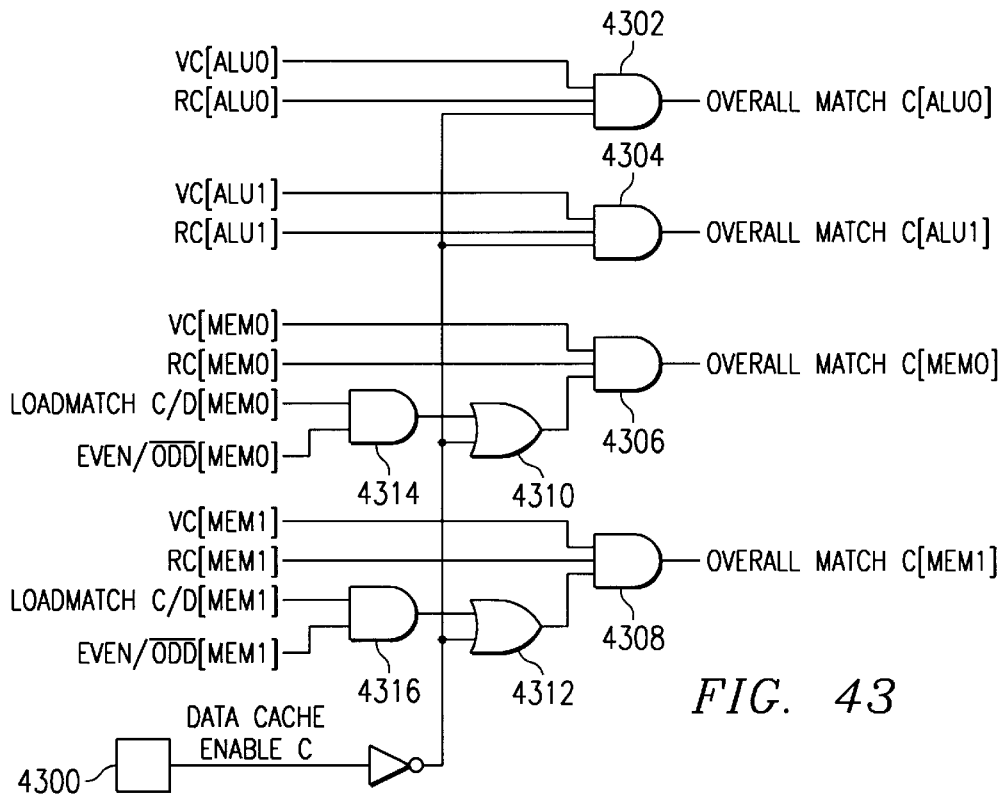
FIG. 43 is a block diagram illustrating the overall match generator C shown in FIG. 40.

FIG. 43 illustrates overall match generator C in detail. As can be seen, its structure is completely analogous to that of overall match generator A. The difference is that overall match generator C is configured to derive its MEM[0] and MEM[1] match results from the LOAD_MATCH C/D comparison result of even memory load instructions only (as opposed to deriving them from the LOAD_MATCH A/B result for even memory load instructions).

Figure 44:
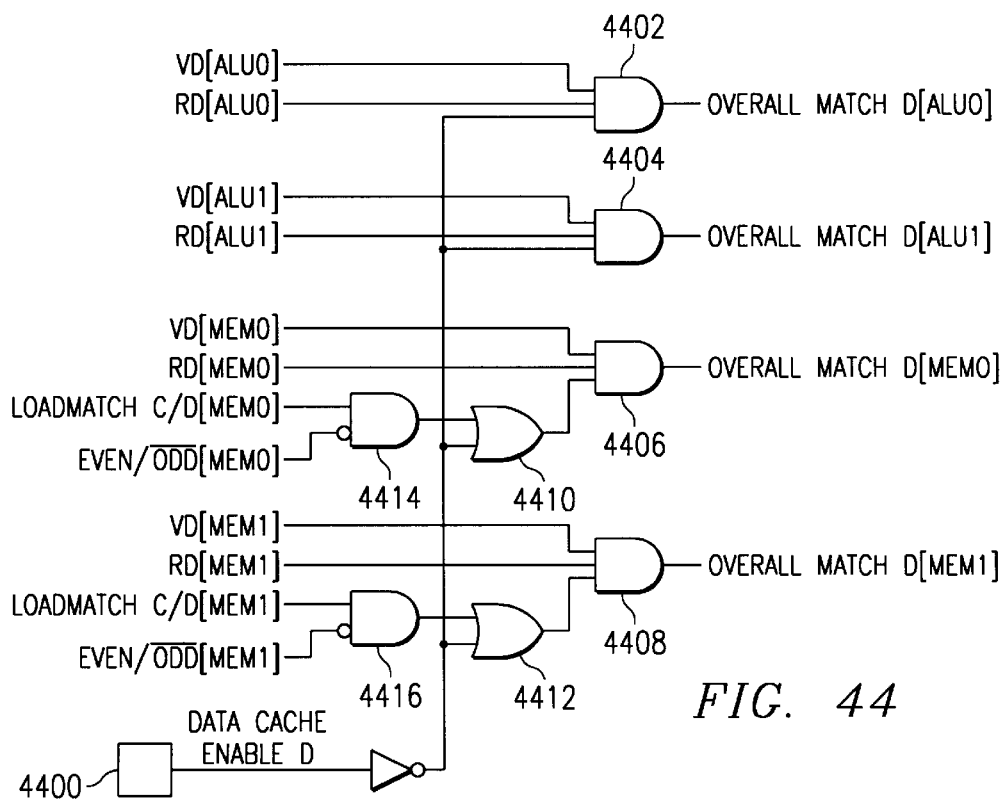
FIG. 44 is a block diagram illustrating the overall match generator D shown in FIG. 40.

FIG. 44 illustrates overall match generator D in detail. As can be seen, its structure is completely analogous to that of overall match generator C. The difference is that overall match generator C is configured to derive its MEM[0] and MEM[1] match results from the LOAD_MATCH C/D comparison result of odd memory load instructions only (as opposed to even ones), by virtue of the inverted inputs on AND gates 4414 and 4416.

2.9 Off-chip data interface

Figure 45:
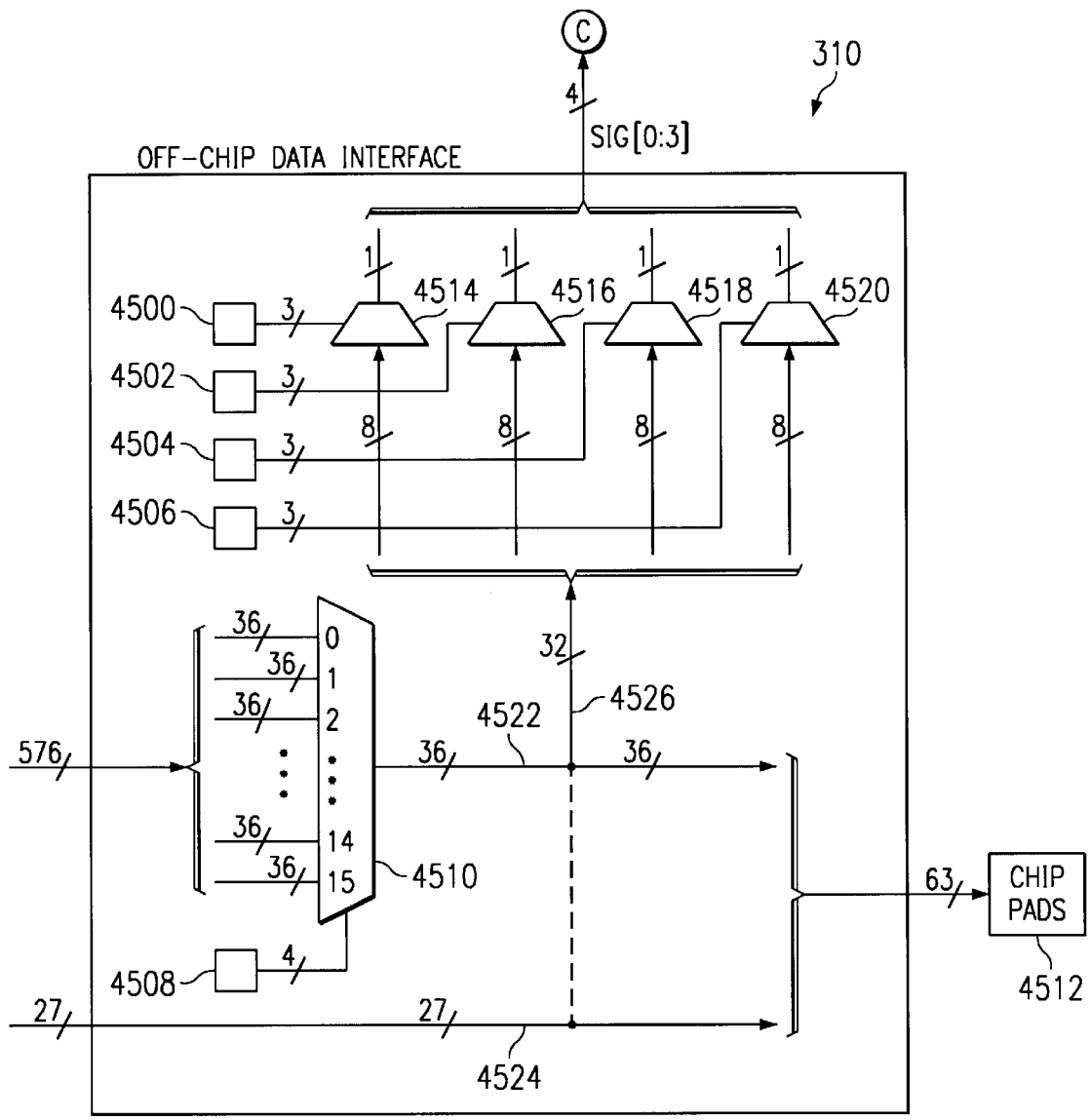
FIG. 45 is a block diagram illustrating the off-chip data interface shown in FIG. 3.

FIG. 45 illustrates the contents of off-chip data interface 3 10 in detail. It is contemplated that storage elements 4500–4508 would be included within off-chip data interface control register circuitry 350. Thus, storage elements 4500–4508 would be loaded with data by writing to off-chip data interface control register circuitry 350 using the method and apparatus described above in section 2.2. Five hundred and seventy-six test nodes from various points within microprocessor 100 are routed to the inputs of multiplexer 4510 in groups of 36. The programmer uses the value in storage element(s) 4508 to select which set of 36 test nodes will be coupled to chip pads 4512. In addition to the 36 signals so selected, 27 additional signals (preselected and fixed) are always routed to chip pads 4512, as shown, so as to be visible off-chip under all circumstances. Of the 36 selected signals 4522 and the 27 fixed signals 4524, 32 of them (4526) are routed to multiplexers 4514–4520 in four groups of eight, as shown. The programmer uses the values in storage elements 4500–4506 to select one bit from each of these four groups to be routed back to programmable state machine 302 at C.

Figure 46:
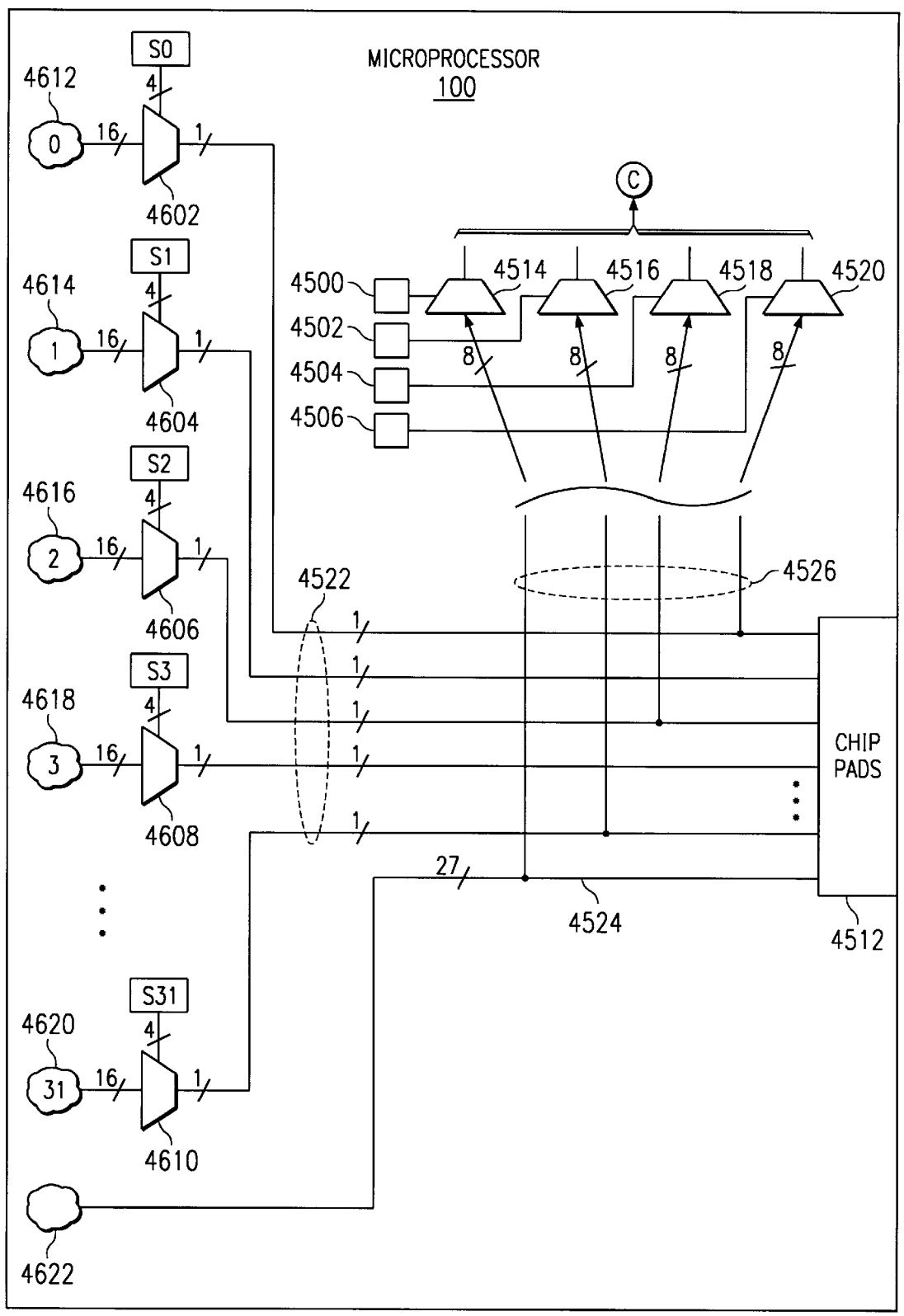
FIG. 46 is a block diagram illustrating a second preferred implementation of the functionality shown in FIG. 45.

FIG. 46 illustrates a second preferred implementation of the ftnctionality just described. In the implementation of FIG. 46, multiplexer 4510 is replaced by 32 different 16:1 multiplexers, indicated generally in the drawing by multiplexers 4602–4610. The various 16:1 multiplexers are physically located at various remote locations around microprocessor 100. Each has its inputs coupled to a set of test nodes, indicated generally in the drawing at 4612–4620. Each has its select inputs coupled to storage elements, indicated generally in the drawing at S0–S3 1. The outputs of the 16:1 multiplexers comprise bus 4522. Bus 4524 is coupled to 27 fixed nodes 4622. Preferably, fixed nodes 4622 are chosen as those nodes that a programmer would most likely want to see at chip pads 4512 under all circumstances. For example, fixed nodes 4622 may correspond to the minimum set of signals from which the state of microprocessor 100 can be reconstructed by external equipment. It is further contemplated that storage elements S0–S31 would either be included within off-chip data interface control register circuitry 350, or would constitue a new set of control registers that may be coupled into the serial loop of control registers 344–354. In yet another variation, the same four bits 4508 may be used as select inputs for each of the 16:1 multiplexers throughout the chip. One advantage of the implementation of FIG. 46 is that, by multiplexing closer to the test nodes, fewer interconnect traces need to be run across the chip to multiplexers 4514–4520 and to chip pads 4512.

In yet another preferred embodiment, any combination of storage elements 4500–4508 and S0–S31 may be implemented as latches whose inputs are coupled to state machine output bus 1118. In this manner, the selection of which signals are routed to chip pads 4512 and to state machine inputs C may be changed automatically and "on the fly" by state machine 302 in response to user-defined events having occurred.

While the present invention has been described in detail in relation to a preferred embodiment thereof, particularly in relation to FIGS. 26–30, the described embodiment has been presented by way of example and not by way of limitation. It will be understood by those skilled in the art that various changes may be made in the form and details of the described embodiment, resulting in equivalent embodiments that will remain within the scope of the appended claims.

What is claimed is:

1. A method for efficiently and flexibly comparing a group of multi-bit binary fields with a multi-bit expected pattern to generate a set of final match results, one final match result for each binary field in said group, the method comprising the steps of:

generating sets of bit-wise comparator results, one set for each binary field, by bit-wise comparing each binary field with said expected pattern;

generating sets of bit-wise mask results, one set for each binary field, by bit-wise masking each set of bit-wise comparator results with a mask pattern;

generating a set of preliminary match results, one preliminary match result for each binary field, each of said preliminary match results being equal to the logical AND of the bit-wise mask result set for the corresponding binary field;

generating a set of secondary match results, one secondary match result for each binary field, by negating all of said preliminary match results if a negate indicator is asserted; and generating said set of final match results, one final match result for each binary field, by individually gating all of said secondary match results with a separate enable indicator for each binary field.

2. A M×N comparator matrix, comprising:

a set of N comparators, each having M data inputs, one expected pattern input, one mask pattern input and M comparison outputs, each of said M comparison outputs for indicating the result of comparing information applied to said expected pattern input with information applied to one of said M data inputs;

a set of N storage elements, each of said storage elements operable to store an expected pattern, each of said storage elements having an expected pattern output, and each of said expected pattern outputs coupled to a different one of said expected pattern inputs;

a second set of N storage elements each operable to store a mask pattern having the same number of bits as said expected pattern, each of said storage elements having a mask pattern output, and each of said expected pattern outputs coupled to a different one of said mask pattern inputs; and a data bus coupled to said M data inputs on each of said N comparators in a manner allowing M sets of data to be applied to each of said N comparators simultaneously.

3. A M×N comparator matrix, comprising:

a set of N comparators, each having M data inputs, one expected pattern input and M comparison outputs, each of said M comparison outputs for indicating the result of comparing information applied to said expected pattern input with information applied to one of said M data inputs;

a set of N storage elements, each of said storage elements operable to store an expected pattern, each of said storage elements having an expected pattern output, and each of said expected pattern outputs coupled to a different one of said expected paattern inputs; and a data bus coupled to said M data inputs on each of said N comparators in a manner allowing M sets of data to be applied to each of said N comparators simultaneously;

wherein each of said storage elements is also operable to store a mask pattern having the same number of bits as said expected pattern, and each of said storage elements having a mask pattern output;

wherein each of said comparators has a mask pattern input; and wherein each of said mask pattern outputs is coupled to a different one of said mask pattern inputs.

4. The M×N comparator matrix of claim 3:

wherein each of said storage elements is also operable to store a negate bit, and each of said storage elements has a negate bit output;

wherein each of said comparators has a negate bit input; and wherein each of said negate bit outputs is coupled to a different one of said negate bit inputs.

5. The M×N comparator matrix of claim 4:

wherein each of said storage elements is also operable to store a set of M enable bits, and each of said storage elements has a set of M enable bit outputs;

wherein each of said comparators has a set of M enable bit inputs; and wherein each said set of M enable bit outputs is coupled to a different said set of M enable bit inputs.

6. Circuitry for comparing N binary fields with an expected pattern to generate N comparison results, comprising:

N bit-wise comparators, each of said bit-wise comparators having a comparison data input, an expected pattern input and a bit-wise comparison result output; each of said bit-wise comparators having its expected pattern input coupled to a source of said expected pattern, and having its comparison data input coupled to a source of a different one of said N binary fields;

N bit-wise mask units, each having a bit-wise comparison result input, a mask pattern input and a bit-wise mask result output; each of said bit-wise mask units having its mask pattern input coupled to a source of a mask pattern, and having its bit-wise comparison result input coupled to a different one of said bit-wise comparison result outputs;

N first AND gates, each of said first AND gates having a set of first AND gate inputs and having a first AND gate output; each of said sets of first AND gate inputs coupled to a different one of said bit-wise mask result outputs;

N exclusive OR gates, each having one input coupled to a different one of said first AND gate outputs, having its other input coupled to a negate indicator, and each having an exclusive OR output; and N second AND gates, each having one input coupled to a different one of said exclusive OR outputs and another input coupled to a different enable indicator, the outputs of said second AND gates comprising said N comparison results.

7. The M×N comparator matrix of claim 2, wherein each of said comparators has a set of M enable bit inputs, further comprising:

a third set of N storage elements each operable to store a set of M enable bits, each of said storage elements having a set of M enable bit outputs, each said set of M enable bit outputs being coupled to a different said set of M enable bit inputs.

8. The M×N comparator matrix of claim 2, wherein each of said comparators has a negate bit input, further comprising:

a fourth set of N storage elements each operable to store a negate bit, each of said storage elements having a negate bit output, each of said negate bit outputs being coupled to a different one of said negate bit inputs.

\* \* \* \* \*

UNITED STATES PATENT AND TRADEMARK OFFICE
CERTIFICATE OF CORRECTION

PATENT NO. : 5,887,003
DATED : March 23, 1999
INVENTOR(S) : Gregory L. Ranson et al.

It is certified that error appears in the above-identified patent and that said Letters Patent is hereby corrected as shown below:

Column 14,
Line 19, delete "RJW" and insert therefor -- R/W --

Column 30,
Line 35, delete "Circuitty" and insert therefor -- Circuitry --

Signed and Sealed this

Eleventh Day of June, 2002

Attest:

Attesting Officer

JAMES E. ROGAN
Director of the United States Patent and Trademark Office